US012803530B2

(12) United States Patent
Daimon et al.

(10) Patent No.: US 12,803,530 B2
(45) Date of Patent: Nov. 17, 2026

(54) ACOUSTIC WAVE DEVICE

(71) Applicant: Murata Manufacturing Co., Ltd., Nagaokakyo (JP)

(72) Inventors: Katsuya Daimon, Nagaokakyo (JP); Sho Nagatomo, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 34 days.

(21) Appl. No.: 19/169,140

(22) Filed: Apr. 3, 2025

(65) Prior Publication Data

US 2025/0260388 A1 Aug. 14, 2025

Related U.S. Application Data

(63) Continuation of application No. PCT/JP2023/037479, filed on Oct. 17, 2023.

(Continued)

(51) Int. Cl.

*H03H 9/56* (2006.01)
*H03H 9/02* (2006.01)

(Continued)

(52) U.S. Cl.

CPC ........ *H03H 9/566* (2013.01); *H03H 9/02031* (2013.01); *H03H 9/02157* (2013.01);

(Continued)

(58) Field of Classification Search

CPC .. H03H 9/02; H03H 9/13; H03H 9/17; H03H 9/205; H03H 9/25; H03H 9/56; H03H 9/64

See application file for complete search history.

(56) References Cited

U.S. PATENT DOCUMENTS 3,866,154 A * 2/1975 Moore ............... H03H 9/14508 310/313 R
4,516,093 A * 5/1985 Nyffeler ............. H03H 9/14597 333/194

(Continued)

FOREIGN PATENT DOCUMENTS

JP H11186867 A 7/1999
JP 2017118587 A 6/2017

(Continued)

OTHER PUBLICATIONS

International Search Report in PCT/JP2023/037479, mailed Dec. 26, 2023, 2 pages.

(Continued)

*Primary Examiner* — Andrea Lindgren Baltzell
*Assistant Examiner* — Alan Wang
(74) *Attorney, Agent, or Firm* — Keating & Bennett, LLP

(57) ABSTRACT

An acoustic wave device includes first and second acoustic wave resonators. Each of the first and second acoustic wave resonators includes a piezoelectric film including a piezoelectric layer, first and second comb-shaped electrodes, and a third electrode. The first comb-shaped electrode includes a first busbar and first electrode fingers. The second comb-shaped electrode includes a second busbar and second electrode fingers. The third electrode includes third electrode fingers and a connection electrode. The third electrode fingers are arranged side by side with the first and second electrode fingers. The connection electrode connects adjacent third electrode fingers. An arrangement order of the first, second, and third electrode fingers is the first electrode finger, the third electrode finger, the second electrode finger, and the third electrode finger repeated as one period. Each of the first and second acoustic wave resonators is a divided (Continued)

resonator including an acoustic wave resonator divided in series.

19 Claims, 20 Drawing Sheets

Related U.S. Application Data

(60) Provisional application No. 63/416,635, filed on Oct. 17, 2022.

(51) Int. Cl.
*H03H 9/13* (2006.01)
*H03H 9/17* (2006.01)

(52) U.S. Cl.
CPC ........ *H03H 9/02228* (2013.01); *H03H 9/132* (2013.01); *H03H 9/173* (2013.01); *H03H 9/175* (2013.01); *H03H 9/176* (2013.01); *H03H 9/562* (2013.01); *H03H 9/564* (2013.01)

(56) References Cited

U.S. PATENT DOCUMENTS

| | | | | |
|---|---|---|---|---|
| 9,806,692 | B2 * | 10/2017 | Kishino | H03H 9/02614 |
| 10,491,192 | B1 | 11/2019 | Plesski et al. | |
| 11,110,493 | B2 * | 9/2021 | Tombs | H02S 40/10 |
| 2016/0049920 | A1 | 2/2016 | Kishino | |
| 2019/0190491 | A1 | 6/2019 | Nosaka | |
| 2023/0370047 | A1 | 11/2023 | Ishii | |

FOREIGN PATENT DOCUMENTS

| | | | |
|---|---|---|---|
| WO | 2016027707 | A1 | 2/2016 |
| WO | 2016129662 | A1 | 8/2016 |
| WO | 2018043608 | A1 | 3/2018 |
| WO | 2022163865 | A1 | 8/2022 |

OTHER PUBLICATIONS

Written Opinion in PCT/JP2023/037479, mailed Dec. 26, 2023, 4 pages.

* cited by examiner

ACOUSTIC WAVE DEVICE

CROSS REFERENCE TO RELATED APPLICATIONS

This application claims the benefit of priority to Provisional Application No. 63/416,635 filed on Oct. 17, 2022 and is a Continuation Application of PCT Application No. PCT/JP2023/037479 filed on Oct. 17, 2023. The entire contents of each application are hereby incorporated herein by reference.

BACKGROUND OF THE INVENTION

1. Field of the Invention

The present invention relates to acoustic wave devices each including multiple acoustic wave resonators.

2. Description of the Related Art

Hitherto, an acoustic wave device is widely used in a filter of a mobile phone, for example. Lately, an acoustic wave device utilizing a bulk wave of a thickness shear mode, such as that disclosed in U.S. Pat. No. 10,491,192, has been proposed. In this acoustic wave device, a piezoelectric layer is provided on a support. On the piezoelectric layer, a pair of electrodes are provided. These electrodes face each other on the piezoelectric layer and are connected to different potentials. With the application of an AC voltage to between these electrodes, a bulk wave of the thickness shear mode is excited.

The acoustic wave device is an acoustic wave resonator, for example. The acoustic wave resonator is used for a ladder filter, for example. To obtain good properties of the ladder filter, a high electrostatic capacitance ratio between multiple acoustic wave resonators is required. In this case, it is necessary to raise the electrostatic capacitance of some of the acoustic wave resonators of the ladder filter.

To raise the electrostatic capacitance of an acoustic wave resonator, it is necessary to increase the size of the acoustic wave resonator, for example. Using such an acoustic wave resonator for a ladder filter may also enlarge the ladder filter. In particular, the size of a ladder filter including an acoustic wave resonator utilizing a bulk wave of the thickness shear mode having a low electrostatic capacitance is increased.

The inventors of example embodiments of the present invention have discovered that, when an acoustic wave resonator having the following configuration is used for a filter apparatus, a suitable filter waveform can be obtained without increasing the size of the filter apparatus. The configuration of the acoustic wave resonator is that an electrode connected to a potential different from an input potential and an output potential, such as to a reference potential, is disposed between an electrode connected to the input potential and an electrode connected to the output potential.

The inventors of example embodiments of the present invention have also discovered that simply using the above-described configuration may fail to sufficiently improve the electric power handling capability.

SUMMARY OF THE INVENTION

Example embodiments of the present invention provide acoustic wave devices that are each able to reduce the size of a filter apparatus and also to improve the electric power handling capability.

An acoustic wave device according to an example embodiment of the present invention includes a first acoustic wave resonator and a second acoustic wave resonator. Each of the first and second acoustic wave resonators includes a piezoelectric film, first and second comb-shaped electrodes, and a third electrode. The piezoelectric film includes a piezoelectric layer made of lithium niobate. The first comb-shaped electrode is provided on the piezoelectric layer, includes a first busbar and multiple first electrode fingers, and is connected to an input potential. One end of each of the first electrode fingers is connected to the first busbar. The second comb-shaped electrode is provided on the piezoelectric layer, includes a second busbar and multiple second electrode fingers, and is connected to an output potential. One end of each of the second electrode fingers is connected to the second busbar. The first electrode fingers and the second electrode fingers are interdigitated with each other. The third electrode includes multiple third electrode fingers and a connection electrode and is connected to a reference potential. In a plan view, the third electrode fingers are provided on the piezoelectric layer so as to be arranged side by side with the first electrode fingers and the second electrode fingers in a direction in which the first electrode fingers and the second electrode fingers are arranged. The connection electrode connects adjacent third electrode fingers of the multiple third electrode fingers. In each of the first and second acoustic wave resonators, an arrangement order of the first electrode fingers, the second electrode fingers, and the third electrode fingers in a plan view is, if the arrangement order is started by the first electrode finger, an order in which a set of the first electrode finger, the third electrode finger, the second electrode finger, and the third electrode finger is repeated as one period. Each of the first and second acoustic wave resonators is a divided resonator that is an acoustic wave resonator divided in series.

An acoustic wave device according to another example embodiment of the present invention includes a first acoustic wave resonator and a second acoustic wave resonator. Each of the first and second acoustic wave resonators includes a piezoelectric film, first and second comb-shaped electrodes, and a third electrode. The piezoelectric film includes a piezoelectric layer made of lithium niobate. The first comb-shaped electrode is provided on the piezoelectric layer, includes a first busbar and multiple first electrode fingers, and is connected to an input potential. One end of each of the first electrode fingers is connected to the first busbar. The second comb-shaped electrode is provided on the piezoelectric layer, includes a second busbar and multiple second electrode fingers, and is connected to an output potential. One end of each of the second electrode fingers is connected to the second busbar. The first electrode fingers and the second electrode fingers are interdigitated with each other. The third electrode includes multiple third electrode fingers and a connection electrode and is connected to a reference potential. In a plan view, the third electrode fingers are provided on the piezoelectric layer so as to be arranged side by side with the first electrode fingers and the second electrode fingers in a direction in which the first electrode fingers and the second electrode fingers are arranged. The connection electrode connects adjacent third electrode fingers of the multiple third electrode fingers. In each of the first and second acoustic wave resonators, an arrangement order of the first electrode fingers, the second electrode fingers, and the third electrode fingers in a plan view is, if the arrangement order is started by the first electrode finger, an order in which a set of the first electrode finger, the third electrode finger, the second electrode finger, and the third electrode finger is repeated as one period. Each of the first and second acoustic wave resonators is a divided resonator that is an acoustic wave resonator divided in parallel.

According to example embodiments of the present invention, it is possible to provide acoustic wave devices that are each able to reduce the size of a filter apparatus and also to improve the electric power handling capability.

The above and other elements, features, steps, characteristics and advantages of the present invention will become more apparent from the following detailed description of the example embodiments with reference to the attached drawings.

DETAILED DESCRIPTION OF THE EXAMPLE EMBODIMENTS

The present invention will be described below with reference to the drawings through illustration of specific example embodiments of the present invention.

The example embodiments described in the specification are only examples. The configurations illustrated in different example embodiments may partially be replaced by or combined with each other.

Figure 1:
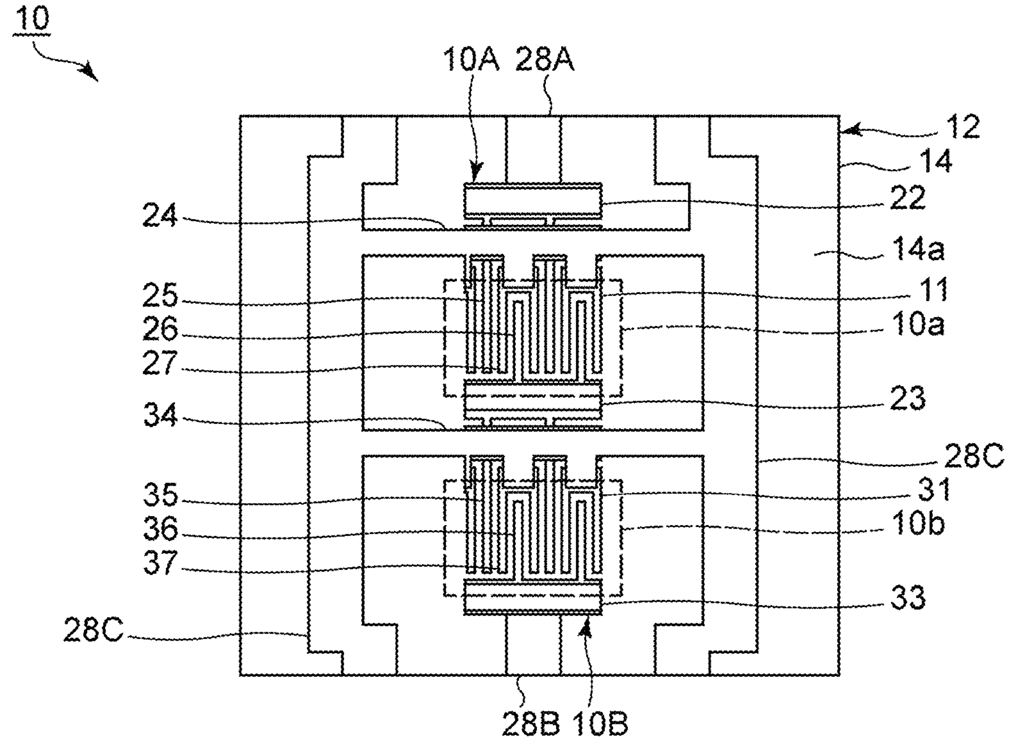
FIG. 1 is a schematic plan view of an acoustic wave device according to a first example embodiment of the present invention.

FIG. 1 is a schematic plan view of an acoustic wave device according to a first example embodiment of the present invention.

An acoustic wave device 10 is used as a portion of a filter apparatus. The acoustic wave device 10 includes multiple acoustic wave resonators. The acoustic wave device according to an example embodiment of the present invention may alternatively be a filter apparatus. The configuration of the acoustic wave device 10 will be explained below.

The acoustic wave device 10 includes a first acoustic wave resonator 10A and a second acoustic wave resonator 10B. Each of the first and second acoustic wave resonators 10A and 10B is an acoustic coupling filter. The first acoustic wave resonator 10A includes a functional electrode 11. The second acoustic wave resonator 10B includes a functional electrode 31.

The first acoustic wave resonator 10A and the second acoustic wave resonator 10B are electrically connected to each other. More specifically, in the acoustic wave device 10, the first acoustic wave resonator 10A and the second acoustic wave resonator 10B are connected in series with each other.

A distinctive feature of the present example embodiment is that each of the first and second acoustic wave resonators 10A and 10B is a divided resonator obtained by dividing one acoustic wave resonator in series. In the present specification, "two acoustic wave resonators are divided resonators" means that the difference in the resonant frequency between the two acoustic wave resonators connected in series or in parallel with each other is, for example, about 1% or smaller than the resonant frequency of each of the two acoustic wave resonators. With the above-described configuration of the acoustic wave device 10, using the acoustic wave device 10 for a filter apparatus makes it possible to reduce the size of the filter apparatus and also to improve the electric power handling capability. This will be discussed in detail below, together with a detailed explanation of the first example embodiment.

As illustrated in FIG. 1, the acoustic wave device 10 includes a piezoelectric substrate 12. The piezoelectric substrate 12 is a substrate having piezoelectricity. The piezoelectric substrate 12 includes a piezoelectric layer 14, which defines and functions as a piezoelectric film. The piezoelectric layer 14 is a layer defined by a piezoelectric body. In the present specification, however, the piezoelectric film is a film having piezoelectricity, but not necessarily a film defined by a piezoelectric body. In the first example embodiment, however, the piezoelectric film is the single piezoelectric layer 14 and is constituted by a piezoelectric body. The piezoelectric film may be a multilayer film including the piezoelectric layer 14.

In the first example embodiment, the piezoelectric substrate 12 is a multilayer body including the piezoelectric layer 14. The first and second acoustic wave resonators 10A and 10B share the same piezoelectric substrate 12. The first and second acoustic wave resonators 10A and 10B also share the piezoelectric layer 14, which defines and functions as a piezoelectric film.

Figure 2:
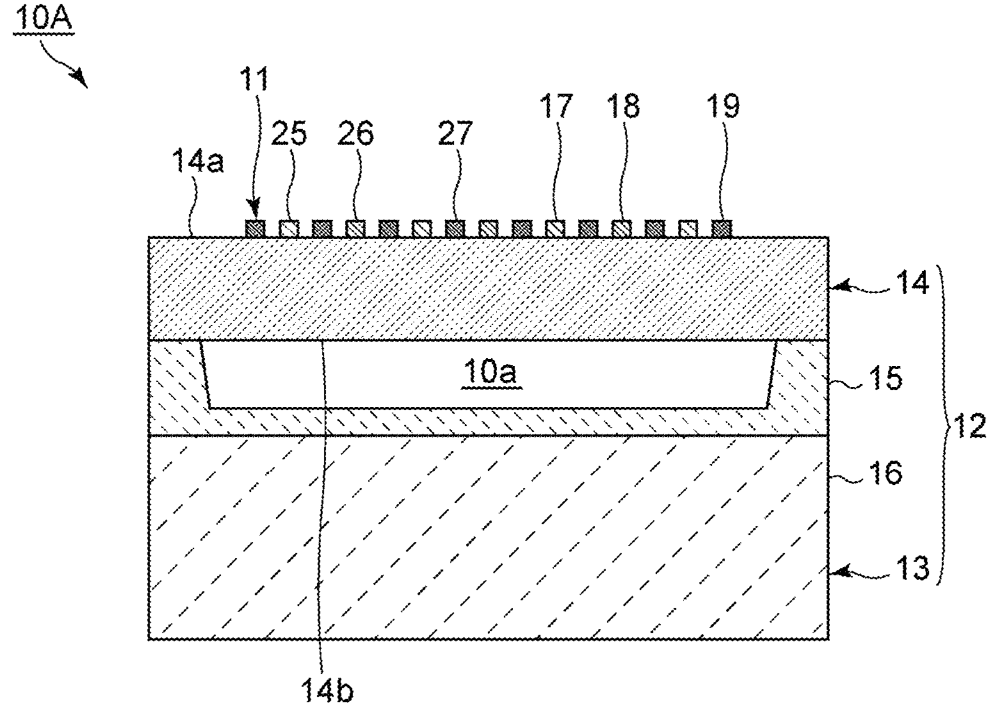
FIG. 2 is a schematic elevational cross-sectional view of a first acoustic wave resonator in the first example embodiment of the present invention.
Figure 3:
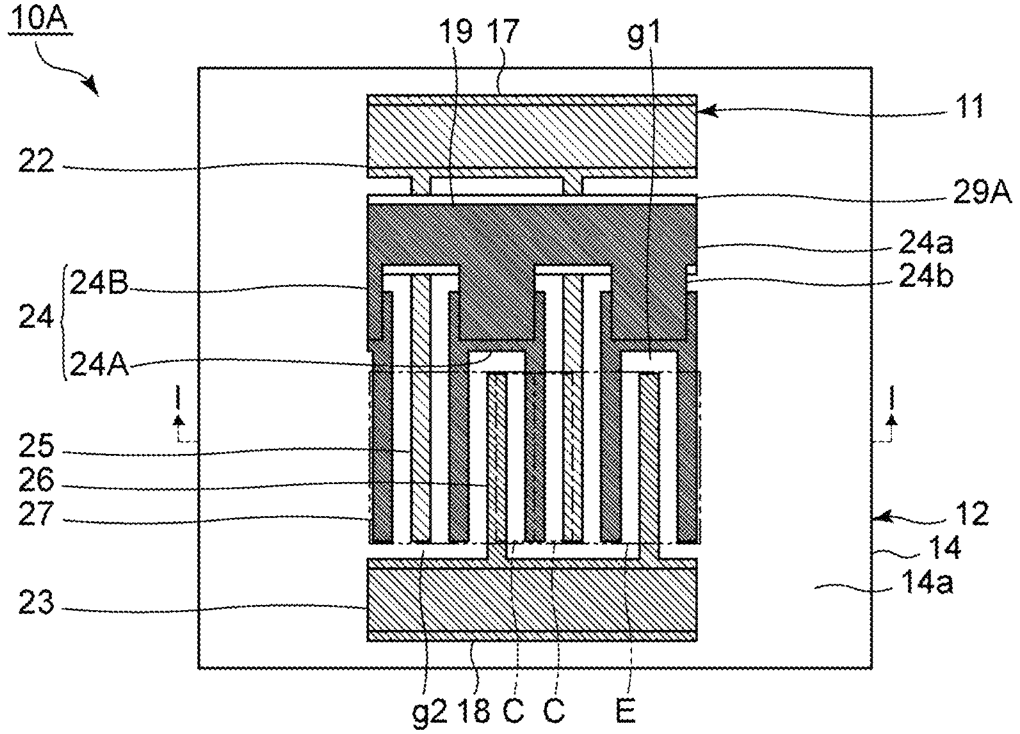
FIG. 3 is a schematic plan view of the first acoustic wave resonator in the first example embodiment of the present invention.

FIG. 2 is a schematic elevational cross-sectional view of the first acoustic wave resonator in the first example embodiment. FIG. 3 is a schematic plan view of the first acoustic wave resonator in the first example embodiment. FIG. 2 is a schematic sectional view taken along line I-I in FIG. 3. In FIG. 3, each electrode is indicated by the hatched pattern. In schematic plan views other than FIG. 3, as well, the electrodes may also be indicated by the hatched pattern. In FIG. 3, the second acoustic wave resonator 10B and wiring and other components connected to the first acoustic wave resonator 10A are not shown.

As discussed above, the first acoustic wave resonator 10A shown in FIG. 2 includes the piezoelectric substrate 12 and the functional electrode 11. The piezoelectric substrate 12 includes a support 13 and the piezoelectric layer 14, which is used as a piezoelectric film. In the first example embodiment, the support 13 includes a support substrate 16 and an insulating layer 15. The insulating layer 15 is disposed on the support substrate 16. The piezoelectric layer 14 is disposed on the insulating layer 15. The support 13 may be defined only by the support substrate 16.

The piezoelectric layer 14 includes a first main surface 14*a* and a second main surface 14*b*. The first and second main surfaces 14*a* and 14*b* face each other. As seen from the direction in which the first and second main surfaces 14*a* and 14*b* face each other, the piezoelectric layer 14 and the support 13 match each other. The second main surface 14*b* is positioned closer to the support 13 than the first main surface 14*a* is. The functional electrode 11 is disposed on the first main surface 14*a* of the piezoelectric layer 14.

As the material for the support substrate 16, for example, a semiconductor material, such as silicon, or a ceramic material, such as aluminum oxide, may be used. As the material for the insulating layer 15, a suitable dielectric substance, such as, for example, silicon oxide or tantalum oxide, may be used. The piezoelectric layer 14 is defined by a lithium niobate layer, such as a $LiNbO_3$ layer, for example. In the present specification, "a certain member is made of a certain material" includes the meaning that a small amount of impurity that does not significantly degrade the electrical characteristics of the acoustic wave device is included.

Multiple recesses are formed in the insulating layer 15. The piezoelectric layer 14 as a piezoelectric film is disposed on the insulating layer 15 so as to close the recesses. With this configuration, multiple hollowed portions are provided. These hollowed portions are cavities 10*a* and 10*b* shown in FIG. 1. In the first example embodiment, the support 13 and the piezoelectric film are disposed to partially face each other by sandwiching the cavities 10*a* and 10*b* therebetween. The recess in the support 13 may be provided along the entirety of the insulating layer 15 and the support substrate 16. Alternatively, a recess may be provided only in the support substrate 16 and be closed by the insulating layer 15. A recess may be provided in the piezoelectric layer 14. The cavities 10*a* and 10*b* may be through-holes provided in the support 13.

The cavities 10*a* and 10*b* define and function as acoustic reflectors. The cavity 10*a* as the acoustic reflector can effectively trap acoustic wave energy of the first acoustic wave resonator 10A in the piezoelectric layer 14. In a plan view, the cavity 10*a* in the support 13 is located at a position at which it matches at least a portion of the functional electrode 11. The cavity 10*b* as the acoustic reflector can effectively trap acoustic wave energy of the second acoustic wave resonator 10B in the piezoelectric layer 14. In a plan view, the cavity 10*b* in the support 13 is located at a position at which it matches at least a portion of the functional electrode 31.

In the present specification, "in a plan view" is to view in a direction from the top side in FIG. 2 along a stacking direction of the support 13 and the piezoelectric film. In FIG. 2, for example, the piezoelectric layer 14 is located at a higher position than the support substrate 16. Moreover, in the present specification, "in a plan view" is synonymous with viewing in the facing direction of the main surfaces. The facing direction of the main surfaces is the direction in which the first and second main surfaces 14*a* and 14*b* of the piezoelectric layer 14 face each other. More specifically, the facing direction of the main surfaces is the direction of a line normal or substantially normal to the first main surface 14*a*, for example.

As illustrated in FIG. 3, the functional electrode 11 includes a pair of comb-shaped electrodes and a third electrode 19. More specifically, the pair of comb-shaped electrodes includes a first comb-shaped electrode 17 and a second comb-shaped electrode 18. The first comb-shaped electrode 17 is connected to an input potential, while the second comb-shaped electrode 18 is connected to an output potential. In the first example embodiment, the third electrode 19 is connected to a reference potential. In the first example embodiment, the third electrode 19 is a reference potential electrode. It is not necessary that the third electrode 19 is connected to the reference potential if it is connected to a potential different from those to which the first and second comb-shaped electrodes 17 and 18 are connected. It is, however, preferable that the third electrode 19 is connected to the reference potential.

The first and second comb-shaped electrodes 17 and 18 are disposed on the first main surface 14*a* of the piezoelectric layer 14. The first comb-shaped electrode 17 includes a first busbar 22 and multiple first electrode fingers 25. One end of each of the first electrode fingers 25 is connected to the first busbar 22. The second comb-shaped electrode 18 includes a second busbar 23 and multiple second electrode fingers 26. One end of each of the second electrode fingers 26 is connected to the second busbar 23.

The first busbar 22 and the second busbar 23 face each other. The first electrode fingers 25 and the second electrode fingers 26 are interdigitated with each other. The first electrode fingers 25 and the second electrode fingers 26 are arranged alternately in a direction perpendicular or substantially perpendicular to the extending direction of the first and second electrode fingers 25 and 26.

The third electrode 19 includes a third busbar 24, which defines and functions as a connection electrode, and multiple third electrode fingers 27. The third electrode fingers 27 are disposed on the first main surface 14*a* of the piezoelectric layer 14. The third electrode fingers 27 are electrically connected to each other by the third busbar 24.

In a plan view, the third electrode fingers 27 are arranged side by side with the first and second electrode fingers 25 and 26 in the arranging direction of the first and second electrode fingers 25 and 26. The first electrode fingers 25, the second electrode fingers 26, and the third electrode fingers 27 are thus arranged in one direction. The third electrode fingers 27 extend in parallel or substantially in parallel with the first and second electrode fingers 25 and 26.

Hereinafter, the extending direction of the first, second, and third electrode fingers 25, 26, and 27 will be referred to as an electrode-finger extending direction, and the direction perpendicular or substantially perpendicular to the electrode-finger extending direction will be referred to as an electrode-finger perpendicular direction. The arranging direction of the first, second, and third electrode fingers 25, 26, and 27 will be referred to as an electrode-finger arranging direction. The electrode-finger arranging direction is parallel or substantially parallel with the electrode-finger perpendicular direction. In the present specification, the first, second, and third electrode fingers 25, 26, and 27 may simply collectively be referred to as electrode fingers. The first and second busbars 22 and 23 may simply collectively be referred to as busbars.

Figure 4:
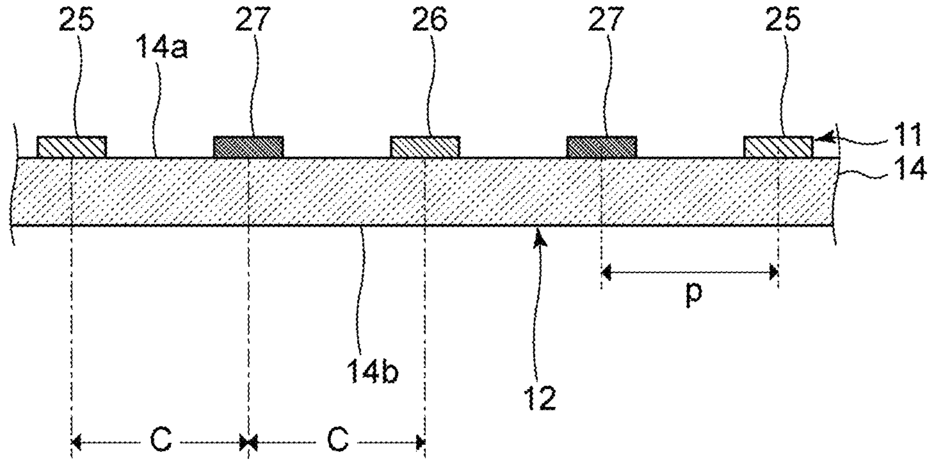
FIG. 4 is a schematic elevational cross-sectional view illustrating first, second, and third electrode fingers and the vicinities thereof in the first example embodiment of the present invention.

FIG. 4 is a schematic elevational cross-sectional view illustrating the first, second, and third electrode fingers and the vicinities thereof in the first example embodiment.

In a plan view, the arrangement order of the multiple electrode fingers is the order in which a set of the first electrode finger 25, third electrode finger 27, second electrode finger 26, and third electrode finger 27 is repeated as one period if the arrangement order begins with the first electrode finger 25. The arrangement order of the multiple electrode fingers is thus the first electrode finger 25, the third electrode finger 27, the second electrode finger 26, the third electrode finger 27, the first electrode finger 25, the third electrode finger 27, the second electrode finger 26 . . . . When the input potential is represented by IN, the output potential by OUT, and the reference potential by GND, the arrangement order of the electrode fingers can be represented by the order of the potentials connected to the electrode fingers, as IN, GND, OUT, GND, IN, GND, OUT . . . .

In the first example embodiment, in a region where multiple electrode fingers are disposed, the electrode fingers at both ends in the electrode-finger perpendicular direction are both third electrode fingers 27. In this region, however, the electrode finger at one end in the electrode-finger perpendicular direction may be any one of the first electrode finger 25, second electrode finger 26, and third electrode finger 27.

As shown in FIG. 3, the third busbar 24, which defines and functions as the connection electrode, of the third electrode 19 electrically connects the third electrode fingers 27. More specifically, the third busbar 24 is located in a region between the first busbar 22 and the forward ends of the second electrode fingers 26. In this region, the first electrode fingers 25 are also provided. The third busbar 24 and the first electrode fingers 25 are electrically insulated from each other by an insulating film 29A.

The third busbar 24 will be explained below more specifically. The third busbar 24 includes multiple first connection electrodes 24A and one second connection electrode 24B. Each of the first connection electrodes 24A connects the forward ends of two adjacent third electrode: fingers 27. A first connection electrode 24A and two third electrode fingers 27 define a U-shaped electrode. The second connection electrode 24B connects the first connection electrodes 24A with each other. The insulating film 29A is disposed between the second connection electrode 24B and the first electrode fingers 25.

In greater details, the insulating film 29A is provided on the first main surface 14*a* of the piezoelectric layer 14 so as to cover a portion of each of the first electrode fingers 25. The insulating film 29A is disposed in the region between the first busbar 22 and the forward ends of the second electrode fingers 26. The insulating film 29A has a bar shape.

The insulating film 29A does not extend to the first connection electrodes 24A of the third electrode 19. The second connection electrode 24B is disposed on the insulating film 29A and the first connection electrodes 24A. More specifically, the second connection electrode 24B includes a bar portion 24*a* and multiple projecting portions 24*b*. Each projecting portion 24*b* extends from the bar portion 24*a* toward the corresponding first connection electrode 24A. Each projecting portion 24*b* is connected to the corresponding first connection electrode 24A. With this configuration, the third electrode fingers 27 are electrically connected to each other by the first connection electrodes 24A and the second connection electrode 24B.

In the first example embodiment, the third busbar 24 is located in the region between the first busbar 22 and the forward ends of the second electrode fingers 26. The forward ends of the second electrode fingers 26 thus face the third busbar 24 with a gap g1 in the electrode-finger extending direction. The forward ends of the first electrode fingers 25 face the second busbar 23 with a gap g2 in the electrode-finger extending direction.

The third busbar 24 may be disposed in the region between the second busbar 23 and the forward ends of the first electrode fingers 25. In this case, the forward ends of the first electrode fingers 25 face the third busbar 24 with a gap, while the forward ends of the second electrode fingers 26 face the first busbar 22 with a gap.

When the third electrode 19 is the reference potential electrode as described above, the first acoustic wave resonator 10A is configured as follows. In the electrode-finger extending direction, the forward ends of the first electrode fingers 25 face, with a gap, the electrode connected to the potential which is different from the potential connected to the first electrode fingers 25 and which is one of the input potential, output potential, and reference potential. Similarly, in the electrode-finger extending direction, the forward ends of the second electrode fingers 26 face, with a gap, the electrode connected to the potential which is different from the potential connected to the second electrode fingers 26 and which is one of the input potential, output potential, and reference potential.

The dimensions in these gaps in the electrode-finger extending direction are set to be gap lengths. In the first example embodiment, the gap length of the gap g1 and that of the gap g2 are the same or substantially the same. However, the gap length of the gap g1 and that of the gap g2 may be different from each other.

The first acoustic wave resonator 10A is an acoustic wave resonator that can utilize a bulk wave of the thickness shear mode. As illustrated in FIG. 3, the first acoustic wave resonator 10A includes multiple excitation regions C. In the excitation regions C, a bulk wave of the thickness shear mode and an acoustic wave of another mode are excited. In FIG. 3, only two of the multiple excitation regions C are shown.

Among all of the excitation regions C, some excitation regions C are regions where adjacent first and third electrode fingers 25 and 27 overlap each other and are also regions between the centers of the adjacent first and third electrode fingers 25 and 27, as seen in the electrode-finger perpendicular direction. The remaining excitation regions C are regions where adjacent second and third electrode fingers 26 and 27 overlap each other and are also regions between the centers of the adjacent second and third electrode fingers 26 and 27, as seen in the electrode-finger perpendicular direction. These excitation regions C are arranged in the electrode-finger perpendicular direction.

The configuration of the functional electrode 11 is the same as or similar to that of an IDT (Interdigital Transducer) electrode, except for the third electrode 19. As viewed in the electrode-finger perpendicular direction, a region where adjacent first and second electrode fingers 25 and 26 overlap each other is an overlapping region E. It can also be said that the overlapping region E is a region where adjacent first and third electrode fingers 25 and 27 overlap each other or a region where adjacent second and third electrode fingers 26 and 27 overlap each other, as viewed in the electrode-finger perpendicular direction. The overlapping region E includes multiple excitation regions C. The overlapping region E and the excitation regions C of the first acoustic wave resonator 10A are regions on the piezoelectric layer 14 which are defined based on the configuration of the functional electrode 11.

Figure 5:
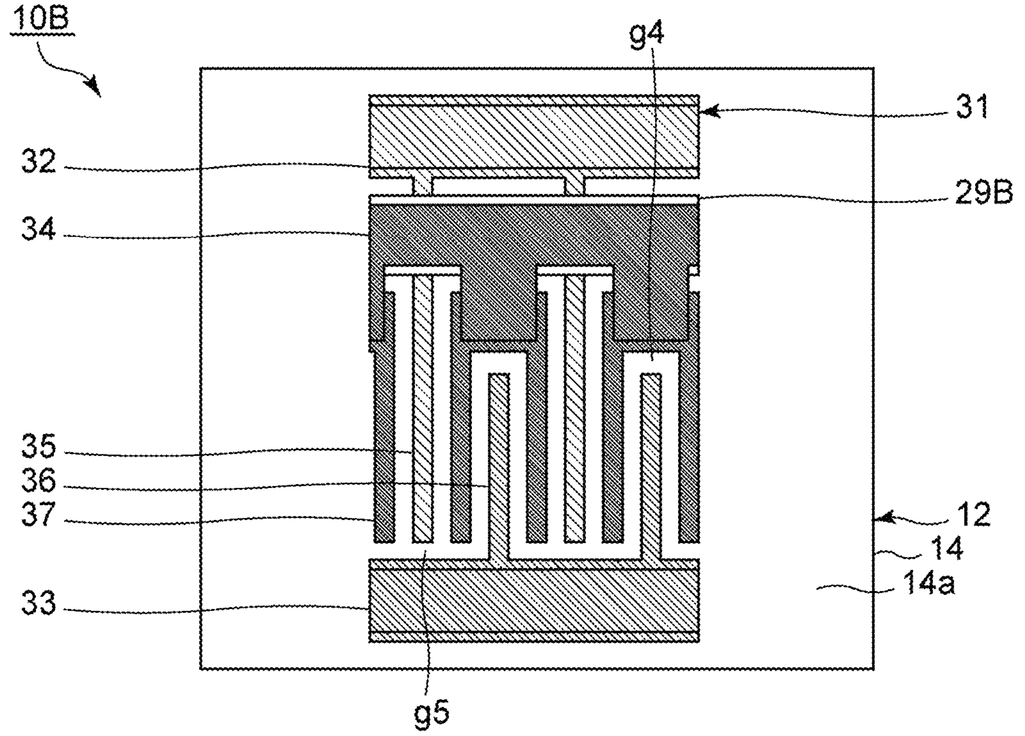
FIG. 5 is a schematic plan view of a second acoustic wave resonator in the first example embodiment of the present invention.

FIG. 5 is a schematic plan view of the second acoustic wave resonator in the first example embodiment. In FIG. 5, the first acoustic wave resonator 10A and wiring and other components connected to the second acoustic wave resonator 10B are not shown.

The second acoustic wave resonator 10B can utilize a bulk wave of the thickness shear mode. The second acoustic wave resonator 10B is an acoustic coupling filter. The second acoustic wave resonator 10B shares the piezoelectric substrate 12 with the first acoustic wave resonator 10A. The second acoustic wave resonator 10B includes the above-described functional electrode 31. More specifically, the functional electrode 31 is disposed on the first main surface 14*a* of the piezoelectric layer 14 of the piezoelectric substrate 12. Basically, the configuration of the functional electrode 31 of the second acoustic wave resonator 10B is the same as or similar to that of the functional electrode 11 of the first acoustic wave resonator 10A.

The second acoustic wave resonator 10B will be explained more specifically. The second acoustic wave resonator 10B includes a first comb-shaped electrode, a second comb-shaped electrode, and a third electrode different from those of the first acoustic wave resonator 10A. Hereinafter, the first comb-shaped electrode of the second acoustic wave resonator 10B will be referred to as a fourth comb-shaped electrode, the second comb-shaped electrode of the second acoustic wave resonator 10B will be referred to as a fifth comb-shaped electrode, and the third electrode of the second acoustic wave resonator 10B will be referred to as a sixth electrode.

The fourth comb-shaped electrode is connected to the input potential, while the fifth comb-shaped electrode is connected to the output potential. In the first example embodiment, the first acoustic wave resonator 10A and the second acoustic wave resonator 10B are connected in series with each other. Specifically, the fourth comb-shaped electrode is connected to the output potential of the first acoustic wave resonator 10A.

In the first example embodiment, the sixth electrode of the second acoustic wave resonator 10B is connected to the reference potential. In the first example embodiment, the sixth electrode is a reference potential electrode. It is not necessary that the sixth electrode is connected to the reference potential if it is connected to a potential different from those to which the fourth and fifth comb-shaped electrodes are connected. It is, however, preferable that the sixth electrode be connected to the reference potential.

The fourth and fifth comb-shaped electrodes are provided on the first main surface 14*a* of the piezoelectric layer 14. The fourth comb-shaped electrode includes a fourth busbar 32 as a first busbar and multiple fourth electrode fingers 35 as multiple first electrode fingers. One end of each of the fourth electrode fingers 35 is connected to the fourth busbar 32.

In the first example embodiment, the fourth busbar 32 of the second acoustic wave resonator 10B is also used by the first acoustic wave resonator 10A. More specifically, the fourth busbar 32 is the second busbar 23 of the first acoustic wave resonator 10A shown in FIG. 1. However, the second busbar 23 of the first acoustic wave resonator 10A and the fourth busbar 32 of the second acoustic wave resonator 10B may be provided differently.

Referring back to FIG. 5, the fifth comb-shaped electrode includes a fifth busbar 33 as a second busbar and multiple fifth electrode fingers 36 as multiple second electrode fingers. One end of each of the fifth electrode fingers 36 is connected to the fifth busbar 33.

The fourth busbar 32 and the fifth busbar 33 face each other. The fourth electrode fingers 35 and the fifth electrode fingers 36 are interdigitated with each other. The fourth electrode fingers 35 and the fifth electrode fingers 36 are arranged alternately in a direction perpendicular or substantially perpendicular to the extending direction of the fourth and fifth electrode fingers 35 and 36.

The sixth electrode includes a sixth busbar 34, which defines and functions as a connection electrode, and multiple sixth electrode fingers 37 as multiple third electrode fingers. The sixth electrode fingers 37 are disposed on the first main surface 14*a* of the piezoelectric layer 14. The sixth electrode fingers 37 are electrically connected to each other by the sixth busbar 34. The sixth busbar 34 is configured the same as or similarly to the third busbar 24 of the first acoustic wave resonator 10A. The sixth busbar thus includes first connection electrodes and a second connection electrode.

In a plan view, the sixth electrode fingers 37 are disposed to be arranged side by side with the fourth and fifth electrode fingers 35 and 36 in the arranging direction of the fourth and fifth electrode fingers 35 and 36. The fourth electrode fingers 35, the fifth electrode fingers 36, and the sixth electrode fingers 37 are thus arranged in one direction. The sixth electrode fingers 37 extend in parallel or substantially in parallel with the fourth and fifth electrode fingers 35 and 36.

In the second acoustic wave resonator 10B, the extending direction of the fourth, fifth, and sixth electrode fingers 35, 36, and 37 is the electrode-finger extending direction, and the direction perpendicular or substantially perpendicular to the electrode-finger extending direction is the electrode-finger perpendicular direction. Hereinafter, the fourth, fifth, and sixth electrode fingers 35, 36, and 37 may simply collectively be called multiple electrode fingers.

In a plan view, the arrangement order of the multiple electrode fingers of the second acoustic wave resonator 10B is the order in which a set of the fourth electrode finger 35, sixth electrode finger 37, fifth electrode finger 36, and sixth electrode finger 37 is repeated as one period if the arrangement order is started by the fourth electrode finger 35. That is, in the second acoustic wave resonator 10B, as well as in the first acoustic wave resonator 10A, the arrangement order of the multiple electrode fingers is the order in which a set of the first electrode finger, the third electrode finger, the second electrode finger, and the third electrode finger is repeated as one period if the arrangement order is started by the first electrode finger.

The sixth busbar 34 is located in a region between the fourth busbar 32 and the forward ends of the fifth electrode fingers 36. The sixth busbar 34 and the fourth electrode fingers 35 are electrically insulated from each other by an insulating film 29B.

The forward ends of the fifth electrode fingers 36 face the sixth busbar 34 with a gap g4 in the electrode-finger extending direction. The forward ends of the fourth electrode fingers 35 face the fifth busbar 33 with a gap g5 in the electrode-finger extending direction.

In the second acoustic wave resonator 10B, when the sixth electrode is the reference potential electrode, the second acoustic wave resonator 10B is configured as follows as in the first acoustic wave resonator 10A. In the electrode-finger extending direction, the forward ends of the fourth electrode fingers 35 face, with a gap, the electrode connected to the potential which is different from the potential connected to the fourth electrode fingers 35 and which is one of the input potential, output potential, and reference potential. Similarly, in the electrode-finger extending direction, the forward ends of the fifth electrode fingers 36 face, with a gap, the electrode connected to the potential which is different from the potential connected to the fifth electrode fingers 36 and which is one of the input potential, output potential, and reference potential.

The dimensions in these gaps in the electrode-finger extending direction are set to be gap lengths of the second acoustic wave resonator 10B. In the first example embodiment, the gap length of the gap g4 and that of the gap g5 are the same or substantially the same. However, the gap length of the gap g4 and that of the gap g5 may be different from each other.

As well as the first acoustic wave resonator 10A, the second acoustic wave resonator 10B includes multiple excitation regions and an overlapping region. More specifically, among all of the excitation regions, some excitation regions are regions where adjacent fourth and sixth electrode fingers 35 and 37 overlap each other and are also regions between the centers of the adjacent fourth and sixth electrode fingers 35 and 37, as seen in the electrode-finger perpendicular direction. The remaining excitation regions are regions where adjacent fifth and sixth electrode fingers 36 and 37 overlap each other and are also regions between the centers of the adjacent fifth and sixth electrode fingers 36 and 37, as seen in the electrode-finger perpendicular direction. These excitation regions are arranged in the electrode-finger perpendicular direction.

As viewed in the electrode-finger perpendicular direction, a region where adjacent fourth and fifth electrode fingers 35 and 36 overlap each other is the overlapping region. It can also be said that the overlapping region is a region where adjacent fourth and sixth electrode fingers 35 and 37 overlap each other or a region where adjacent fifth and sixth electrode fingers 36 and 37 overlap each other, as viewed in the electrode-finger perpendicular direction. The overlapping region and the excitation regions of the second acoustic wave resonator 10B are regions in the piezoelectric layer 14 which are defined based on the configuration of the functional electrode 31.

In the first example embodiment, using the acoustic wave device 10 for a filter apparatus makes it possible to reduce the size of the filter apparatus and also to improve the electric power handling capability. This will be discussed in detail below.

Hereinafter, one acoustic wave resonator from which multiple divided resonators are generated may be referred to as a base acoustic wave resonator. The first and second acoustic wave resonators 10A and 10B are obtained by dividing a base acoustic wave resonator in series.

The acoustic wave device 10 includes the first and second acoustic wave resonators 10A and 10B, but not the base acoustic wave resonator. For the sake of convenience, however, it is assumed that, as in the first and second acoustic wave resonators 10A and 10B, the base acoustic wave resonator is also an acoustic coupling filter and includes the first and second comb-shaped electrodes and the third electrode. Examples of design parameters of the base acoustic wave resonator for the first and second acoustic wave resonators 10A and 10B are as follows.

Piezoelectric layer: made of $LiNbO_3$ having the Euler angles (φ, ψ, θ) of (0°, 0°, 90°) and having about a 400-nm thickness First through third electrode fingers: constituted by a Ti layer having about a 10-nm thickness, an AlCu layer having about a 390-nm thickness, and a Ti layer having about a 4-nm thickness in this order as seen from the piezoelectric layer Arrangement order of first through third electrode fingers: repeating a set of IN, GND, OUT, GND (represented by potentials to which the first, third, and second electrode fingers are connected) in this order Center-to-center distance between adjacent electrode fingers: about 1.4 μm Duty ratio: about 0.3

Figure 6:
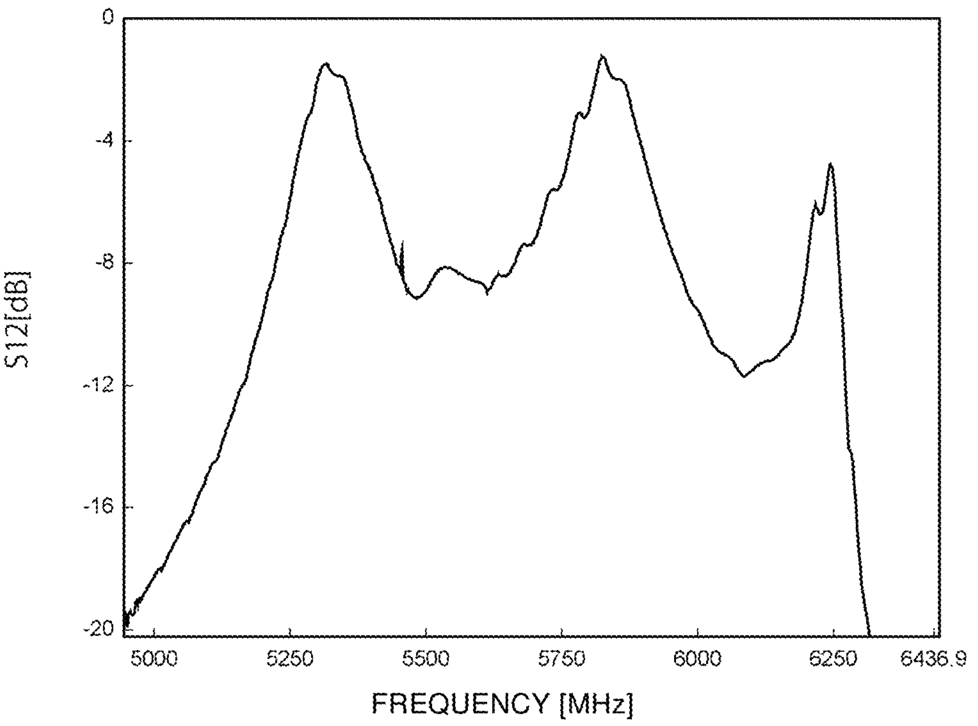
FIG. 6 is a graph illustrating the bandpass characteristics in the first example embodiment of the present invention.

The bandpass characteristics of the acoustic wave device 10 whose first and second acoustic wave resonators 10A and 10B are divided resonators obtained by dividing the acoustic wave resonator having the above-described design parameters in series are shown in FIG. 6.

FIG. 6 is a graph illustrating the bandpass characteristics in the first example embodiment. In FIG. 6, an S12 parameter is shown.

It is seen from FIG. 6 that filter characteristics are obtained from the acoustic wave device 10 of the first example embodiment. The first acoustic wave resonator 10A of the acoustic wave device 10 is an acoustic coupling filter. More specifically, as illustrated in FIG. 3, the first acoustic wave resonator 10A has an excitation region C positioned between the centers of adjacent first and third electrode fingers 25 and 27 and an excitation region C positioned between the centers of adjacent second and third electrode fingers 26 and 27. In these excitation regions C, acoustic waves of multiple modes including a bulk wave of the thickness shear mode are excited. By coupling these modes, a suitable filter waveform can be obtained.

A filter waveform can also be obtained from the second acoustic wave resonator 10B, as well as from the first acoustic wave resonator 10A. Using the acoustic wave device 10 for a filter apparatus makes it possible to obtain a suitable filter waveform even with a small number of acoustic wave resonators which define the filter apparatus. This can reduce the size of the filter apparatus.

Additionally, in the first example embodiment, each of the first and second acoustic wave resonators 10A and 10B is a divided resonator obtained by dividing one acoustic wave resonator in series. As a result of dividing one acoustic wave resonator into multiple divided resonators in series, the total area of the acoustic wave resonators is increased. Electric power to be applied to the acoustic wave resonators per unit area thus becomes lower. Even with the application of high electric power, the acoustic wave resonators are less likely to be broken. In this manner, the electric power handling capability can be improved. The occurrence of IMD (Intermodulation Distortion) can also be reduced.

The configuration of the first example embodiment will be described below in greater detail.

As illustrated in FIG. 1, a first signal potential line 28A, a second signal potential line 28B, and a reference potential line 28C are provided on the first main surface 14*a* of the piezoelectric layer 14. The first signal potential line 28A is connected to the input potential. The second signal potential line 28B is connected to the output potential. The reference potential line 28C is connected to the reference potential.

The first busbar 22 of the first acoustic wave resonator 10A is connected to the first signal potential line 28A. The fifth busbar 33 of the second acoustic wave resonator 10B is connected to the second signal potential line 28B.

The third busbar 24, which defines and functions as a connection electrode, of the first acoustic wave resonator 10A and the sixth busbar 34, which defines and functions as a connection electrode, of the second acoustic wave resonator 10B are connected to the reference potential line 28C. The third busbar 24 and the sixth busbar 34 are connected to the reference potential via the reference potential line 28C. In the first example embodiment, the third busbar 24 and the sixth busbar 34 are connected to the same reference potential line 28C. Alternatively, the third busbar 24 and the sixth busbar 34 may be connected to different reference potential lines 28C.

In a plan view, the first electrode fingers 25, the second electrode fingers 26, and the third electrode fingers 27 of the first acoustic wave resonator 10A at least partially match the cavity 10*a*, which defines and functions as the acoustic reflector. In a plan view, the fourth electrode fingers 35, the fifth electrode fingers 36, and the sixth electrode fingers 37 of the second acoustic wave resonator 10B at least partially match the cavity 10*b*, which defines and functions as the acoustic reflector.

As in the first example embodiment, it is preferable that, in a plan view, the multiple excitation regions C of the first acoustic wave resonator 10A at least partially match the cavity 10*a*, which defines and functions as the acoustic reflector. This can trap acoustic wave energy of the first acoustic wave resonator 10A more effectively in the piezoelectric layer 14. It is also preferable that, in a plan view, the multiple excitation regions of the second acoustic wave resonator 10B at least partially match the cavity 10*b*, which defines and functions as the acoustic reflector. This can trap acoustic wave energy of the second acoustic wave resonator 10B more effectively in the piezoelectric layer 14.

The acoustic reflector may be, for example, an acoustic reflection film, such as a multilayer acoustic film, which will be described later. For example, an acoustic reflection film may be provided on the surface of the support.

The first electrode fingers 25, the second electrode fingers 26, and the third electrode fingers 27 of the first acoustic wave resonator 10A shown in FIG. 3 are made of a multilayer metal film. More specifically, for example, the first, second, and third electrode fingers 25, 26, and 27 may include a Ti layer, an AlCu layer, and a Ti layer stacked on each other in this order as seen from the piezoelectric layer 14. The materials for the first, second, and third electrode fingers 25, 26, and 27 are not limited to the above-described materials. The first, second, and third electrode fingers 25, 26, and 27 may include a metal film including a single layer.

For the fourth electrode fingers 35, the fifth electrode fingers 36, and the sixth electrode fingers 37 of the second acoustic wave resonator 10B, materials similar to those for the electrode fingers of the first acoustic wave resonator 10A may be used.

In the first acoustic wave resonator 10A, the center-to-center distance between adjacent first and third electrode fingers 25 and 27 and that between adjacent second and third electrode fingers 26 and 27 are indicated by p1. In the second acoustic wave resonator 10B, the center-to-center distance between adjacent first and third electrode fingers and that between adjacent second and third electrode fingers are indicated by p2. That is, the center-to-center distance between adjacent fourth and sixth electrode fingers 35 and 37 and that between adjacent fifth and sixth electrode fingers 36 and 37 are p2.

In the first example embodiment, in the first acoustic wave resonator 10A, the center-to-center distance p1 between adjacent first and third electrode fingers 25 and 27 and the center-to-center distance p1 between adjacent second and third electrode fingers 26 and 27 are the same or substantially the same. It is not necessary, however, that the above-described two center-to-center distances p1 are the same or substantially the same. In this case, the longest one of the center-to-center distances p1 between adjacent first and third electrode fingers 25 and 27 and those between adjacent second and third electrode fingers 26 and 27 is set to be p. When the center-to-center distance p1 between adjacent electrode fingers is fixed as in the first example embodiment, the center-to-center distance p1 between each pair of adjacent electrode fingers in the first acoustic wave resonator 10A is the distance p.

Similarly, in the first example embodiment, in the second acoustic wave resonator 10B, the center-to-center distance p2 between adjacent fourth and sixth electrode fingers 35 and 37 and the center-to-center distance p2 between adjacent fifth and sixth electrode fingers 36 and 37 are the same or substantially the same. It is not necessary, however, that the two center-to-center distances p2 are the same or substantially the same. In this case, the longest one of the center-to-center distances p2 between adjacent fourth and sixth electrode fingers 35 and 37 and those between adjacent fifth and sixth electrode fingers 36 and 37 is set to be p. If the center-to-center distance p2 between adjacent electrode fingers is fixed as in the first example embodiment, the center-to-center distance p2 between each pair of adjacent electrode fingers in the second acoustic wave resonator 10B is the distance p.

In each of the first and second acoustic wave resonators 10A and 10B, d/p is, for example, preferably smaller than about 0.5, and more preferably, about 0.24 or smaller, where d is the thickness of the piezoelectric film. This can suitably excite a bulk wave of the thickness shear mode in each of the first and second acoustic wave resonators 10A and 10B. In the first example embodiment, the thickness d is the thickness of the piezoelectric layer 14.

The first acoustic wave resonators according to example embodiments of the present invention do not necessarily utilize a bulk wave of the thickness shear mode. For example, the first acoustic wave resonator may be able to excite a Lamb wave. In this case, the excitation region is the overlapping region E shown in FIG. 3. Similarly, the second acoustic wave resonator may also be able to excite a Lamb wave.

In the first example embodiment, the piezoelectric layer 14 is made of lithium niobate, for example. The fractional bandwidth of the first acoustic wave resonator 10A is dependent on the Euler angles (φ, θ, ψ) of lithium niobate used for the piezoelectric layer 14. This also applies to the second acoustic wave resonator 10B. The fractional bandwidth is represented by (|fa−fr|/fr)×100 [%], where fr is the resonant frequency and fa is the anti-resonant frequency.

The relationship between the fractional bandwidth of the first acoustic wave resonator 10A and the Euler angles (φ, θ, ψ) of the piezoelectric layer 14 in a case in which d/p is as close to 0 as possible was found. In the Euler angles, φ was set to be about 0°.

Figure 7:
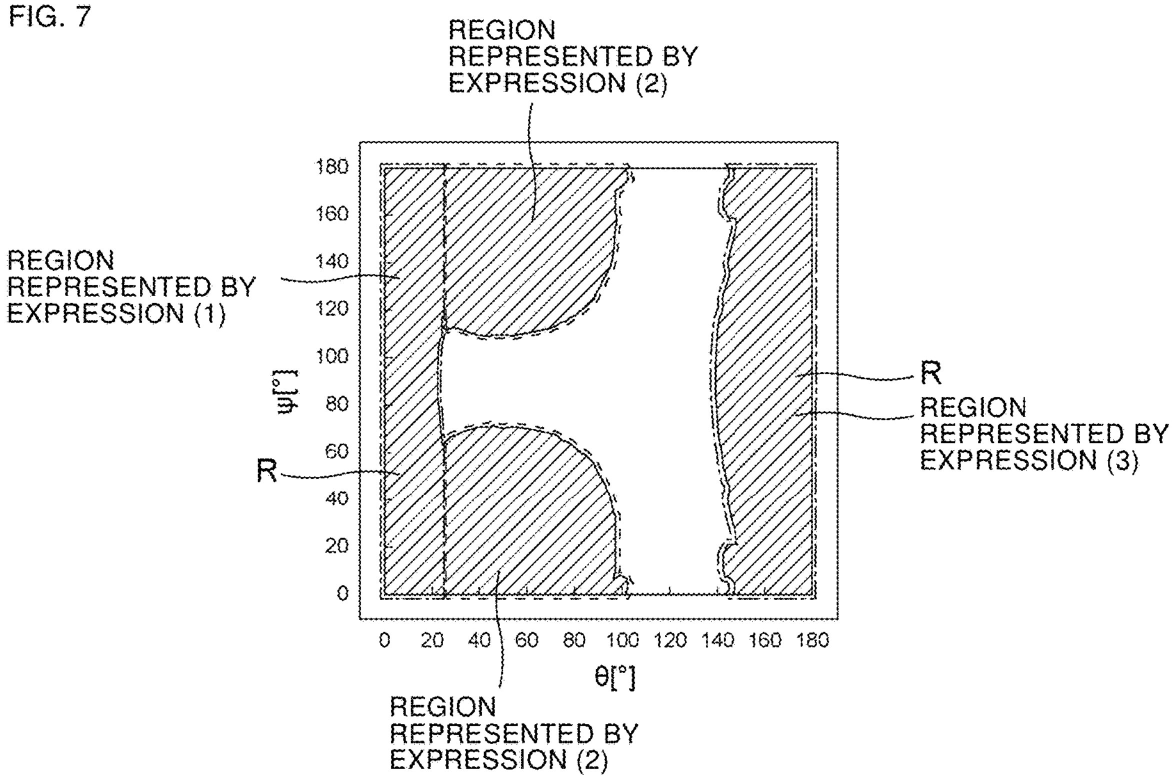
FIG. 7 is a diagram illustrating a map of the fractional bandwidth with respect to the Euler angles (0°, θ, ψ) of $LiNbO_3$ in a case in which d/p is approached as close to 0 as possible.

FIG. 7 is a diagram illustrating a map of the fractional bandwidth with respect to the Euler angles (0°, θ, ψ) of $LiNbO_3$ in a case in which d/p is as close to 0 as possible.

The hatched portions in FIG. 7 are regions R where a fractional bandwidth of at least about 2% or higher is obtained. The ranges of the regions R can be approximated to the ranges represented by the following Expressions (1), (2), and (3). When φ in the Euler angles (φ, θ, ψ) is set to be in the range of about 0°±10°, the relationship between θ and ψ and the fractional bandwidth becomes the same as or similar to that shown in FIG. 7.

(about 0°±10°,about 0° to about 25°,a desirable angle of v) Expression (1)

(about 0°±10°,about 25° to about 100°,about 0° to about 75° $[(1-(\theta-50)^2/2500)]^{1/2}$ or about 180° to about 75° $[(1-(\theta-50)^2/2500)]^{1/2}$ to 180°) Expression (2)

(about 0°±10°,about 180°−40° $[(1-(\psi-90)^2/8100)]^{1/}$ 2to about 180°,a desirable angle of ψ) Expression (3)

The Euler angles are preferably in the range represented by the above-described Expression (1), (2), or (3). Then, a sufficiently wide fractional bandwidth can be obtained. Thus, the acoustic wave device 10 including the first acoustic wave resonator 10A can be suitably used for a filter apparatus.

Similarly, in the second acoustic wave resonator 10B, the Euler angles (φ, θ, ψ) of lithium niobate of the piezoelectric layer 14 are preferably in the range represented by the above-described Expression (1), (2), or (3). Thus, the acoustic wave device 10 including the second acoustic wave resonator 10B can be suitably used for a filter apparatus.

Figure 8:
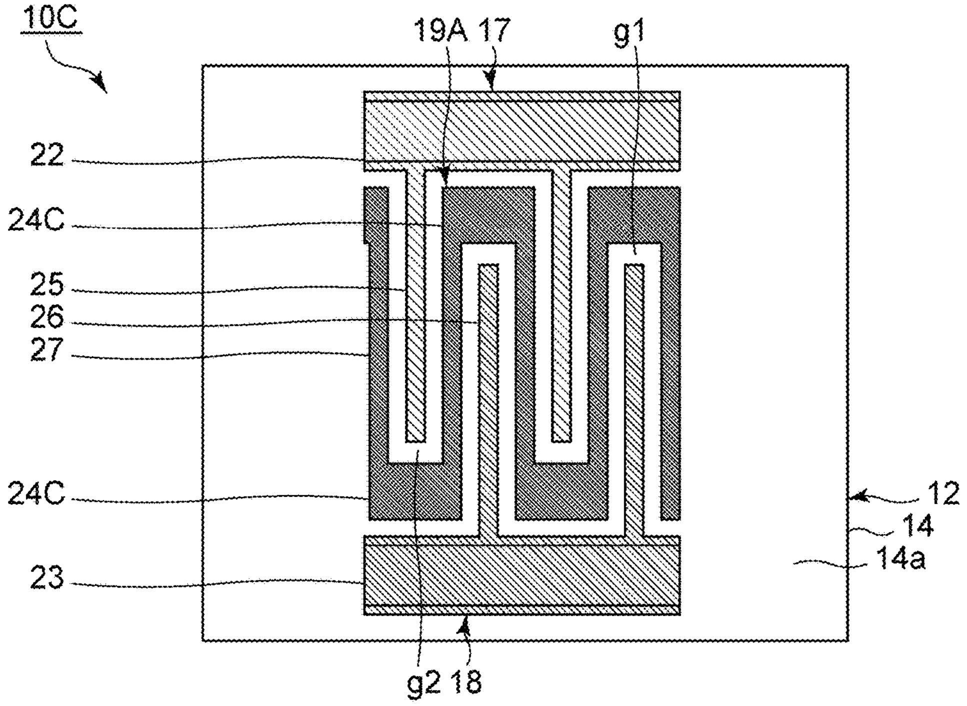
FIG. 8 is a schematic plan view of the first acoustic wave resonator in a modified example of the first example embodiment of the present invention.

As illustrated in FIG. 3, in the first acoustic wave resonator 10A of the first example embodiment, the third electrode 19 includes the third busbar 24, which defines and functions as a connection electrode, and multiple third electrode fingers 27. The third electrode 19 is a comb-shaped electrode. However, the third electrode 19 may have a shape other than the comb shape. For example, in a modified example of the first example embodiment shown in FIG. 8, a third electrode 19A of a first acoustic wave resonator 80A has a meandering shape. In the modified example, the insulating film 29A is not provided on the piezoelectric layer 14. Connection electrodes 24C only include a portion corresponding to the multiple first connection electrodes 24A in the first example embodiment. The connection electrodes 24C in the modified example are not the third busbar.

The third electrode 19A will be explained more specifically. The third electrode 19A includes multiple connection electrodes 24C positioned close to the first busbar 22 and multiple connection electrodes 24C positioned close to the second busbar 23. The forward ends of two adjacent third electrodes 27 close to the first busbar 22 or those of two adjacent third electrodes 27 close to the second busbar 23 are connected by the corresponding connection electrode 24C. For example, regarding each of the third electrode fingers 27 other than those at both ends in the electrode-finger perpendicular direction, one connection electrode 24C is connected to one forward end of the third electrode finger 27 close to the first busbar 22, while another connection electrode 24C is connected to the other forward end of the third electrode finger 27 close to the second busbar 23. This third electrode finger 27 is connected to adjacent third electrode fingers 27 by these connection electrodes 24C. By repeating this structure, the third electrode 19A is configured in a meandering shape.

In the modified example, in the electrode-finger extending direction, the forward ends of the second electrode fingers 26 each face the corresponding connection electrode 24C with a gap g1 therebetween. That is, in the electrode-finger extending direction, the forward ends of the second electrode fingers 26 each face, with the gap g1, the electrode connected to the potential which is different from the potential connected to this second electrode finger 26 and which is one of the input potential, output potential, and reference potential. More specifically, the second electrode fingers 26 are connected to the output potential, while the connection electrodes 24C are connected to the reference potential. The dimension of the gap g1 between the forward ends of the second electrode fingers 26 and the connection electrodes 24C in the electrode-finger extending direction is the gap length.

Similarly, in the electrode-finger extending direction, the forward ends of the first electrode fingers 25 each face the corresponding connection electrode 24C with a gap g2 therebetween. That is, in the electrode-finger extending direction, the forward ends of the first electrode fingers 25 each face, with the gap g2, the electrode connected to the potential which is different from the potential connected to this first electrode finger 25 and which is one of the input potential, output potential, and reference potential. More specifically, the first electrode fingers 25 are connected to the input potential, while the connection electrodes 24C are connected to the reference potential. The dimension of the gap g2 between the forward ends of the first electrode fingers 25 and the connection electrodes 24C in the electrode-finger extending direction is the gap length.

In the modified example, the gap length of the gap g1 and that of the gap g2 are the same or substantially the same. However, the gap length of the gap g1 and that of the gap g2 may be different from each other.

In the acoustic wave device of the modified example, the second acoustic wave resonator is configured similarly to the first acoustic wave resonator 80A, although it is not shown. The sixth electrode of the second acoustic wave resonator as the third electrode is configured in a meandering shape. Each of the second acoustic wave resonator and the first acoustic wave resonator 80A is a divided resonator obtained by dividing one acoustic wave resonator in series. Thus, as in the first example embodiment, using the acoustic wave device for a filter apparatus makes it possible to reduce the size of the filter apparatus and to improve the electric power handling capability.

Referring back to FIG. 1, in the first example embodiment, the cavities 10*a* and 10*b* are individually provided. Alternatively, the cavities 10*a* and 10*b* may be provided integrally. The first acoustic wave resonator 10A and the second acoustic wave resonator 10B may share the same cavity. In the example embodiments of the present invention other than the first example embodiment, as well, the first and second acoustic wave resonators 10A and 10B may share the same cavity.

The configurations of second through eighth example embodiments of the present invention will now be described below. The basic configurations of the second through eighth example embodiments are the same as or similar to the configuration of the first example embodiment. In the explanation of the second through eighth example embodiments, therefore, the drawings and reference signs used for the explanation of the first example embodiment will also be used.

In the second through eighth example embodiments, each of the first and second acoustic wave resonators 10A and 10B is a divided resonator obtained by dividing one acoustic wave resonator in series and is also an acoustic coupling filter. Thus, as in the first example embodiment, using the acoustic wave device for a filter apparatus makes it possible to reduce the size of the filter apparatus and to improve the electric power handling capability.

In the first example embodiment, the total number of the first electrode fingers 25, the second electrode fingers 26, and the third electrode fingers 27 of the first acoustic wave resonator 10A and the total number of the fourth electrode fingers 35, the fifth electrode fingers 36, and the sixth electrode fingers 37 of the second acoustic wave resonator 10B are the same. In the second example embodiment, however, the total number of the first electrode fingers 25, the second electrode fingers 26, and the third electrode fingers 27 of the first acoustic wave resonator 10A and the total number of the fourth electrode fingers 35, the fifth electrode fingers 36, and the sixth electrode fingers 37 of the second acoustic wave resonator 10B are different from each other. Other than this point, the configuration of the acoustic wave device of the second example embodiment is the same as or similar to that of the acoustic wave device 10 of the first example embodiment.

The filter characteristics of the first example embodiment and those of the second example embodiment were compared. In the second example embodiment, the design parameters of the base acoustic wave resonator for the first and second acoustic wave resonators 10A and 10B are as follows.

Piezoelectric layer: made of $LiNbO_3$ having the Euler angles (φ, ψ, θ) of (0°, 0°, 90°) and having about a 400-nm thickness First through third electrode fingers: constituted by a Ti layer having about a 10-nm thickness, an AlCu layer having about a 390-nm thickness, and a Ti layer having about a 4-nm thickness in this order as seen from the piezoelectric layer Arrangement order of first through third electrode fingers: repeating a set of IN, GND, OUT, GND (represented by potentials to which the first, third, and second electrode fingers are connected) in this order Center-to-center distance between adjacent electrode fingers: about 1.4 μm Duty ratio: about 0.3

The number of electrode fingers of the first acoustic wave resonator 10A and that of the second acoustic wave resonator 10B in the second example embodiment are as follows.

Total number of first through third electrode fingers: 22

Total number of fourth through sixth electrode fingers: 66

The design parameters of the base acoustic wave resonator for the first and second acoustic wave resonators 10A and 10B of the first example embodiment were set to be the same as or similar to those of the second example embodiment. The number of electrode fingers of the first acoustic wave resonator 10A and that of the second acoustic wave resonator 10B in the first example embodiment are as follows.

Total number of first through third electrode fingers: 44

Total number of fourth through sixth electrode fingers: 44

Figure 9:
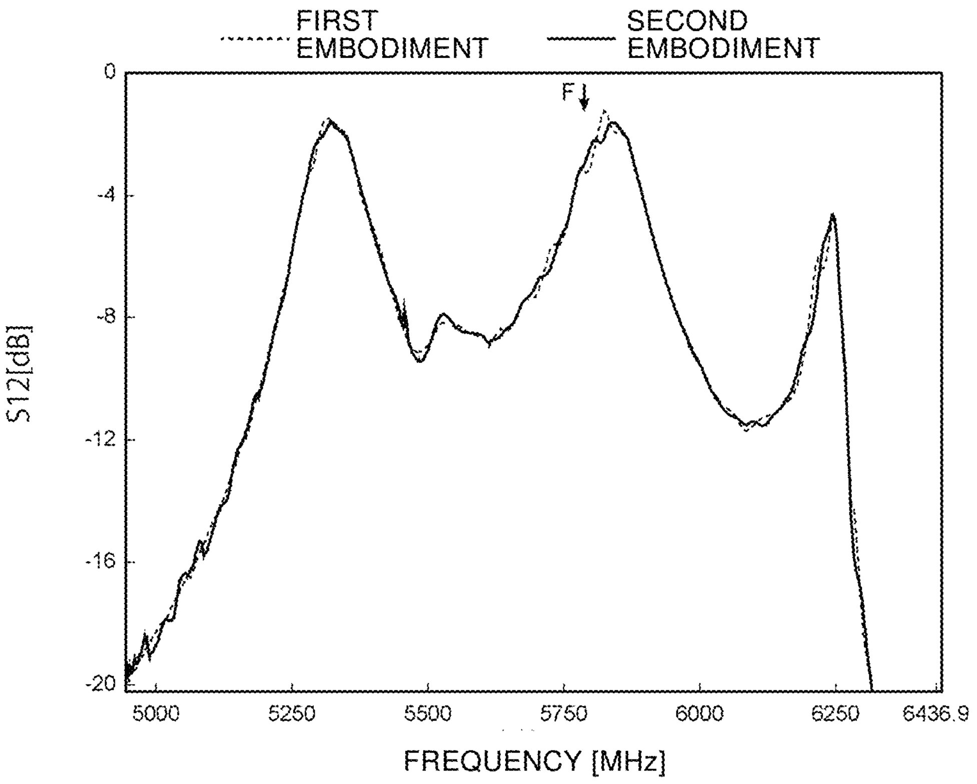
FIG. 9 is a graph illustrating the bandpass characteristics of the first example embodiment and a second example embodiment of the present invention.

FIG. 9 is a graph illustrating the bandpass characteristics of the first example embodiment and the second example embodiment. In FIG. 9, the S12 bandpass characteristics are shown. FIGS. 10 through 12, 15, 19, and 20, which will be discussed later, also show the S12 bandpass characteristics.

As shown in FIG. 9, as in the first example embodiment, the acoustic wave device of the second example embodiment can provide filter characteristics. Additionally, around the frequency indicated by the arrow F in FIG. 9, a ripple caused by unwanted signal components in the second example embodiment becomes smaller than that in the first example embodiment. In this manner, in the second example embodiment, ripples in the frequency characteristics can be reduced. The reason for this is as follows.

In the second example embodiment, the number of electrode fingers of the first acoustic wave resonator 10A and that of the second acoustic wave resonator 10B are different from each other. Because of this configuration, the frequency at which unwanted signal components are generated in the first acoustic wave resonator 10A and that in the second acoustic wave resonator 10B become different from each other. This makes a ripple caused by unwanted signal components smaller in the overall acoustic wave device.

The configuration of the third example embodiment of the present invention will now be described below. In the first example embodiment, the center-to-center distance p1 between adjacent electrode fingers in the first acoustic wave resonator 10A and the center-to-center distance p2 between adjacent electrode fingers in the second acoustic wave resonator 10B are the same or substantially the same. In the third example embodiment, however, the center-to-center distance p1 between adjacent electrode fingers in the first acoustic wave resonator 10A and the center-to-center distance p2 between adjacent electrode fingers in the second acoustic wave resonator 10B are different from each other. Other than this point, the configuration of the acoustic wave device of the third example embodiment is the same as or similar to that of the acoustic wave device 10 of the first example embodiment.

In the present specification, "the center-to-center distance p1 and the center-to-center distance p2 are different from each other" refers to that the absolute value of the difference between the center-to-center distance p1 and the center-to-center distance p2 is, for example, about 1% or greater of each of the center-to-center distance p1 and the center-to-center distance p2. In the present specification, "the center-to-center distances p1 in one first acoustic wave resonator are different from each other" refers to that the absolute value of the difference between the center-to-center distances p1 is, for example, about 1% or greater of each of the center-to-center distances p1. The definition of "the center-to-center distances p2 in one second acoustic wave resonator are different from each other" is the same as or similar to the above-described definition for the center-to-center distances p1. In the third example embodiment, the center-to-center distance p1 is fixed, and the center-to-center distance p2 is also fixed.

The filter characteristics of the first example embodiment and those of the third example embodiment were compared. In the third example embodiment, the design parameters of the base acoustic wave resonator for the first and second acoustic wave resonators 10A and 10B are as follows.

Piezoelectric layer: made of $LiNbO_3$ having the Euler angles (φ, ψ, θ) of (0°, 0°, 90°) and having about a 400-nm thickness First through third electrode fingers: constituted by a Ti layer having about a 10-nm thickness, an AlCu layer having about a 390-nm thickness, and a Ti layer having about a 4-nm thickness in this order as seen from the piezoelectric layer Arrangement order of first through third electrode fingers: repeating a set of IN, GND, OUT, GND (represented by potentials to which the first, third, and second electrode fingers are connected) in this order Duty ratio: about 0.3

In the third example embodiment, the center-to-center distance p1 and the center-to-center distance p2 are as follows.

Center-to-center distance p1 between adjacent electrode fingers of first acoustic wave resonator: about 1.34 μm Center-to-center distance p2 between adjacent electrode fingers of second acoustic wave resonator: about 1.36 μm The design parameters of the base acoustic wave resonator for the first and second acoustic wave resonators 10A and 10B of the first example embodiment were set to be similar to those of the third example embodiment. The center-to-center distance p1 and the center-to-center distance p2 in the first example embodiment are as follows.

Figure 10:
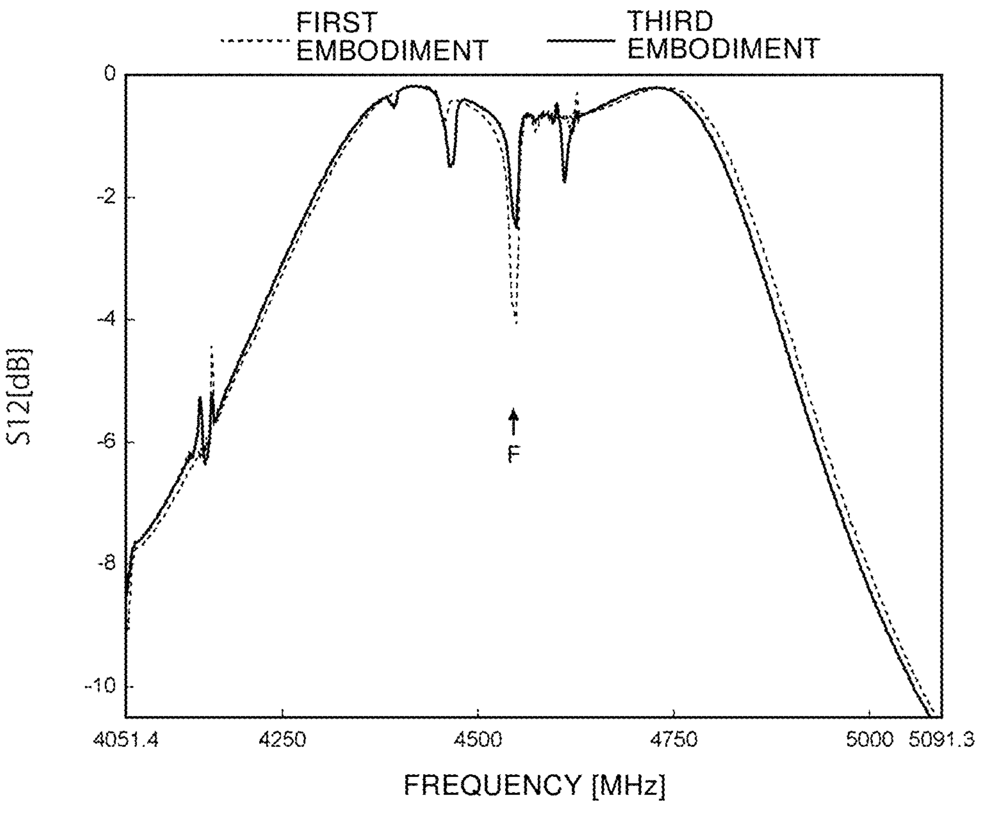
FIG. 10 is a graph illustrating the bandpass characteristics of the first example embodiment and a third example embodiment of the present invention.

Center-to-center distance p1 between adjacent electrode fingers of first acoustic wave resonator: about 1.34 μm Center-to-center distance p2 between adjacent electrode fingers of second acoustic wave resonator: about 1.34 μm FIG. 10 is a graph illustrating the bandpass characteristics of the first example embodiment and the third example embodiment.

As shown in FIG. 10, as in the first example embodiment, the acoustic wave device of the third example embodiment can provide filter characteristics. Additionally, around the frequency indicated by the arrow F in FIG. 10, a ripple caused by unwanted signal components in the third example embodiment becomes smaller than that in the first example embodiment. In this manner, in the third example embodiment, ripples in the frequency characteristics can be reduced.

In the third example embodiment, p1≠p2. Because of this configuration, the frequency at which unwanted signal components are generated in the first acoustic wave resonator 10A and that in the second acoustic wave resonator 10B become different from each other. This can reduce ripples in the frequency characteristics of the acoustic wave device of the third example embodiment.

In the first acoustic wave resonator 10A, the center-to-center distances p1 may be different from each other as long as the above-described distance p in the first acoustic wave resonator 10A is different from the center-to-center distance p2 in the second acoustic wave resonator 10B. As stated above, the distance p in the first acoustic wave resonator 10A is the longest distance among the center-to-center distances p1 between adjacent first and third electrode fingers 25 and 27 and the center-to-center distances p1 between adjacent second and third electrode fingers 26 and 27. If the center-to-center distance p1 is fixed, any of the center-to-center distances p1 is the distance p.

Alternatively, in the second acoustic wave resonator 10B, the center-to-center distances p2 may be different from each other as long as the above-described distance p in the second acoustic wave resonator 10B is different from the center-to-center distance p1 in the first acoustic wave resonator 10A. The center-to-center distances p1 may be different from each other and the center-to-center distances p2 may also be different from each other if the distance p in the first acoustic wave resonator 10A and the distance p in the second acoustic wave resonator 10B are different from each other.

The configuration of the fourth example embodiment of the present invention will now be described below. In the first example embodiment, the duty ratio of the first acoustic wave resonator 10A and that of the second acoustic wave resonator 10B are the same or substantially the same. In the fourth example embodiment, however, the duty ratio of the first acoustic wave resonator 10A and that of the second acoustic wave resonator 10B are different from each other. In the present specification, "the duty ratios are different from each other" refers to that the absolute value of the difference between the duty ratios is, for example, about 0.1 or greater. Other than this point, the configuration of the acoustic wave device of the fourth example embodiment is the same as or similar to that of the acoustic wave device 10 of the first example embodiment.

The filter characteristics of the first example embodiment and those of the fourth example embodiment were compared. In the fourth example embodiment, the design parameters of the base acoustic wave resonator for the first and second acoustic wave resonators 10A and 10B are as follows.

Piezoelectric layer: made of $LiNbO_3$ having the Euler angles (φ, ψ, θ) of (0°, 0°, 90°) and having about a 400-nm thickness First through third electrode fingers: constituted by a Ti layer having about a 10-nm thickness, an AlCu layer having about a 390-nm thickness, and a Ti layer having about a 4-nm thickness in this order as seen from the piezoelectric layer Arrangement order of first through third electrode fingers: repeating a set of IN, GND, OUT, GND (represented by potentials to which the first, third, and second electrode fingers are connected) in this order Center-to-center distance between adjacent electrode fingers: about 1.4 μm In the fourth example embodiment, the duty ratio of the first acoustic wave resonator 10A and that of the second acoustic wave resonator 10B are as follows.

Duty ratio of first acoustic wave resonator:about 0.3

Duty ratio of second acoustic wave resonator:about 0.31

The design parameters of the base acoustic wave resonator for the first and second acoustic wave resonators 10A and 10B of the first example embodiment were set to be similar to those of the fourth example embodiment. The duty ratio of the first acoustic wave resonator 10A and that of the second acoustic wave resonator 10B in the first example embodiment are as follows.

Duty ratio of first acoustic wave resonator:about 0.3

Duty ratio of second acoustic wave resonator:about 0.3

Figure 11:
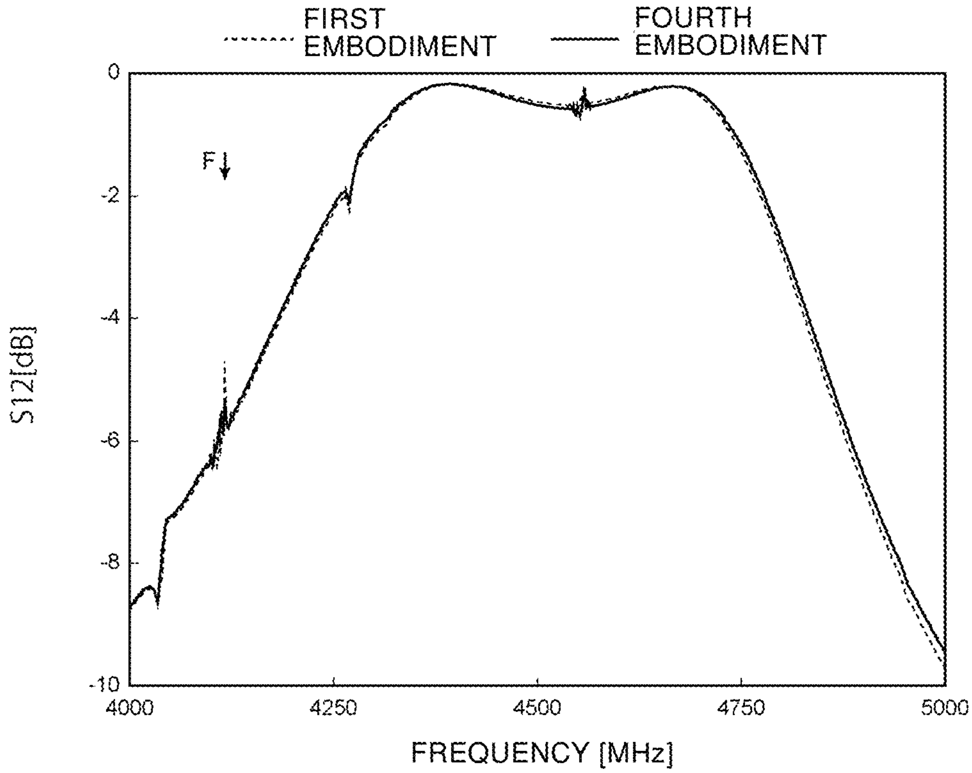
FIG. 11 is a graph illustrating the bandpass characteristics of the first example embodiment and a fourth example embodiment of the present invention.

FIG. 11 is a graph illustrating the bandpass characteristics of the first example embodiment and the fourth example embodiment.

As shown in FIG. 11, as in the first example embodiment, the acoustic wave device of the fourth example embodiment can provide filter characteristics. Additionally, around the frequency indicated by the arrow F in FIG. 11, a ripple caused by unwanted signal components in the fourth example embodiment becomes smaller than that in the first example embodiment. In this manner, in the fourth example embodiment, ripples in the frequency characteristics can be reduced.

In the fourth example embodiment, the duty ratio of the first acoustic wave resonator 10A and that of the second acoustic wave resonator 10B are different from each other. Because of this configuration, the frequency at which unwanted signal components are generated in the first acoustic wave resonator 10A and that in the second acoustic wave resonator 10B become different from each other. This can reduce ripples in the frequency characteristics of the acoustic wave device of the fourth example embodiment.

The configuration of the fifth example embodiment of the present invention will now be described below. In the first example embodiment, the thickness of the first electrode fingers 25, the second electrode fingers 26, and the third electrode fingers 27 of the first acoustic wave resonator 10A and the thickness of the fourth electrode fingers 35, the fifth electrode fingers 36, and the sixth electrode fingers 37 of the second acoustic wave resonator 10B are the same or substantially the same. That is, when the thickness of the first electrode fingers 25, the second electrode fingers 26, and the third electrode fingers 27 is indicated by te1 and when the thickness of the fourth electrode fingers 35, the fifth electrode fingers 36, and the sixth electrode fingers 37 of the second acoustic wave resonator 10B is indicated by te2, te1=te2. In the fifth example embodiment, however, te1≠te2. Other than this point, the configuration of the acoustic wave device of the fifth example embodiment is the same as or similar to that of the acoustic wave device 10 of the first example embodiment.

In the present specification, "the thicknesses of electrode fingers are different from each other" refers to that the absolute value of the difference between the thicknesses of the electrode fingers is, for example, about 18 or greater of each of the thicknesses of the electrode fingers. In the fifth example embodiment, the thicknesses of the first electrode fingers 25, second electrode fingers 26, and third electrode fingers 27 are the same or substantially the same, and the thicknesses of the fourth electrode fingers 35, fifth electrode fingers 36, and sixth electrode fingers 37 are the same or substantially the same.

The filter characteristics of the first example embodiment and those of the fifth example embodiment were compared. In the fifth example embodiment, the design parameters of the base acoustic wave resonator for the first and second acoustic wave resonators 10A and 10B are as follows.

Piezoelectric layer: made of $LiNbO_3$ having the Euler angles (φ, ψ, θ) of (0°, 0° 90°) and having about a 400-nm thickness Arrangement order of first through third electrode fingers: repeating a set of IN, GND, OUT, GND (represented by potentials to which the first, third, and second electrode fingers are connected) in this order The design parameters for the electrode fingers of the first and second acoustic wave resonators 10A and 10B of the fifth example embodiment are as follows.

First through third electrode fingers: constituted by a Ti layer having about a 10-nm thickness, an AlCu layer having about a 390-nm thickness, and a Ti layer having about a 4-nm thickness in this order as seen from the piezoelectric layer and having a total thickness te1 of about 404 nm Fourth through sixth electrode fingers: constituted by a Ti layer having about a 10-nm thickness, an AlCu layer having about a 400-nm thickness, and about a Ti layer having a 4-nm thickness in this order as seen from the piezoelectric layer and having a total thickness te2 of about 414 nm The design parameters of the base acoustic wave resonator for the first and second acoustic wave resonators 10A and 10B of the first example embodiment were set to be similar to those of the fifth example embodiment. The design parameters for the electrode fingers of the first and second acoustic wave resonators 10A and 10B of the first example embodiment are as follows.

Figure 12:
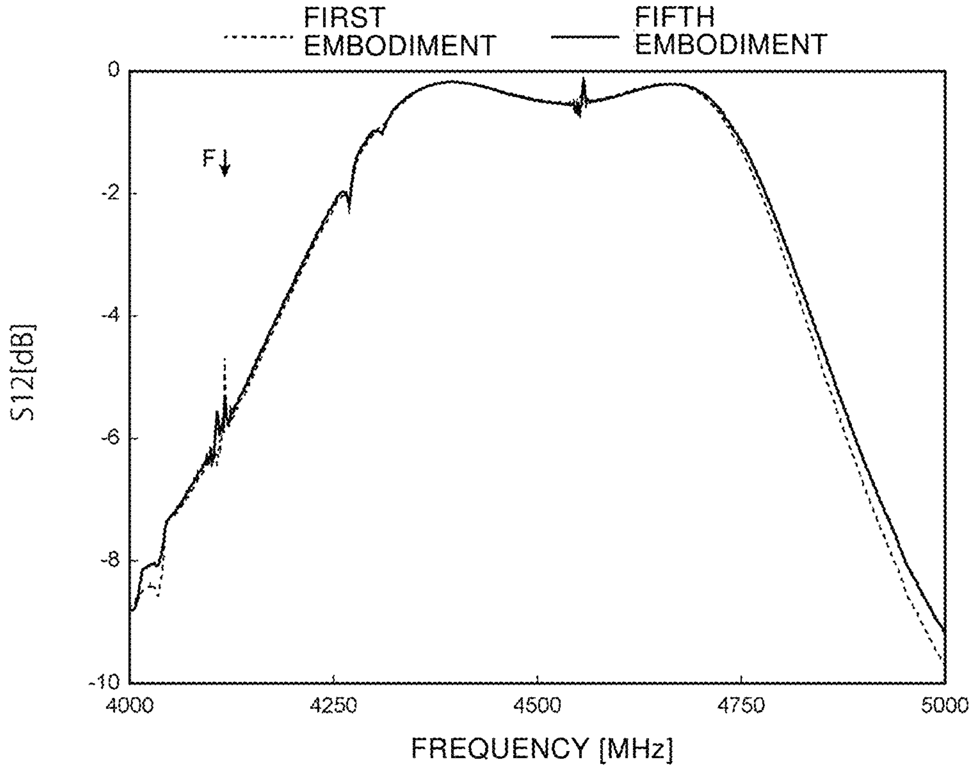
FIG. 12 is a graph illustrating the bandpass characteristics of the first example embodiment and a fifth example embodiment of the present invention.

First through third electrode fingers: constituted by a Ti layer having about a 10-nm thickness, an AlCu layer having about a 390-nm thickness, and a Ti layer having about a 4-nm thickness in this order as seen from the piezoelectric layer and having a total thickness te1 of about 404 nm Fourth through sixth electrode fingers: constituted by a Ti layer having about a 10-nm thickness, an AlCu layer having about a 390-nm thickness, and a Ti layer having about a 4-nm thickness in this order as seen from the piezoelectric layer and having a total thickness te2 of about 404 nm FIG. 12 is a graph illustrating the bandpass characteristics of the first example embodiment and the fifth example embodiment.

As shown in FIG. 12, as in the first example embodiment, the acoustic wave device of the fifth example embodiment can provide filter characteristics. Additionally, around the frequency indicated by the arrow F in FIG. 12, a ripple caused by unwanted signal components in the fifth example embodiment becomes smaller than that in the first example embodiment. In this manner, in the fifth example embodiment, ripples in the frequency characteristics can be reduced.

In the fifth example embodiment, te1≠te2. Because of this configuration, the frequency at which unwanted signal components are generated in the first acoustic wave resonator 10A and that in the second acoustic wave resonator 10B become different from each other. This can reduce ripples in the frequency characteristics of the acoustic wave device of the fifth example embodiment.

The configuration of the sixth example embodiment of the present invention will now be described below. When the gap length of the gap g1 and the gap g2 of the first acoustic wave resonator 10A is indicated by G1 and when the gap length of the gap g4 and the gap g5 of the second acoustic wave resonator 10B is indicated by G2, G1=G2 in the first example embodiment. In the sixth example embodiment, however, G1≠G2. In the present specification, "the gap lengths are different from each other" refers to that the value obtained by dividing the absolute value of the difference of the gap lengths by the electrode finger pitch is, for example, about 0.02 or greater. The electrode finger pitch is the center-to-center distance p1 in the first acoustic wave resonator 10A and is the center-to-center distance p2 in the second acoustic wave resonator 10B. If p1≠p2, the average value of the center-to-center distance p1 and the center-to-center distance p2 is used as the electrode finger pitch. Other than this point, the configuration of the acoustic wave device of the sixth example embodiment is the same as or similar to that of the acoustic wave device 10 of the first example embodiment.

In the sixth example embodiment, the gap length G1 of the gap g1 and the gap length G1 of the gap g2 are the same or substantially the same, while the gap length G2 of the gap g4 and the gap length G2 of the gap g5 are the same or substantially the same.

In the sixth example embodiment, G1≠G2. Because of this configuration, the frequency at which unwanted signal components are generated in the first acoustic wave resonator 10A and this frequency in the second acoustic wave resonator 10B become different from each other. This can reduce ripples caused by unwanted signal components in the frequency characteristics of the acoustic wave device.

The configuration of the seventh example embodiment of the present invention will now be described below. When the width of each electrode finger of the first acoustic wave resonator 10A is indicated by w1 and the width of each electrode finger of the second acoustic wave resonator 10B is indicated by w2, w1=w2 in the first example embodiment. Specifically, the electrode fingers of the first acoustic wave resonator 10A are the first electrode fingers 25, the second electrode fingers 26, and the third electrode fingers 27. Specifically, the electrode fingers of the second acoustic wave resonator 10B are the fourth electrode fingers 35 as the first electrode fingers, the fifth electrode fingers 36 as the second electrode fingers, and the sixth electrode fingers 37 as the third electrode fingers. In the seventh example embodiment, w1≠w2. Other than this point, the configuration of the acoustic wave device of the seventh example embodiment is the same as or similar to that of the acoustic wave device 10 of the first example embodiment.

The width of the electrode finger is the dimension of the electrode finger in the electrode-finger perpendicular direction. In the present specification, "the widths of electrode fingers are different from each other" refers to that the absolute value of the difference between the widths of the electrode fingers is, for example, about 1% or greater of each of the widths of the electrode fingers.

In the seventh example embodiment, w1≠w2. Because of this configuration, the frequency at which unwanted signal components are generated in the first acoustic wave resonator 10A and that in the second acoustic wave resonator 10B become different from each other. This can reduce ripples caused by unwanted signal components in the frequency characteristics of the acoustic wave device.

The configuration of the eighth example embodiment of the present invention will now be described below. When the dimension of the overlapping region E in the electrode-finger extending direction in the first acoustic wave resonator 10A is represented by the overlapping width Ap1 and the dimension of the overlapping region E in the electrode-finger extending direction in the second acoustic wave resonator 10B is represented by the overlapping width Ap2, Ap1=Ap2 in the first example embodiment. In the eighth example embodiment, however, Ap1≠Ap2. In the present specification, "the overlapping widths are different from each other" refers to that the absolute value of the difference between the overlapping widths is, for example, about 1% or greater of each of the overlapping widths. Other than this point, the configuration of the acoustic wave device of the eighth example embodiment is the same as or similar to that of the acoustic wave device 10 of the first example embodiment.

In the eighth example embodiment, Ap1≠Ap2. Because of this configuration, the frequency at which unwanted signal components are generated in the first acoustic wave resonator 10A and that in the second acoustic wave resonator 10B become different from each other. This can reduce ripples caused by unwanted signal components in the frequency characteristics of the acoustic wave device.

In the second through eighth example embodiments, the first acoustic wave resonator and the second acoustic wave resonator are different from each other in one of the multiple parameters. The configuration of each of the second through eighth example embodiments is applicable to other example embodiments. That is, for example, the first acoustic wave resonator and the second acoustic wave resonator may be different from each other in at least one of the following specific parameters: the total number of multiple electrode fingers, the center-to-center distance between adjacent electrode fingers, the duty ratio, the thickness of the electrode finger, the gap length, the width of the electrode finger, and the overlapping width.

Figure 13:
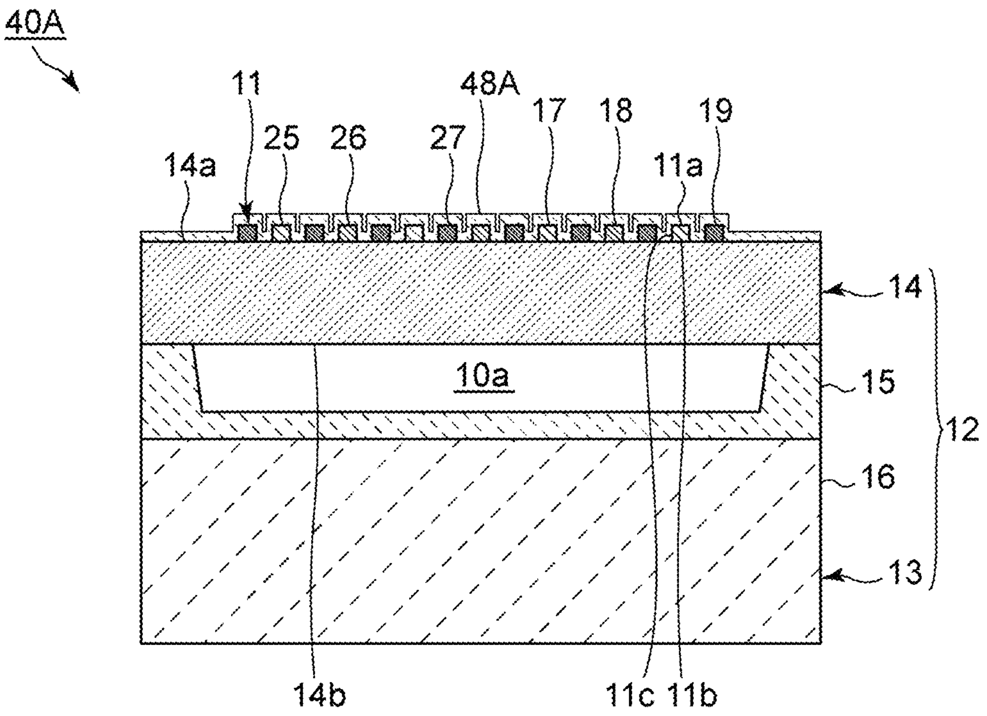
FIG. 13 is a schematic elevational cross-sectional view of a first acoustic wave resonator according to a ninth example embodiment of the present invention.
Figure 14:
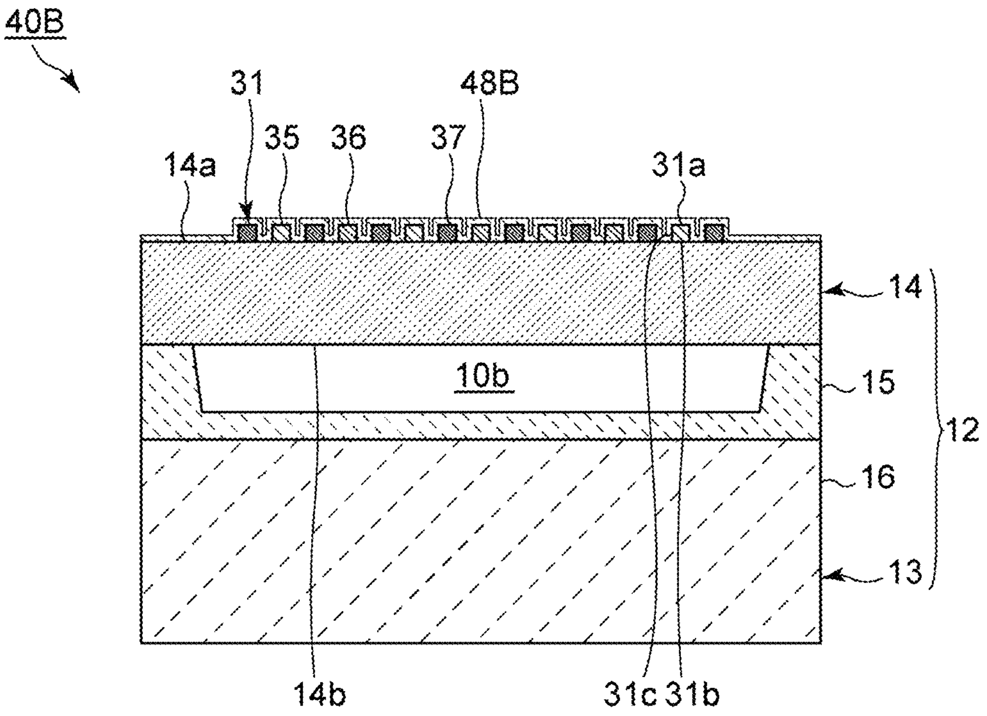
FIG. 14 is a schematic elevational cross-sectional view of a second acoustic wave resonator in the ninth example embodiment of the present invention.

FIG. 13 is a schematic elevational cross-sectional view of the first acoustic wave resonator according to a ninth example embodiment of the present invention. FIG. 14 is a schematic elevational cross-sectional view of the second acoustic wave resonator according to the ninth example embodiment.

As illustrated in FIG. 13, the ninth example embodiment is different from the first example embodiment in that a first acoustic wave resonator 40A includes a dielectric film 48A.

As illustrated in FIG. 14, the ninth example embodiment is different from the first example embodiment also in that a second acoustic wave resonator 40B includes a dielectric film 48B. Other than these points, the configuration of the acoustic wave device of the ninth example embodiment is the same as or similar to that of the acoustic wave device 10 of the first example embodiment.

As shown in FIG. 13, the dielectric film 48A is provided to cover the first electrode fingers 25, the second electrode fingers 26, and the third electrode fingers 27 of the first acoustic wave resonator 40A. As shown in FIG. 14, the dielectric film 48B is provided to cover the fourth electrode fingers 35, the fifth electrode fingers 36, and the sixth electrode fingers 37 of the second acoustic wave resonator 40B.

As illustrated in FIG. 13, each electrode finger of the first acoustic wave resonator 40A includes a first surface 11*a*, a second surface 11*b*, and a side surface 11*c*. The first and second surfaces 11*a* and 11*b* face each other in the thickness direction of the electrode finger. The second surface 11*b* is disposed closer to the piezoelectric layer 14 than the first surface 11*a* is. The side surface 11*c* is connected to the first and second surfaces 11*a* and 11*b*. In the example in FIG. 13, the side surface 11*c* extends in parallel or substantially parallel with a line normal to the second surface 11*b*. The side surface 11*c* may be inclined with respect to a line normal to the second surface 11*b*. The dielectric film 48A covers the first surface 11*a* and the side surface 11*c* of each electrode finger.

Similarly, as illustrated in FIG. 14, each of the fourth electrode fingers 35, the fifth electrode fingers 36, and the sixth electrode fingers 37 of the second acoustic wave resonator 40B includes a first surface 31*a*, a second surface 31*b*, and a side surface 31*c*. The dielectric film 48B covers the first surface 31*a* and the side surface 31*c* of each electrode finger. Each electrode finger in the example embodiments other than the ninth example embodiment also includes a first surface, a second surface, and a side surface.

When the thickness of the dielectric film 48A in the first acoustic wave resonator 40A is indicated by td1 and when the thickness of the dielectric film 48B in the second acoustic wave resonator 40B is indicated by td2, td1≠td2 in the ninth example embodiment. In the present specification, the thickness of the dielectric film is the distance between the first surface of the electrode finger and the front surface of the dielectric film. In the present specification, "the thicknesses of the dielectric films are different from each other" refers to that the absolute value of the difference between the thicknesses of the dielectric films is, for example, about 1% or greater of each of the dielectric films.

In the ninth example embodiment, each of the first and second acoustic wave resonators 40A and 40B is a divided resonator obtained by dividing one acoustic wave resonator in series and is also an acoustic coupling filter. Thus, as in the first example embodiment, using the acoustic wave device for a filter apparatus makes it possible to reduce the size of the filter apparatus and to improve the electric power handling capability.

Additionally, in the ninth example embodiment, td1≠td2. This can reduce ripples caused by unwanted signal components in the frequency characteristics. This advantage will be described below.

The filter characteristics of the first example embodiment and those of the ninth example embodiment were compared. In the ninth example embodiment, the design parameters of the base acoustic wave resonator for the first and second acoustic wave resonators 40A and 40B are as follows.

Piezoelectric layer: made of $LiNbO_3$ having the Euler angles (θ, ψ, θ) of (0°, 0°, 90°) and having about a 400-nm thickness First through third electrode fingers: constituted by a Ti layer having about a 10-nm thickness, an AlCu layer having about a 390-nm thickness, and a Ti layer having about a 4-nm thickness in this order as seen from the piezoelectric layer Arrangement order of first through third electrode fingers: repeating a set of IN, GND, OUT, GND (represented by potentials to which the first, third, and second electrode fingers are connected) in this order.

In the ninth example embodiment, the thickness of the dielectric film of the first acoustic wave resonator 40A and that of the second acoustic wave resonator 40B are as follows.

Thickness td1 of dielectric film of first acoustic wave resonator: about 180 nm Thickness td2 of dielectric film of second acoustic wave resonator: about 178 nm The design parameters of the base acoustic wave resonator for the first and second acoustic wave resonators 10A and 10B of the first example embodiment were set to be similar to those of the ninth example embodiment. In the first example embodiment, td1=td2=0. That is, in the first example embodiment, neither of the first acoustic wave resonator 10A nor the second acoustic wave resonator 10B includes a dielectric film.

Figure 15:
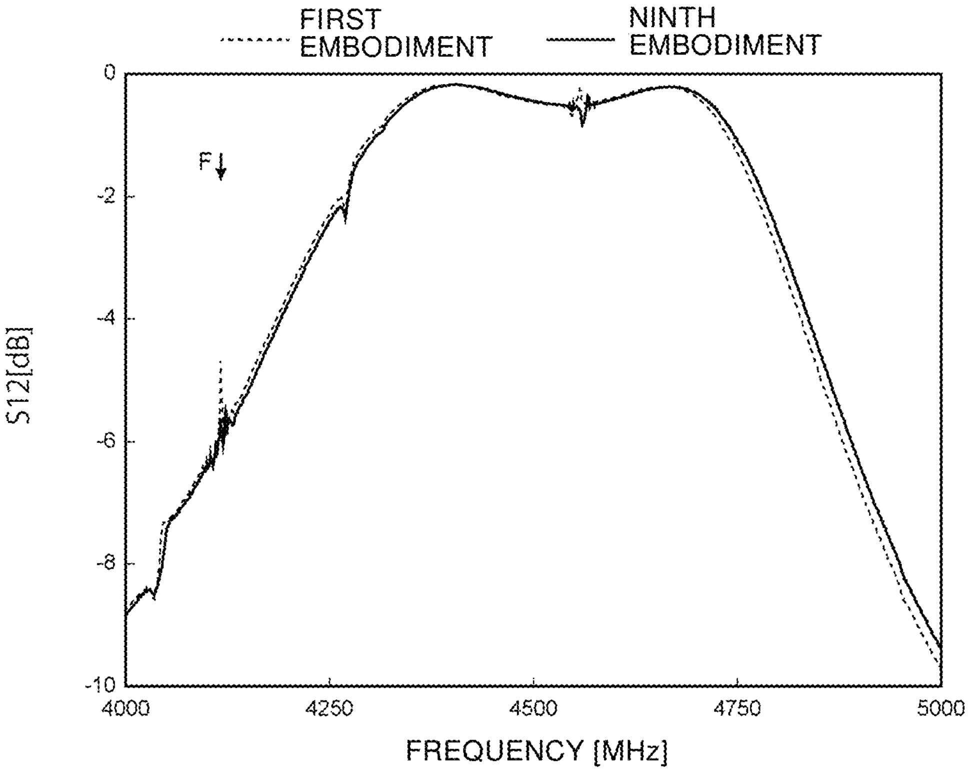
FIG. 15 is a graph illustrating the bandpass characteristics of the first example embodiment and the ninth example embodiment of the present invention.

FIG. 15 is a graph illustrating the bandpass characteristics of the first example embodiment and the ninth example embodiment.

As shown in FIG. 15, as in the first example embodiment, the acoustic wave device of the ninth example embodiment can provide filter characteristics. Additionally, around the frequency indicated by the arrow F in FIG. 15, a ripple caused by unwanted signal components in the ninth example embodiment becomes smaller than that in the first example embodiment. In this manner, in the ninth example embodiment, ripples in the frequency characteristics can be reduced.

In the ninth example embodiment, td1≠td2. Because of this configuration, the frequency at which unwanted signal components are generated in the first acoustic wave resonator 40A and that in the second acoustic wave resonator 40B become different from each other. This can reduce ripples in the frequency characteristics of the acoustic wave device of the ninth example embodiment.

The configuration of the ninth example embodiment, that is, td1≠td2, is also applicable to the configurations of the other example embodiments of the present invention. In example embodiments of the present invention, if both of the first and second acoustic wave resonators include a dielectric film, the thickness of the dielectric film td1 and that of the dielectric film td2 may be equal or substantially equal to each other (td1=td2). However, it is still preferable that td1≠td2. This can reduce ripples in the frequency characteristics of the acoustic wave device, as described above.

Figure 16:
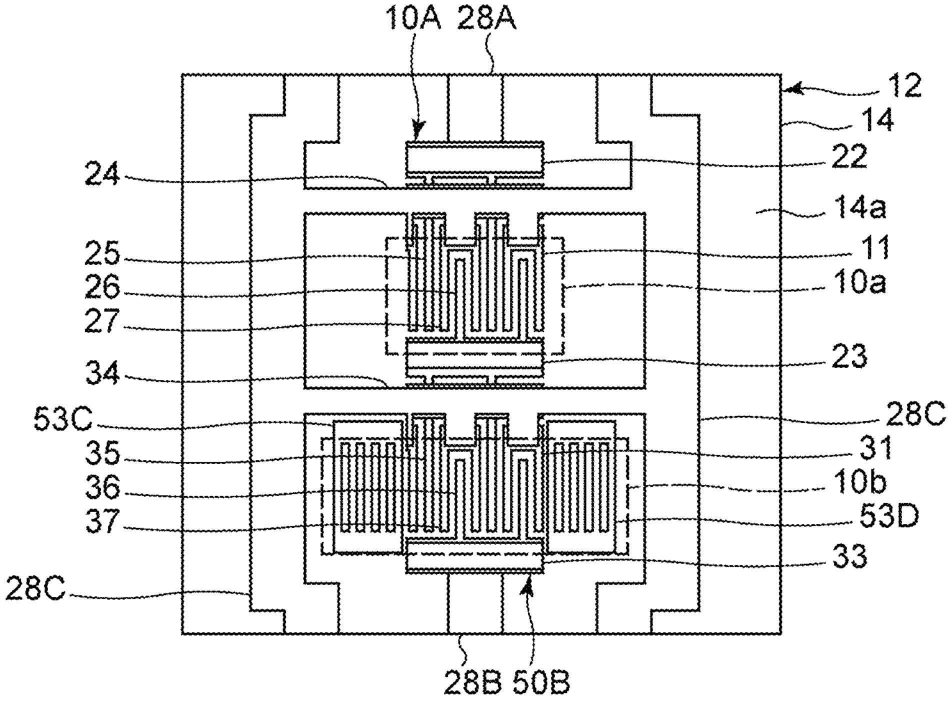
FIG. 16 is a schematic plan view of an acoustic wave device according to a tenth example embodiment of the present invention.
Figure 17:
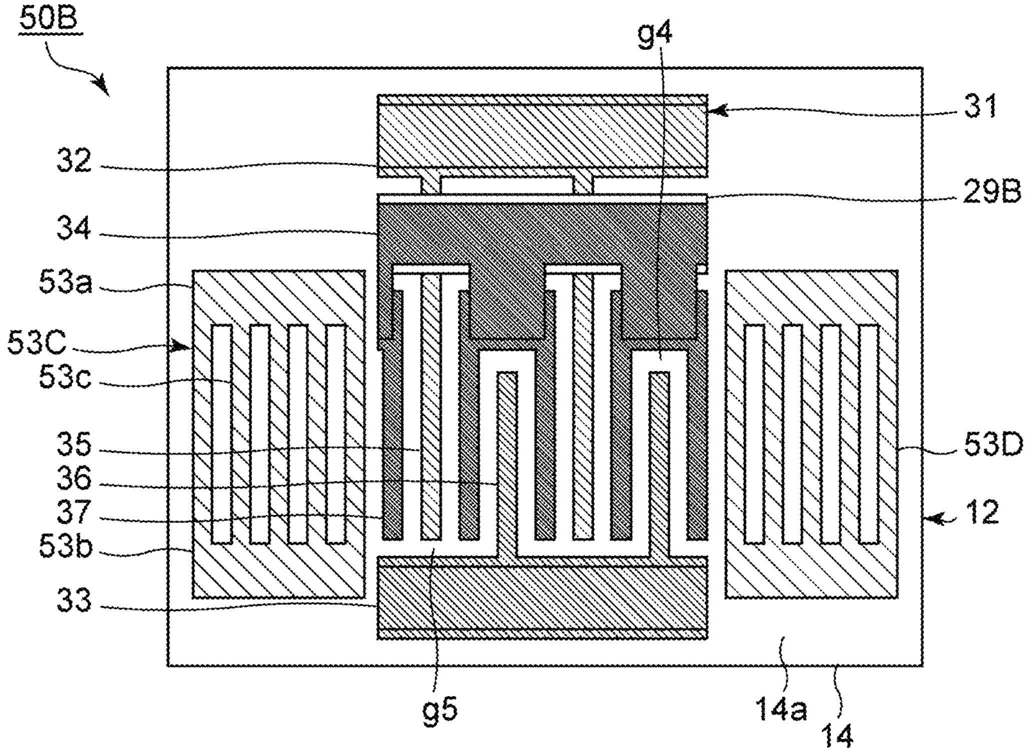
FIG. 17 is a schematic plan view of a second acoustic wave resonator in the tenth example embodiment of the present invention.

FIG. 16 is a schematic plan view of an acoustic wave device according to a tenth example embodiment of the present invention. FIG. 17 is a schematic plan view of a second acoustic wave resonator in the tenth example embodiment. In FIG. 17, the first acoustic wave resonator 10A and wiring and other components connected to a second acoustic wave resonator 50B are not shown.

As illustrated in FIGS. 16 and 17, the tenth example embodiment is different from the first example embodiment in that the second acoustic wave resonator 50B includes a pair of reflectors 53C and 53D. Other than this point, the configuration of the acoustic wave device of the tenth example embodiment is the same as or similar to that of the acoustic wave device 10 of the first example embodiment.

The reflectors 53C and 53D are disposed on the first main surface 14*a* of the piezoelectric layer 14. The reflectors 53C and 53D face each other by sandwiching the region where the fourth electrode fingers 35, the fifth electrode fingers 36, and the sixth electrode fingers 37 are disposed therebetween in the electrode-finger perpendicular direction. The first acoustic wave resonator 10A does not include reflectors.

As shown in FIG. 17, the reflector 53C includes a pair of reflector busbars and multiple reflector electrode fingers 53*c*. Specifically, the pair of reflector busbars include a first reflector busbar 53*a* and a second reflector busbar 53*b*. The first and second reflector busbars 53*a* and 53*b* face each other. One end of each of the reflector electrode fingers 53*c* is connected to the first reflector busbar 53*a*. The other ends of the reflector electrode fingers 53*c* are connected to the second reflector busbar 53*b*. The reflector 53D is configured similarly to the reflector 53C.

In the tenth example embodiment, each of the first and second acoustic wave resonators 10A and 50B is a divided resonator obtained by dividing one acoustic wave resonator in series and is also an acoustic coupling filter. Thus, as in the first example embodiment, using the acoustic wave device for a filter apparatus makes it possible to reduce the size of the filter apparatus and to improve the electric power handling capability.

The first acoustic wave resonator 10A may include a pair of reflectors, while the provision of reflectors for the second acoustic wave resonator 50B may be omitted. In this case, as well, using the acoustic wave device for a filter apparatus makes it possible to reduce the size of the filter apparatus and to improve the electric power handling capability.

Figure 18:
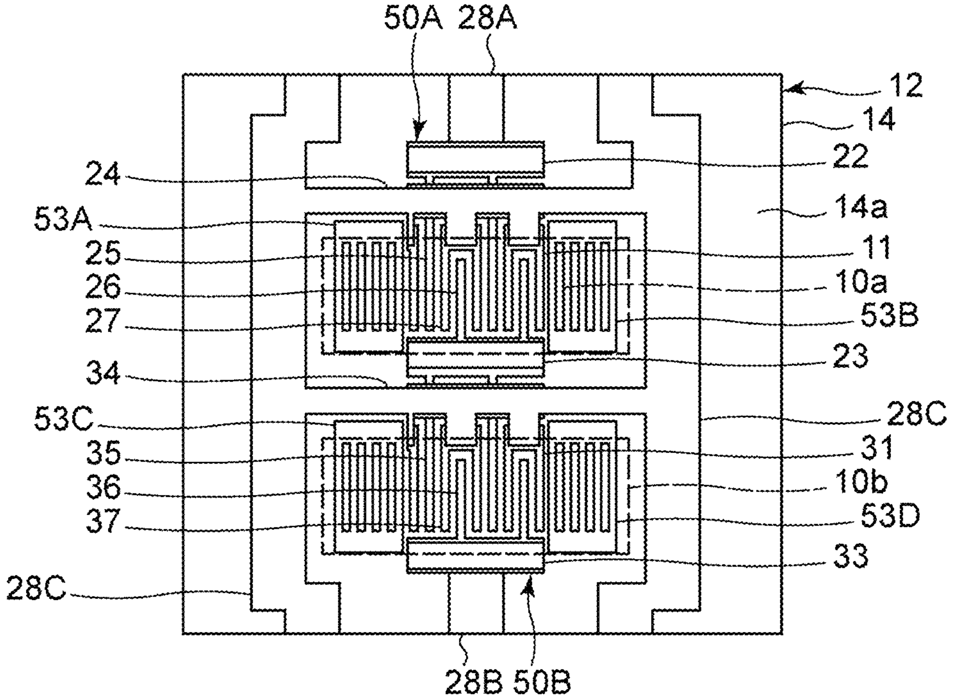
FIG. 18 is a schematic plan view of an acoustic wave device according to a modified example of the tenth example embodiment of the present invention.

In a modified example of the tenth example embodiment shown in FIG. 18, a first acoustic wave resonator 50A includes a pair of reflectors 53A and 53B. The reflectors 53A and 53B face each other by sandwiching the region where the first electrode fingers 25, the second electrode fingers 26, and the third electrode fingers 27 are disposed therebetween in the electrode-finger perpendicular direction. The second acoustic wave resonator 50B includes a pair of reflectors 53C and 53D, as in the tenth example embodiment. The reflectors 53A and 53B of the first acoustic wave resonator 50A are configured similarly to the reflector 53C of the second acoustic wave resonator 50B. In the modified example, as well, using the acoustic wave device for a filter apparatus makes it possible to reduce the size of the filter apparatus and to improve the electric power handling capability.

The filter characteristics of the first example embodiment, the tenth example embodiment, and the modified example of the tenth example embodiment were compared. In the tenth example embodiment, the design parameters of the base acoustic wave resonator for the first and second acoustic wave resonators 10A and 50B are as follows.

Piezoelectric layer: made of $LiNbO_3$ having the Euler angles (θ, ψ, θ) of (0°, 0°, 90°) and having about a 400-nm thickness First through third electrode fingers: constituted by a Ti layer having about a 10-nm thickness, an AlCu layer having about a 390-nm thickness, and a Ti layer having about a 4-nm thickness in this order as seen from the piezoelectric layer.

Arrangement order of first through third electrode fingers: repeating a set of IN, GND, OUT, GND (represented by potentials to which the first, third, and second electrode fingers are connected) in this order.

The design parameters of the first example embodiment and the modified example of the tenth example embodiment were set to be similar to those of the tenth example embodiment. In the first example embodiment, neither of the first acoustic wave resonator 10A nor the second acoustic wave resonator 10B includes reflectors. In contrast, in the modified example of the tenth example embodiment, each of the first and second acoustic wave resonators 50A and 50B includes a pair of reflectors.

Figure 19:
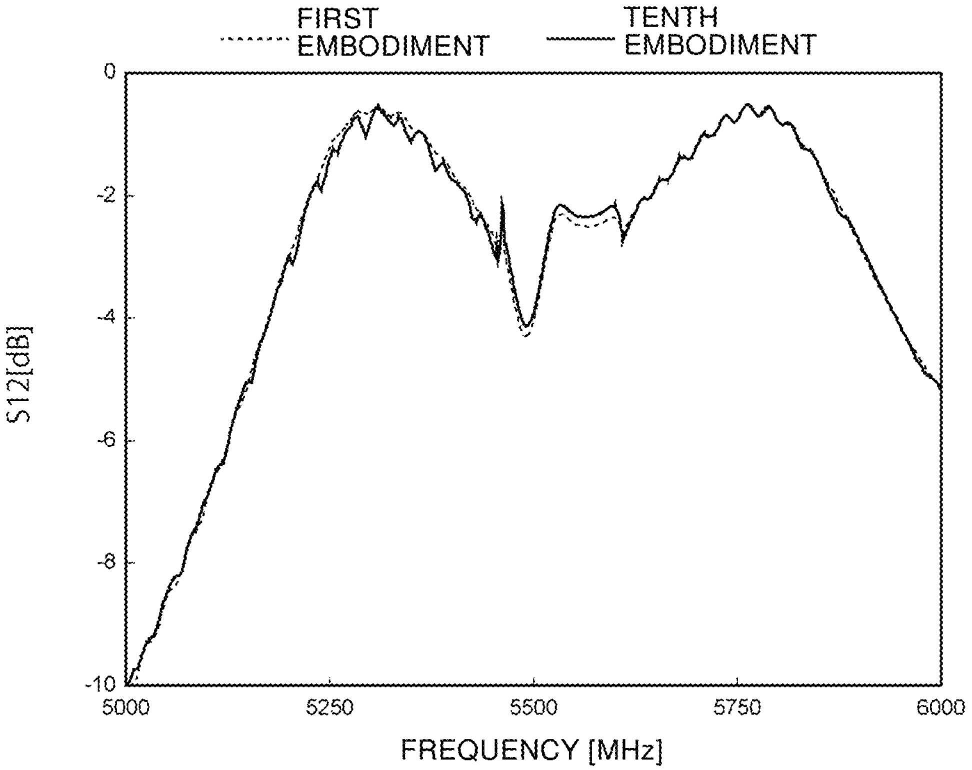
FIG. 19 is a graph illustrating the bandpass characteristics of the first example embodiment and the tenth example embodiment of the present invention.
Figure 20:
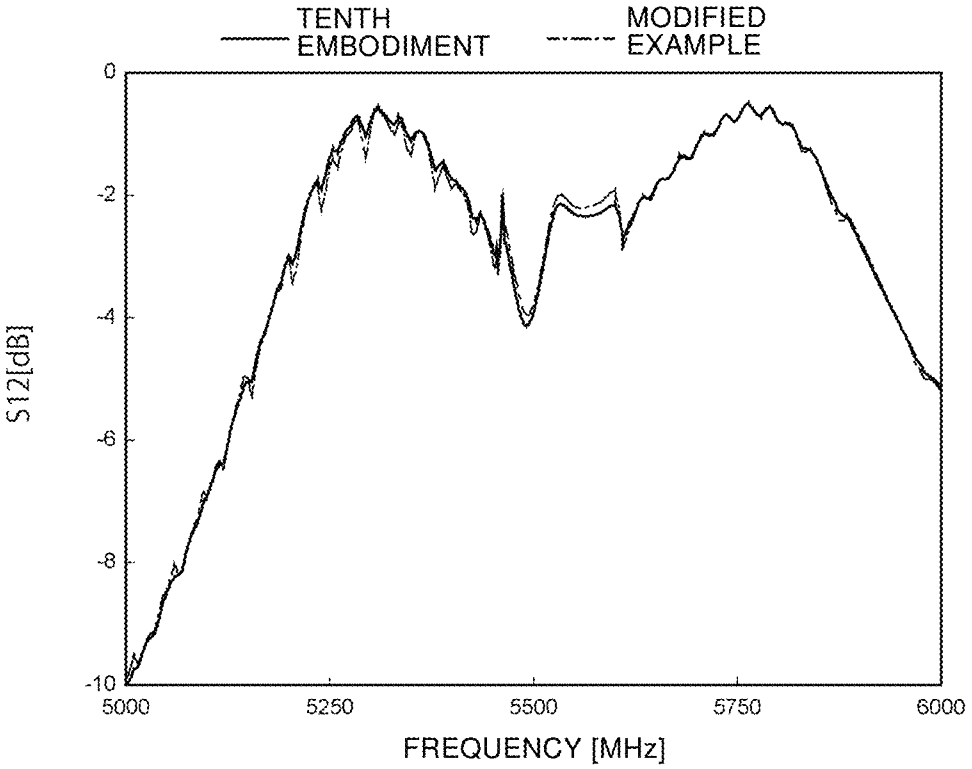
FIG. 20 is a graph illustrating the bandpass characteristics of the tenth example embodiment and the modified example thereof of the present invention.

FIG. 19 is a graph illustrating the bandpass characteristics of the first example embodiment and the tenth example embodiment. FIG. 20 is a graph illustrating the bandpass characteristics of the tenth example embodiment and the modified example thereof.

As shown in FIG. 19, as in the first example embodiment, the acoustic wave device of the tenth example embodiment can provide filter characteristics. Additionally, in the tenth example embodiment, the loss can be decreased around the center of the pass band. In the first example embodiment, without reflectors, the size of the acoustic wave device 10 can be reduced.

As shown in FIG. 20, as in the tenth example embodiment, the acoustic wave device of the modified example of the tenth example embodiment can provide filter characteristics. In the modified example, the loss can be made smaller effectively around the center of the pass band. In the tenth example embodiment, in the lower frequency side of the pass band, ripples caused by unwanted signal components become smaller than those in the modified example.

In the example embodiments of the present invention other than the tenth example embodiment and the modified example thereof, as well, at least one of the first and second acoustic wave resonators may include a pair of reflectors. It is preferable that one of the first and second acoustic wave resonators includes a pair of reflectors. This can reduce ripples on the lower frequency side of the pass band, as in the tenth example embodiment, and also decrease the loss around the center of the pass band.

In example embodiments of the present invention, the first and second acoustic wave resonators may be able to utilize a Lamb wave. In this case, as in the modified example of the tenth example embodiment shown in FIG. 18, each of the first and second acoustic wave resonators includes a pair of reflectors.

Figure 21:
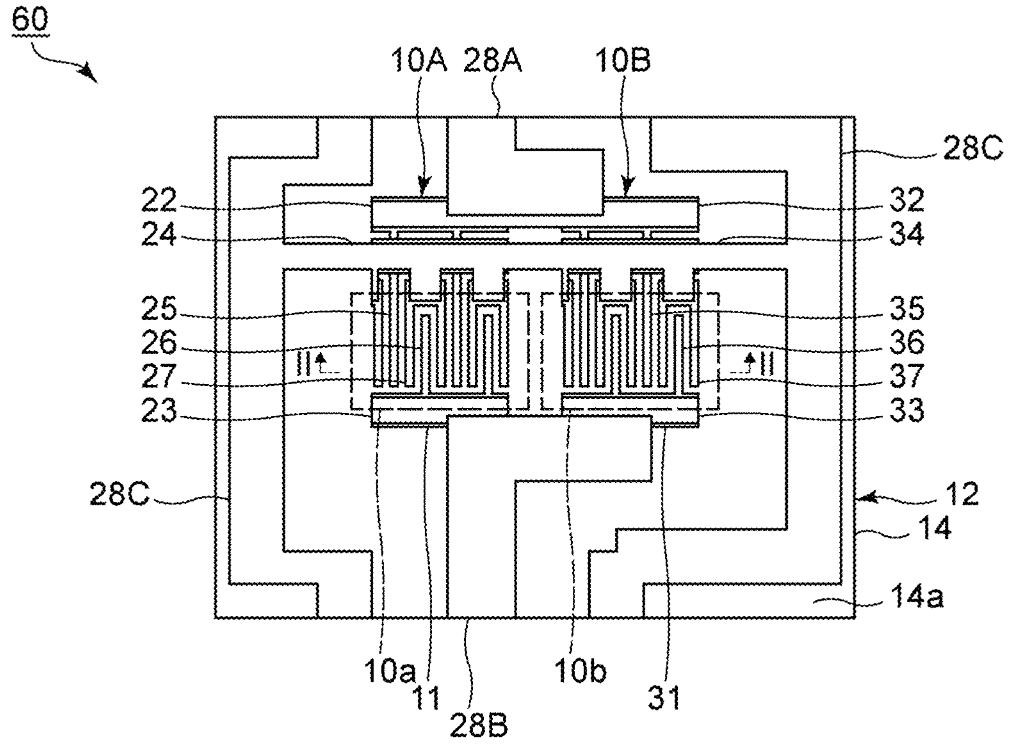
FIG. 21 is a schematic plan view of an acoustic wave device according to an eleventh example embodiment of the present invention.

FIG. 21 is a schematic plan view of an acoustic wave device according to an eleventh example embodiment of the present invention.

The eleventh example embodiment is different from the first example embodiment in that one acoustic wave resonator is divided in parallel. In the eleventh example embodiment, each of the first and second acoustic wave resonators 10A and 10B is a divided resonator obtained by dividing one acoustic wave resonator in parallel. Other than this point, the configuration of an acoustic wave device 60 of the eleventh example embodiment is the same as or similar to that of the acoustic wave device 10 of the first example embodiment.

The first and second acoustic wave resonators 10A and 10B are acoustic coupling filters, as in the first example embodiment. A filter waveform can be obtained from each of the first and second acoustic wave resonators 10A and 10B. Using the acoustic wave device 60 for a filter apparatus makes it possible to obtain a suitable filter waveform even with a small number of acoustic wave resonators which define the filter apparatus. This can reduce the size of the filter apparatus.

Additionally, since the first and second acoustic wave resonators 10A and 10B are parallel-divided resonators, a larger heat dissipation path can be ensured, compared with when one acoustic wave resonator is used. Thus, when the acoustic wave device is in operation, the temperatures of the first and second acoustic wave resonators 10A and 10B do not become excessively high. This makes it less likely to break the first and second acoustic wave resonators 10A and 10B. As a result, the electric power handling capability can be improved.

The configuration of the eleventh example embodiment will be described below in greater detail.

A first signal potential line 28A, a second signal potential line 28B, and a reference potential line 28C are provided on the first main surface 14*a* of the piezoelectric layer 14. The first signal potential line 28A is connected to the input potential. The second signal potential line 28B is connected to the output potential. The reference potential line 28C is connected to the reference potential.

A first busbar 22 of the first acoustic wave resonator 10A and a fourth busbar 32 of the second acoustic wave resonator 10B are connected to the same first signal potential line 28A. The first and second acoustic wave resonators 10A and 10B are connected to the same input potential via the first signal potential line 28A.

A second busbar 23 of the first acoustic wave resonator 10A and a fifth busbar 33 of the second acoustic wave resonator 10B are connected to the same second signal potential line 28B. The first and second acoustic wave resonators 10A and 10B are connected to the same output potential via the second signal potential line 28B. In this manner, the first and second acoustic wave resonators 10A and 10B are connected in parallel with each other.

In the eleventh example embodiment, a third busbar 24 of the first acoustic wave resonator 10A and a sixth busbar 34 of the second acoustic wave resonator 10B are integrally provided. The third and sixth busbars 24 and 34 are connected to the same reference potential via the reference potential line 28C. With this configuration, the wiring can be simplified, thus effectively reducing the size of a filter apparatus using the acoustic wave device 60. It is not necessary that the third and sixth busbars 24 and 34 are integrally provided.

The first acoustic wave resonator 10A and the second acoustic wave resonator 10B are arranged side by side in the electrode-finger perpendicular direction. However, the first and second acoustic wave resonators 10A and 10B may be arranged differently if they are connected in parallel with each other.

Figure 22:
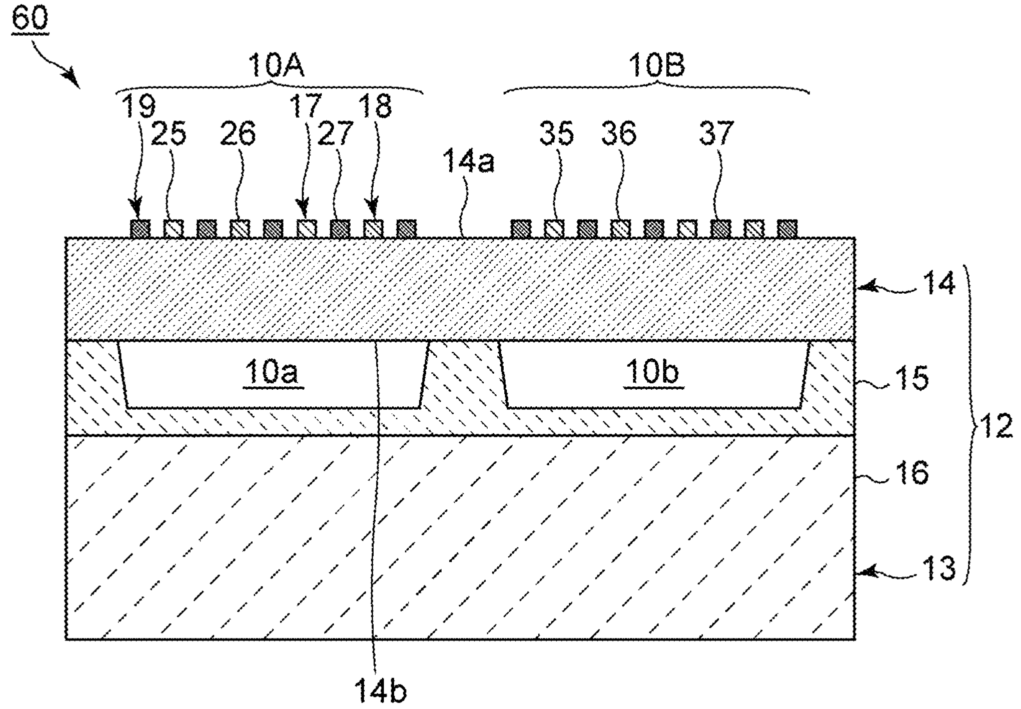
FIG. 22 is a schematic sectional view taken along line II-II in FIG. 21.

FIG. 22 is a schematic sectional view taken along line II-II in FIG. 21.

Cavities 10*a* and 10*b* are individually provided in the piezoelectric substrate 12. In a plan view, the first electrode fingers 25, the second electrode fingers 26, and the third electrode fingers 27 of the first acoustic wave resonator 10A at least partially match the cavity 10*a*. In a plan view, the fourth electrode fingers 35 as the first electrode fingers, the fifth electrode fingers 36 as the second electrode fingers, and the sixth electrode fingers 37 as the third electrode fingers of the second acoustic wave resonator 10B at least partially match the cavity 10*b*.

The cavities 10*a* and 10*b* may be integrally provided. The first and second acoustic wave resonators 10A and 10B may share the same cavity.

In the eleventh example embodiment, each of the first and second acoustic wave resonators 10A and 10B is a divided resonator obtained by dividing one acoustic wave resonator in parallel. In this case, as well as in the second through eighth example embodiments, the first acoustic wave resonator 10A and the second acoustic wave resonator 10B may be different from each other in at least one of the following specific parameters: the total number of multiple electrode fingers, the center-to-center distance between adjacent electrode fingers, the duty ratio, the thickness of the electrode finger, the gap length, the width of the electrode finger, and the overlapping width. This can reduce ripples caused by unwanted signal components in the frequency characteristics of the acoustic wave device 60.

As in the ninth example embodiment, the first and second acoustic wave resonators 10A and 10B may include a dielectric film. In this case, the thickness td1 of the dielectric film in the first acoustic wave resonator 10A and the thickness td2 of the dielectric film in the second acoustic wave resonator 10B are preferably different from each other, that is, td1≠td2. This can reduce ripples caused by unwanted signal components in the frequency characteristics of the acoustic wave device 60.

As in the tenth example embodiment or the modified example thereof, at least one of the first and second acoustic wave resonators 10A and 10B may include a pair of reflectors. It is preferable that one of the first and second acoustic wave resonators 10A and 10B includes a pair of reflectors. This can reduce ripples on the lower frequency side of the pass band and also decrease the loss around the center of the pass band.

The third electrode 19 of the first acoustic wave resonator 10A and the sixth electrode of the second acoustic wave resonator 10B may be configured in a meandering shape, as in the modified example of the first example embodiment. In this case, each of the first and second acoustic wave resonators 10A and 10B may be a divided resonator obtained by dividing one acoustic wave resonator in parallel.

Figure 23:
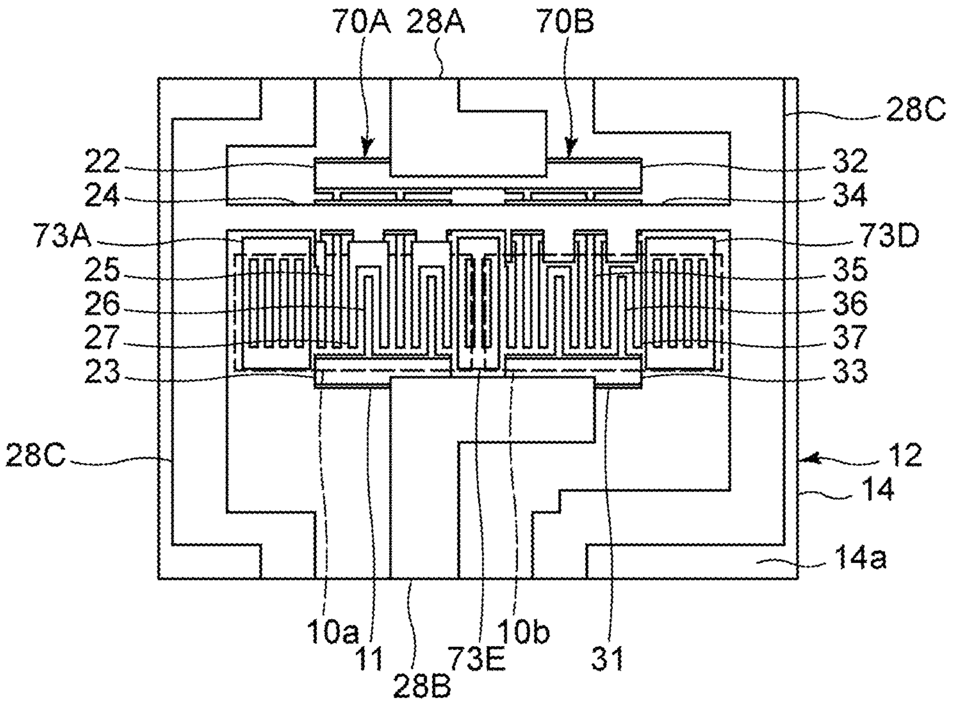
FIG. 23 is a schematic plan view of an acoustic wave device according to a twelfth example embodiment of the present invention.

FIG. 23 is a schematic plan view of an acoustic wave device according to a twelfth example embodiment of the present invention.

The twelfth example embodiment is different from the eleventh example embodiment in that first and second acoustic wave resonators 70A and 70B include reflectors. Other than this point, the configuration of the acoustic wave device of the twelfth example embodiment is the same as or similar to that of the acoustic wave device 60 of the eleventh example embodiment. As shown in FIG. 23, the first acoustic wave resonator 70A and the second acoustic wave resonator 70B are arranged side by side in the electrode-finger perpendicular direction.

The first acoustic wave resonator 70A includes a first reflector 73A. The second acoustic wave resonator 70B includes a second reflector 73D. The first and second acoustic wave resonators 70A and 70B share a third reflector 73E. The first, second, and third reflectors 73A, 73D, and 73E are disposed on the first main surface 14*a* of the piezoelectric layer 14.

The third reflector 73E is provided between a region where multiple electrode fingers of the first acoustic wave resonator 70A are disposed and a region where multiple electrode fingers of the second acoustic wave resonator 70B are disposed. Specifically, the region where multiple electrode fingers of the first acoustic wave resonator 70A are disposed is the region where the first electrode fingers 25, the second electrode fingers 26, and the third electrode fingers 27 are disposed. Specifically, the region where multiple electrode fingers of the second acoustic wave resonator 70B are disposed is the region where the fourth electrode fingers 35 as the first electrode fingers, the fifth electrode fingers 36 as the second electrode fingers, and the sixth electrode fingers 37 as the third electrode fingers are disposed.

The first and third reflectors 73A and 73E face each other by sandwiching the region where the electrode fingers of the first acoustic wave resonator 70A are disposed therebetween in the electrode-finger perpendicular direction. The second and third reflectors 73D and 73E face each other by sandwiching the region where the electrode fingers of the second acoustic wave resonator 70B are disposed in therebetween the electrode-finger perpendicular direction.

The first reflector 73A is configured similarly to the reflector 53A in the tenth example embodiment. More specifically, the first reflector 73A includes a first reflector busbar, a second reflector busbar, and multiple reflector electrode fingers. The second reflector 73D and the third reflector 73E are configured similarly to the first reflector 73A.

In the twelfth example embodiment, the first, second, and third reflectors 73A, 73D, and 73E can decrease the loss within the pass band. Additionally, the first and second acoustic wave resonators 70A and 70B share the third reflector 73E, thus reducing the size of the acoustic wave device.

Each of the first and second acoustic wave resonators 70A and 70B is a divided resonator obtained by dividing one acoustic wave resonator in parallel and is also an acoustic coupling filter. Thus, as in the eleventh example embodiment, using the acoustic wave device for a filter apparatus makes it possible to reduce the size of the filter apparatus and to improve the electric power handling capability.

As illustrated in FIG. 23, cavities 10*a* and 10*b* are individually provided. However, the cavities 10*a* and 10*b* may be integrally provided. The first and second acoustic wave resonators 70A and 70B may share the same cavity. In this case, all of the reflector electrode fingers of the third reflector 73E can more positively match the cavity in a plan view. It is thus possible to further improve the resonance characteristics of the first and second acoustic wave resonators 70A and 70B.

Figure 24:
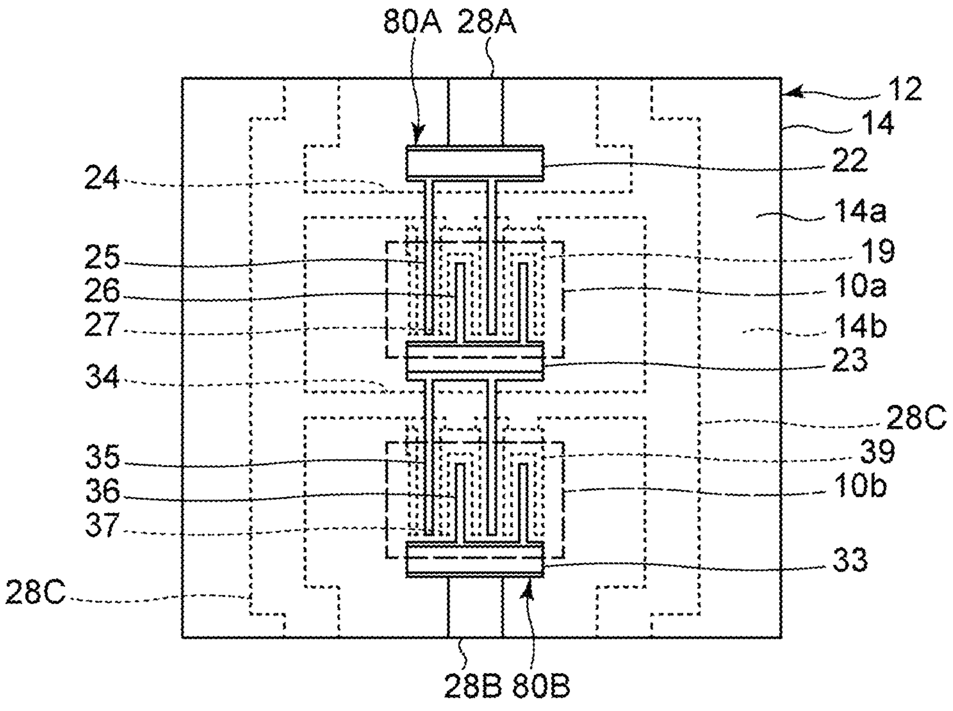
FIG. 24 is a schematic plan view of an acoustic wave device according to a thirteenth example embodiment of the present invention.
Figure 25:
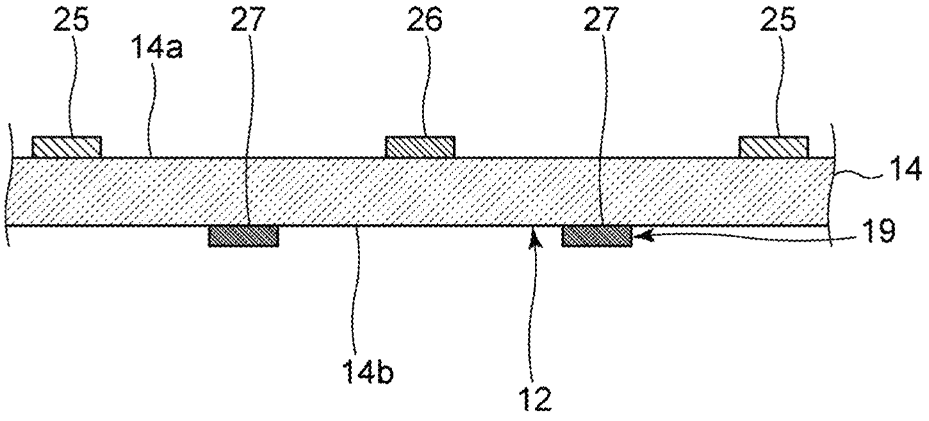
FIG. 25 is a schematic elevational cross-sectional view illustrating first, second, and third electrode fingers and the vicinities thereof of a first acoustic wave resonator in the thirteenth example embodiment of the present invention.

FIG. 24 is a schematic plan view of an acoustic wave device according to a thirteenth example embodiment of the present invention. FIG. 25 is a schematic elevational cross-sectional view illustrating first, second, and third electrode fingers and the vicinities thereof of the first acoustic wave resonator in the thirteenth example embodiment.

As illustrated in FIGS. 24 and 25, the thirteenth example embodiment is different from the first example embodiment in that a third electrode 19 of a first acoustic wave resonator 80A is disposed on the second main surface 14*b* of the piezoelectric layer 14. As illustrated in FIG. 24, the thirteenth example embodiment is different from the first example embodiment also in that a sixth electrode 39 of a second acoustic wave resonator 80B is disposed on the second main surface 14*b* of the piezoelectric layer 14. The thirteenth example embodiment is different from the first example embodiment also in that the reference potential line 28C is disposed on the second main surface 14*b* of the piezoelectric layer 14. Other than these points, the configuration of the acoustic wave device of the thirteenth example embodiment is the same as or similar to that of the acoustic wave device 10 of the first example embodiment.

The arrangement of the third electrode 19 of the first acoustic wave resonator 80A in a plan view is similar to that of the third electrode 19 of the first acoustic wave resonator 10A of the first example embodiment. More specifically, in the first acoustic wave resonator 80A, in a plan view, multiple third electrode fingers 27 are disposed on the second main surface 14*b* of the piezoelectric layer 14 so that they are arranged side by side with the first and second electrode fingers 25 and 26 in the arranging direction of the first and second electrode fingers 25 and 26. In a plan view, the arrangement order of the multiple electrode fingers is the order in which a set of the first electrode finger 25, the third electrode finger 27, the second electrode finger 26, and the third electrode finger 27 is repeated as one period if the arrangement order is started by the first electrode finger 25.

The arrangement of the sixth electrode 39 of the second acoustic wave resonator 80B in a plan view is similar to that of the sixth electrode 39 of the second acoustic wave resonator 10B of the first example embodiment. More specifically, in the second acoustic wave resonator 80B, in a plan view, multiple sixth electrode fingers 37 are disposed on the second main surface 14*b* of the piezoelectric layer 14 so that they are arranged side by side with the fourth and fifth electrode fingers 35 and 36 in the arranging direction of the fourth and fifth electrode fingers 35 and 36. In a plan view, the arrangement order of the multiple electrode fingers is the order in which a set of the fourth electrode finger 35, the sixth electrode finger 37, the fifth electrode finger 36, and the sixth electrode finger 37 is repeated as one period if the arrangement order is started by the fourth electrode finger 35.

The reference potential line 28C is disposed on the second main surface 14*b* of the piezoelectric layer 14. The third busbar 24 of the third electrode 19 of the first acoustic wave resonator 80A is connected to the reference potential line 28C. The sixth busbar 34 of the sixth electrode 39 of the second acoustic wave resonator 80B is connected to the reference potential line 28C.

Each of the first and second acoustic wave resonators 80A and 80B is a divided resonator obtained by dividing one acoustic wave resonator in series and is also an acoustic coupling filter. Thus, as in the first example embodiment, using the acoustic wave device for a filter apparatus makes it possible to reduce the size of the filter apparatus and to improve the electric power handling capability.

Each of the first and second acoustic wave resonators 80A and 80B may be a divided resonator obtained by dividing one acoustic wave resonator in parallel. In this case, as in other example embodiments including the eleventh example embodiment, using the acoustic wave device for a filter apparatus makes it possible to reduce the size of the filter apparatus and to improve the electric power handling capability.

Details of the thickness shear mode will be discussed below through illustration of an example in which a functional electrode is an IDT electrode. "Electrode" of an IDT electrode discussed below corresponds to an electrode finger. The acoustic wave device in the following example is one acoustic wave resonator. The support in the following example corresponds to the support substrate. Hereinafter, the reference potential may also be referred to as a ground potential.

Figure 26A:
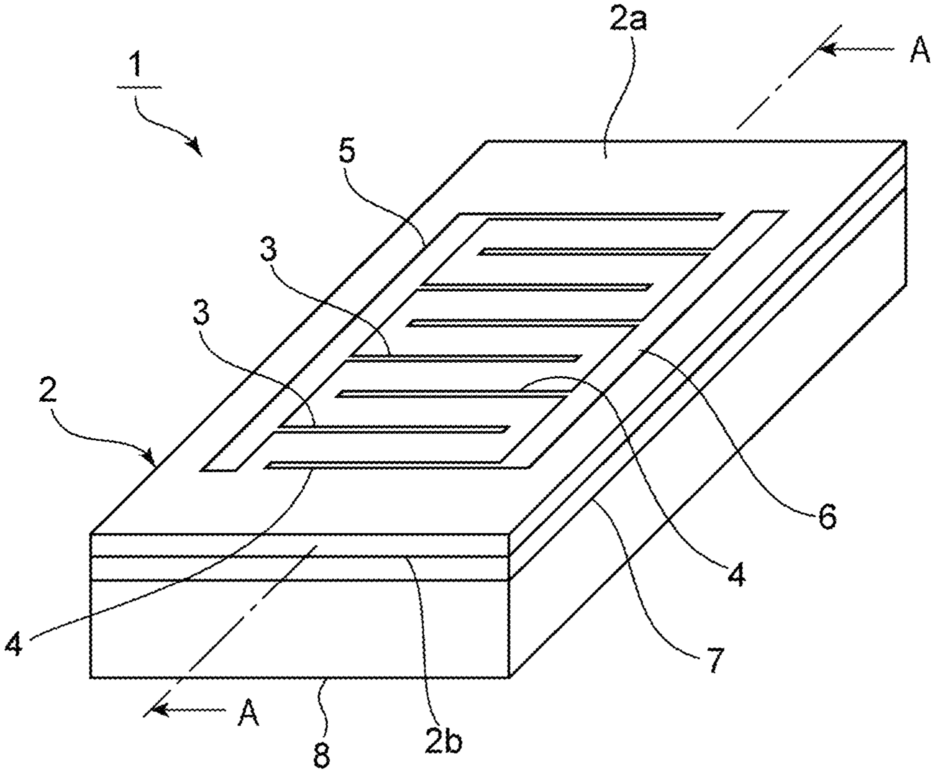
FIG. 26A is a schematic perspective view illustrating the external appearance of an acoustic wave device utilizing a bulk wave of the thickness shear mode.
Figure 26B:
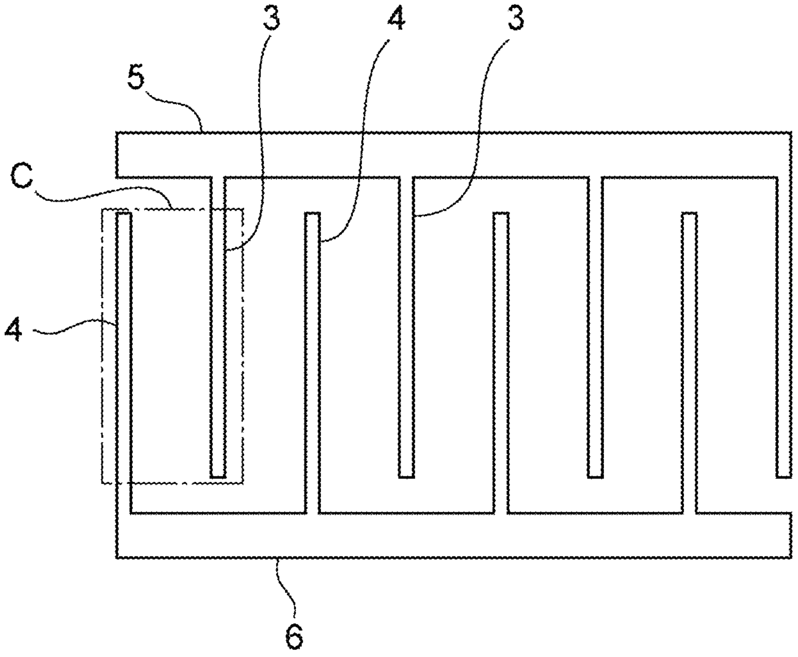
FIG. 26B is a plan view of the electrode structure on a piezoelectric layer.
Figure 27:
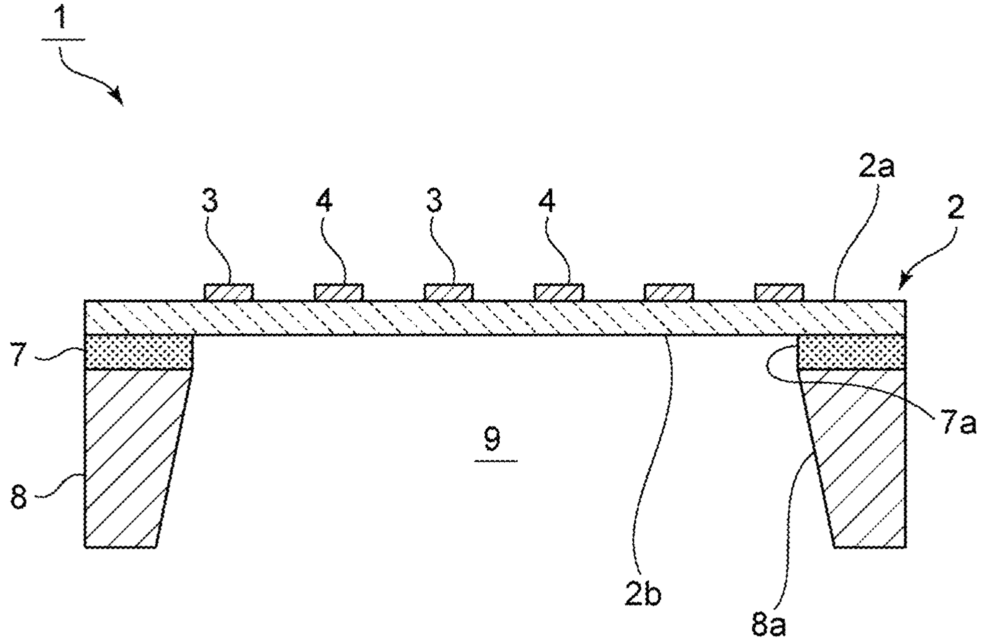
FIG. 27 is a sectional view taken along line A-A in FIG. 26A.

FIG. 26A is a schematic perspective view illustrating the external appearance of an acoustic wave device utilizing a bulk wave of the thickness shear mode. FIG. 26B is a plan view of the electrode structure on a piezoelectric layer. FIG. 27 is a sectional view taken along line A-A in FIG. 26A.

An acoustic wave device 1 includes a piezoelectric layer 2 made of $LiNbO_3$, for example. The piezoelectric layer 2 may alternatively be made of $LiTaO_3$, for example. The cut-angles of $LiNbO_3$ or $LiTaO_3$ are Z-cut, but may be rotated Y-cut or X-cut. The thickness of the piezoelectric layer 2 is not limited to a particular value, but is, for example, preferably about 40 nm to about 1000 nm, and more preferably, about 50 nm to about 1000 nm, to effectively excite the thickness shear mode. The piezoelectric layer 2 includes first and second main surfaces 2*a* and 2*b* facing each other in the Z direction. On the first main surface 2*a*, electrodes 3 and 4 are provided. The electrode 3 is an example of a "first electrode", while the electrode 4 is an example of a "second electrode". In FIG. 26A and FIG. 26B, the multiple electrodes 3 are connected to a first busbar 5, while the multiple electrodes 4 are connected to a second busbar 6. The electrodes 3 and the electrodes 4 are interdigitated with each other. The electrodes 3 and 4 have a rectangular or substantially rectangular shape and a longitudinal direction. An electrode 3 and an adjacent electrode 4 face each other in a direction perpendicular or substantially perpendicular to this longitudinal direction. The longitudinal direction of the electrodes 3 and 4 and the direction perpendicular or substantially perpendicular to the longitudinal direction of the electrodes 3 and 4 are both directions intersecting with the thickness direction of the piezoelectric layer 2. It can thus be said that an electrode 3 and an adjacent electrode 4 face each other in a direction intersecting with the thickness direction of the piezoelectric layer 2. The electrodes 3 and 4 may extend in a direction perpendicular or substantially perpendicular to the longitudinal direction of the electrodes 3 and 4 shown in FIGS. 26A and 26B. That is, the electrodes 3 and 4 may extend in the extending direction of the first busbar 5 and the second busbar 6 shown in FIGS. 26A and 26B. In this case, the first busbar 5 and the second busbar 6 extend in the extending direction of the electrodes 3 and 4 shown in FIGS. 26A and 26B. Multiple pairs of electrodes 3 and electrodes 4, each pair including an electrode 3, which is connected to one potential, and an electrode 4, which is connected to the other potential, adjacent to each other, are arranged in the direction perpendicular or substantially perpendicular to the longitudinal direction of the electrodes 3 and 4. "Electrodes 3 and 4 adjacent to each other" refers to, not that the electrodes 3 and 4 are disposed to directly contact each other, but that the electrodes 3 and 4 are disposed with a space therebetween. When electrodes 3 and 4 are adjacent to each other, an electrode connected to a hot electrode and an electrode connected to a ground electrode, including the other electrodes 3 and 4, are not disposed between the adjacent electrodes 3 and 4. The number of pairs of adjacent electrodes 3 and 4 is not necessarily an integral number and may be 1.5 or 2.5, for example. The center-to-center distance, that is, the pitch, between the electrodes 3 and 4 is, for example, preferably about 1 μm to about 10 μm. The width of each of the electrodes 3 and 4, that is, the dimension in the facing direction of the electrodes 3 and 4, is, for example, preferably about 50 nm to about 1000 nm, and more preferably, about 150 nm to about 1000 nm. The center-to-center distance between the electrodes 3 and 4 is a distance from the center of a dimension (width) of the electrode 3 in the direction perpendicular or substantially perpendicular to the longitudinal direction of the electrode 3 to that of the electrode 4 in the direction perpendicular or substantially perpendicular to the longitudinal direction of the electrode 4.

Since a Z-cut piezoelectric layer is used for the acoustic wave device 1, the direction perpendicular or substantially perpendicular to the longitudinal direction of the electrodes 3 and 4 is a direction perpendicular or substantially perpendicular to the polarization direction of the piezoelectric layer 2. However, this is not the case if a piezoelectric body of another cut angle is used as the piezoelectric layer 2. "Being perpendicular" does not necessarily mean being exactly perpendicular, but may mean being substantially perpendicular. For example, the angle between the direction perpendicular to the longitudinal direction of the electrodes 3 and 4 and the polarization direction may be in a range of, for example, about 90°±10°.

A support 8 is stacked under the second main surface 2*b* of the piezoelectric layer 2 with an insulating layer 7 interposed therebetween. The insulating layer 7 and the support 8 have a frame shape and include through-holes 7*a* and 8*a*, respectively, as shown in FIG. 27. With this structure, a cavity 9 is provided. The cavity 9 is provided so that the insulating layer 7 and the support 8 do not interfere with the vibration in the excitation region C of the piezoelectric layer 2. Thus, the support 8 is stacked under the second main surface 2*b* with the insulating layer 7 therebetween and is located at a position at which the support 8 does not overlap a region where at least one pair of electrodes 3 and 4 is disposed. The insulating layer 7 may be omitted. The support 8 may be stacked directly or indirectly under the second main surface 2*b* of the piezoelectric layer 2.

The insulating layer 7 is made of silicon oxide, for example. Instead of silicon oxide, another suitable insulating material, such as, for example, silicon oxynitride or alumina, may be used to form the insulating layer 7. The support 8 is made of Si, for example. The plane orientation of Si on the side of the piezoelectric layer 2 may be (100), (110), or (111). Preferably, for example, high-resistivity Si, such as Si having a resistivity of about 4 kΩcm or higher, is used. A suitable insulating material or semiconductor material may be used for the support 8.

Examples of the material for the support 8 are piezoelectric materials, such as aluminum oxide, lithium tantalate, lithium niobate, and quartz, various ceramic materials, such as alumina, magnesia, sapphire, silicon nitride, aluminum nitride, silicon carbide, zirconia, cordierite, mullite, steatite, and forsterite, dielectric materials, such as diamond and glass, and semiconductor materials, such as gallium nitride.

The above-described multiple electrodes 3 and 4 and first and second busbars 5 and 6 are made of a suitable metal or alloy, such as, for example, Al or an AlCu alloy. In the acoustic wave device 1, the electrodes 3 and 4 and the first and second busbars 5 and 6 include, for example, an Al film stacked on a Ti film. A contact layer made of a material other than Ti may be used.

To drive the acoustic wave device 1, an AC voltage is applied between the multiple electrodes 3 and the multiple electrodes 4. More specifically, an AC voltage is applied to between the first busbar 5 and the second busbar 6. With the application of the AC voltage, resonance characteristics based on a bulk wave of the thickness shear mode excited in the piezoelectric layer 2 can be exhibited. In the acoustic wave device 1, for example, d/p is set to be about 0.5 or smaller, where d is the thickness of the piezoelectric layer 2 and p is the center-to-center distance between adjacent electrodes 3 and 4 forming one of multiple pairs of electrodes 3 and 4. This can effectively excite a bulk wave of the thickness shear mode and obtain high resonance characteristics. More preferably, for example, d/p is about 0.24 or smaller, in which case, even higher resonance characteristics can be obtained.

The acoustic wave device 1 is configured as described above. Thus, even if the number of pairs of the electrodes 3 and 4 is reduced to miniaturize the acoustic wave device 1, the Q factor is unlikely to be decreased. The reason for this is that, even if the number of electrode fingers of reflectors on both sides is reduced, only a small propagation loss occurs. The reason why the number of the above-described electrode fingers can be reduced is that a bulk wave of the thickness shear mode is utilized. The difference between a Lamb wave utilized in an acoustic wave device and a bulk wave of the above-described thickness shear mode will be discussed below with reference to FIGS. 28A and 28B.

Figure 28A:
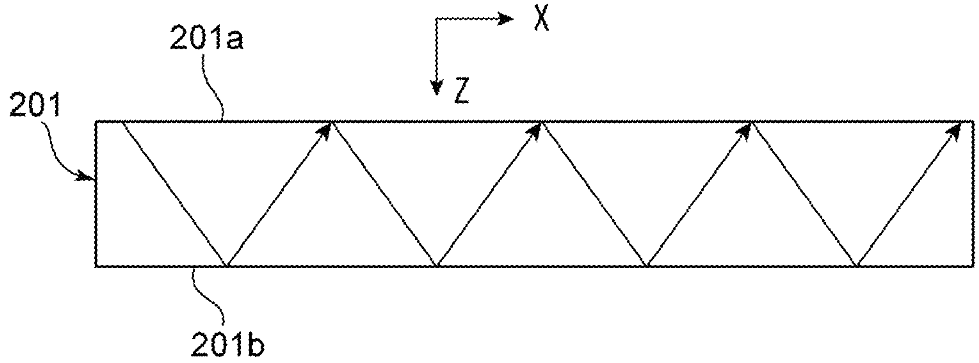
FIG. 28A is a schematic elevational cross-sectional view for explaining a Lamb wave propagating through a piezoelectric film of an acoustic wave device.

FIG. 28A is a schematic elevational cross-sectional view for explaining a Lamb wave propagating through a piezoelectric film of an acoustic wave device, such as that disclosed in Japanese Unexamined Patent Application Publication No. 2012-257019. A wave propagates through a piezoelectric film 201 as indicated by the arrows. A first main surface 201*a* and a second main surface 201*b* of the piezoelectric film 201 face each other, and the thickness direction in which the first main surface 201*a* and the second main surface 201*b* are connected with each other is the Z direction. The X direction is a direction in which the electrode fingers of an IDT electrode are arranged. As illustrated in FIG. 28A, a Lamb wave propagates in the X direction. Because of the characteristics of a Lamb wave, while the piezoelectric film 201 is entirely vibrated, the Lamb wave propagates in the X direction, and thus, reflectors are disposed on both sides to obtain resonance characteristics. Because of these characteristics, a propagation loss occurs in the wave. If the size of the acoustic wave device is reduced, that is, if the number of pairs of electrodes is reduced, the Q factor is reduced.

Figure 28B:
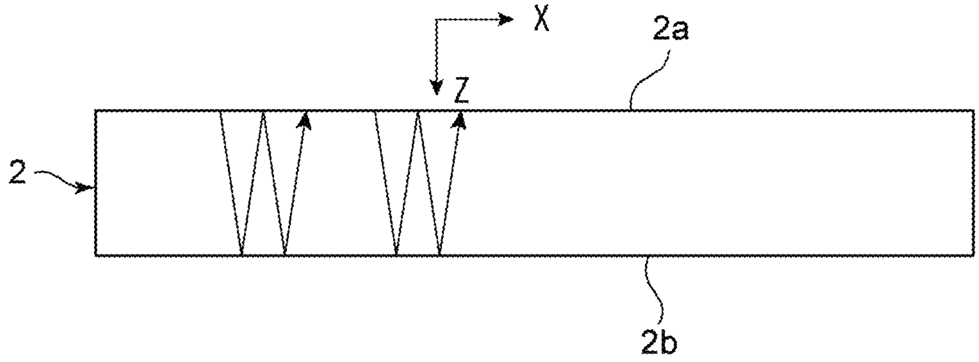
FIG. 28B is a schematic elevational cross-sectional view for explaining a bulk wave of the thickness shear mode propagating through a piezoelectric film of an acoustic wave device.

In contrast, as illustrated in FIG. 28B, in the acoustic wave device 1, since the vibration displacement direction is the thickness shear direction, a wave propagates and resonates substantially in a direction in which the first main surface 2*a* and the second main surface 2*b* of the piezoelectric layer 2 are connected with each other, namely, substantially in the Z direction. That is, the X-direction components of the wave are much smaller than the Z-direction components. The resonance characteristics are obtained as a result of the wave propagating in the Z direction. Thus, even with a reduced number of electrode fingers of a reflector, a propagation loss is unlikely to occur. Additionally, even if the number of pairs of the electrodes 3 and 4 is reduced to miniaturize the acoustic wave device, the Q factor is unlikely to be reduced.

Figure 29:
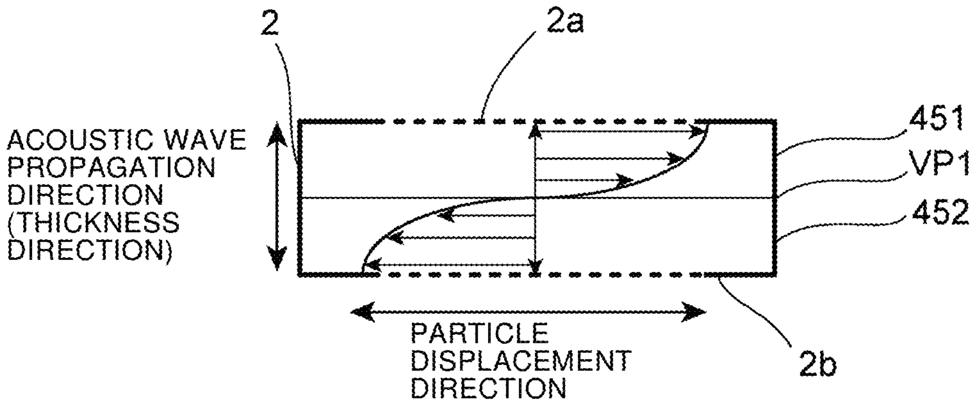
FIG. 29 is a diagram illustrating the amplitude direction of a bulk wave of the thickness shear mode.

Regarding the amplitude direction of a bulk wave of the thickness shear mode, as shown in FIG. 29, the amplitude direction in a first region 451 included in the excitation region C of the piezoelectric layer 2 and that in a second region 452 included in the excitation region C are opposite directions. In FIG. 29, a bulk wave generated when a voltage is applied to between the electrodes 3 and 4 so that the potential of the electrode 4 becomes higher than that of the electrode 3 is schematically illustrated. The first region 451, which is a portion of the excitation region C, is a region between a virtual plane VP1 and the first main surface 2*a*. The virtual plane VP1 is a plane in a direction perpendicular or substantially perpendicular to the thickness direction of the piezoelectric layer 2 and divides the piezoelectric layer 2 into two regions. The second region 452, which is a portion of the excitation region C, is a region between the virtual plane VP1 and the second main surface 2*b*.

As described above, in the acoustic wave device 1, at least one pair of electrodes including electrodes 3 and 4 is provided. Since a wave does not propagate in the X direction, it is not necessary that multiple pairs of electrodes including electrodes 3 and 4 are provided. That is, the at least one pair of electrodes is sufficient.

In one example, the electrode 3 is an electrode connected to a hot potential, while the electrode 4 is an electrode connected to a ground potential. Conversely, the electrode 3 may be connected to a ground potential, while the electrode 4 may be connected to a hot potential. In the acoustic wave device 1, as described above, at least one pair of electrodes is connected to a hot potential and a ground potential, and more specifically, one electrode defining this pair is an electrode connected to a hot potential, and the other electrode is an electrode connected to a ground potential. No floating electrode is provided.

Figure 30:
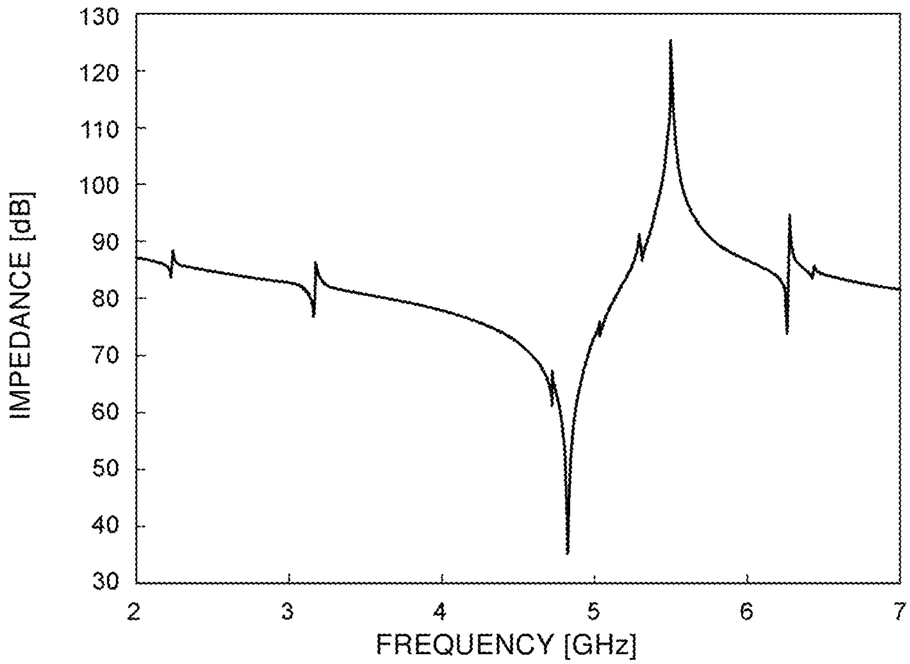
FIG. 30 is a graph illustrating the resonance characteristics of the acoustic wave device utilizing a bulk wave of the thickness shear mode.

FIG. 30 is a graph illustrating an example of the resonance characteristics of the acoustic wave device shown in FIG. 27. The design parameters of the acoustic wave device 1 that has obtained the resonance characteristics shown in FIG. 27 are as follows.

Piezoelectric layer 2: $LiNbO_3$ having the Euler angles of (0°, 0°, 90°) and having about a 400-nm thickness Region where the electrodes 3 and 4 overlap each other as seen from the direction perpendicular to the longitudinal direction of the electrodes 3 and 4, that is, the length of excitation region C: about 40 μm Number of pairs of electrodes constituted by electrodes 3 and 4: 21

Center-to-center distance between electrodes 3 and 4: about 3 μm

Width of electrodes 3 and 4: about 500 nm d/p: about 0.133

Insulating layer 7: silicon oxide film having about a 1-μm thickness

Support 8: Si

The length of the excitation region C is a dimension of the excitation region C in the longitudinal direction of the electrodes 3 and 4.

In the acoustic wave device 1, the distance between the electrodes of an electrode pair including electrodes 3 and 4 was set to be equal or substantially equal among multiple pairs. That is, the electrodes 3 and 4 were disposed at equal or substantially equal pitches.

As is seen from FIG. 30, despite that no reflectors being provided, high resonance characteristics having a fractional bandwidth of about 12.5% are obtained.

In the acoustic wave device 1, as stated above, for example, d/p is about 0.5 or smaller, and more preferably, about 0.24 or smaller, where d is the thickness of the piezoelectric layer 2 and p is the center-to-center distance between the electrodes 3 and 4. This will be explained below with reference to FIG. 31.

Figure 31:
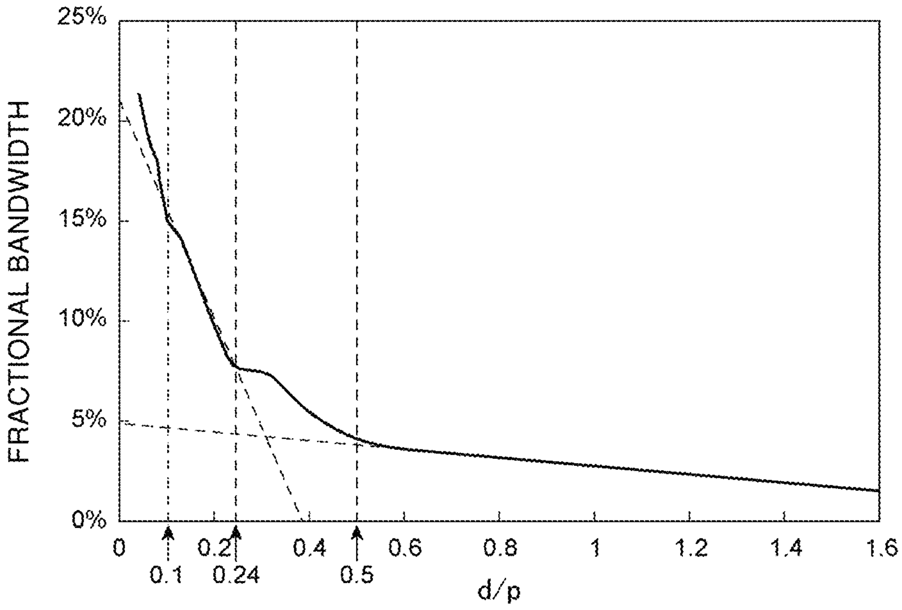
FIG. 31 is a graph illustrating the relationship between d/p, where d is the thickness of a piezoelectric layer and p is the center-to-center distance between adjacent electrodes, and the fractional bandwidth of an acoustic wave device as a resonator.

Multiple acoustic wave devices were made in a manner similar to the acoustic wave device which has obtained the resonance characteristics shown in FIG. 30, except that d/p was varied among these multiple acoustic wave devices. FIG. 31 is a graph illustrating the relationship between d/p and the fractional bandwidth of the acoustic wave device as a resonator.

As seen from FIG. 31, when d/p>about 0.5, the fractional bandwidth remains less than about 5% even if d/p is changed. In contrast, when d/p≤about 0.5, the fractional bandwidth can be improved to about 5% or higher as long as d/p is changed in this range. It is thus possible to provide a resonator having a high coupling factor. When d/p is about 0.24 or smaller, the fractional bandwidth can be improved to about 7% or higher. Additionally, if d/p is adjusted in this range, a resonator having an even higher fractional bandwidth can be obtained. It is thus possible to provide a resonator having an even higher coupling factor. Thus, it has been confirmed that, as a result of setting d/p to be about 0.5 or smaller, a resonator utilizing a bulk wave of the thickness shear mode and having a high coupling factor can be provided.

Figure 32:
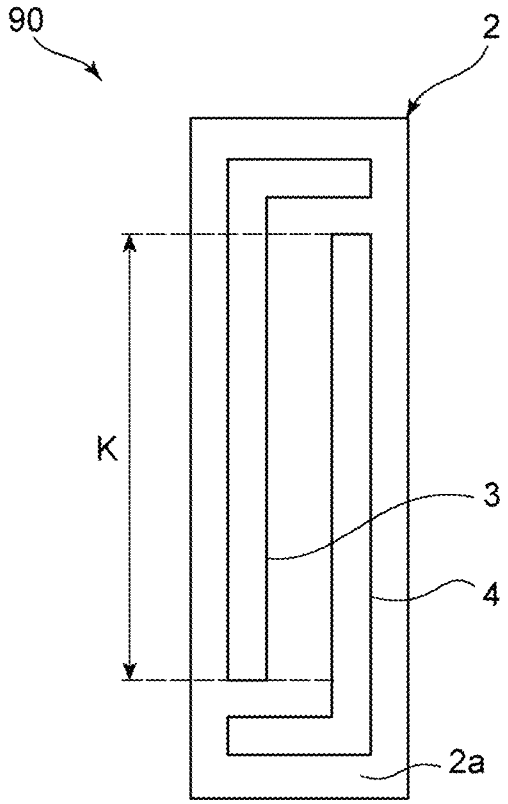
FIG. 32 is a plan view illustrating an acoustic wave device utilizing a bulk wave of the thickness shear mode.

FIG. 32 is a plan view of an acoustic wave device utilizing a bulk wave of the thickness shear mode. In an acoustic wave device 90, a pair of electrodes including electrodes 3 and 4 is provided on the first main surface 2*a* of the piezoelectric layer 2. K in FIG. 32 indicates the overlapping width of the electrodes 3 and 4. As stated above, in acoustic wave devices according to example embodiments of the present invention, only one pair of electrodes may be provided. Even in this case, a bulk wave of the thickness shear mode can be effectively excited if d/p is about 0.5 or smaller.

Figure 33:
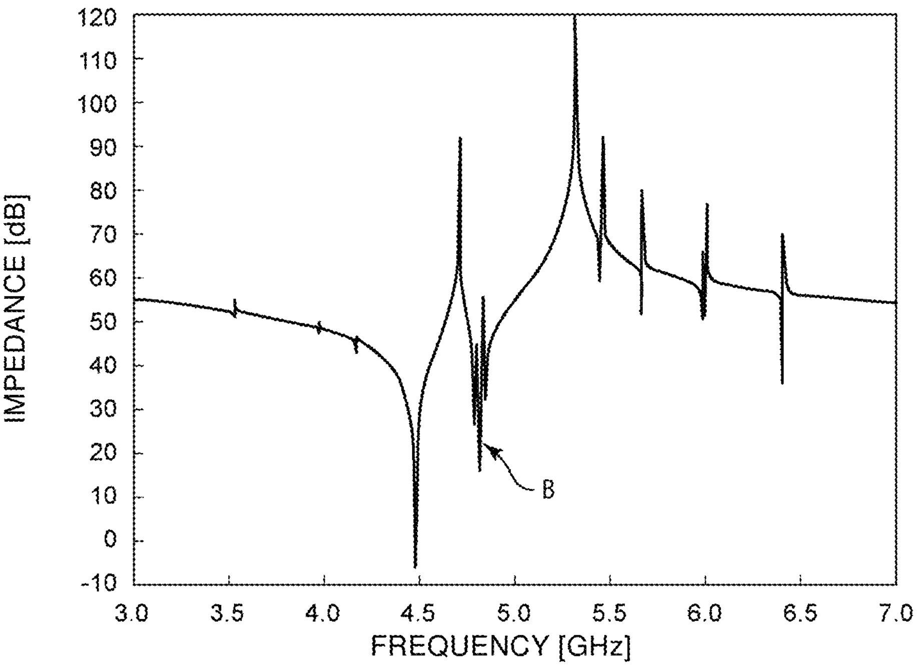
FIG. 33 is a graph illustrating the resonance characteristics of an acoustic wave device as a reference example in which a spurious response is found.

In the acoustic wave device 1, the metallization ratio MR of any one pair of adjacent electrodes 3 and 4 among the multiple electrodes 3 and 4 to the excitation region C where this pair of electrodes 3 and 4 overlap each other as seen in their facing direction preferably satisfies MR≤about 1.75 (d/p)+0.075, for example. In this case, spurious responses can be effectively decreased. This will be explained below with reference to FIGS. 33 and 34. FIG. 33 is a reference graph illustrating an example of the resonance characteristics of the acoustic wave device 1. The spurious response indicated by the arrow B is observed between the resonant frequency and the anti-resonant frequency. d/p was set to be about 0.08, and the Euler angles of $LiNbO_3$ were set to be (0°, 0°, 90°). The metallization ratio MR was set to be about 0.35.

The metallization ratio MR will be explained below with reference to FIG. 26B. In the electrode structure in FIG. 26B, a pair of electrodes 3 and 4 will be focused on, and it is assumed that only this pair is provided. In this case, the portion defined by the long dashed dotted lines is the excitation region C. The excitation region C is a region where the electrode 3 overlaps the electrode 4, a region where the electrode 4 overlaps the electrode 3, and a region where the electrodes 3 and 4 overlap each other in the region between the electrodes 3 and 4, when the electrodes 3 and 4 are seen in the direction perpendicular or substantially perpendicular to the longitudinal direction thereof, that is, in the facing direction of the electrodes 3 and 4. The area of the electrodes 3 and 4 within the excitation region C to the area of the excitation region C is the metallization ratio MR. That is, the metallization ratio MR is a ratio of the area of a metallized portion to the area of the excitation region C.

If multiple pairs of electrodes 3 and 4 are provided, the ratio of the areas of the metallized portions included in the total excitation region to the total area of the excitation region is used as the metallization ratio MR.

Figure 34:
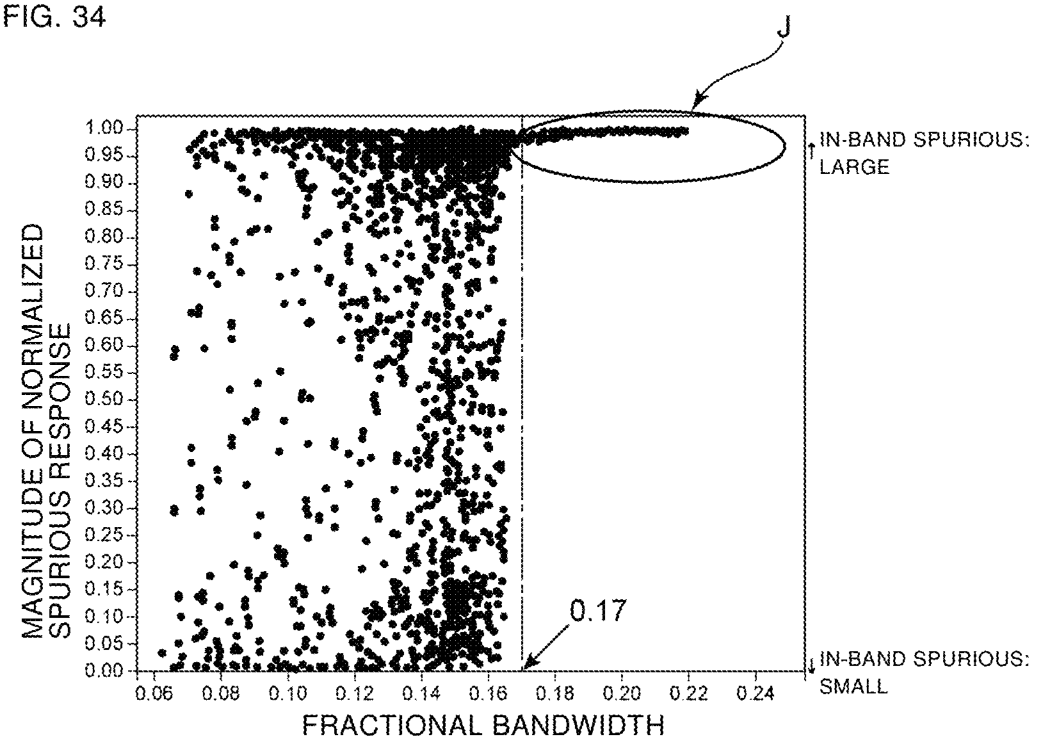
FIG. 34 is a diagram illustrating the relationship between the fractional bandwidth and the amount of phase shift of the impedance of a spurious response normalized at about 180 degrees as the magnitude of the spurious response.

Many acoustic wave resonators were provided based on the acoustic wave device 1. FIG. 34 is a diagram illustrating the relationship between the fractional bandwidth and the amount of phase shift of the impedance of a spurious response normalized at about 180 degrees as the magnitude of the spurious response. The fractional bandwidth was adjusted by variously changing the film thickness the piezoelectric layer and the dimensions of electrodes. The results shown in FIG. 34 are obtained when a piezoelectric layer made of Z-cut $LiNbO_3$ was used. Similar results are also obtained if a piezoelectric layer having another cut-angle is used.

A spurious response is as high as about 1.0 in the region defined by the elliptical portion J in FIG. 34. As seen from FIG. 34, when the fractional bandwidth exceeds about 0.17, that is, about 17%, a large spurious response of about 1 or higher is observed within the pass band even if parameters for the fractional bandwidth are changed. That is, as in the resonance characteristics in FIG. 33, a large spurious response indicated by the arrow B is observed within the pass band. Accordingly, the fractional bandwidth is, for example, preferably about 17% or lower. In this case, the spurious response can be decreased by the adjustment of some parameters, such as the film thickness of the piezoelectric layer 2 and the dimensions of electrodes 3 and 4.

Figure 35:
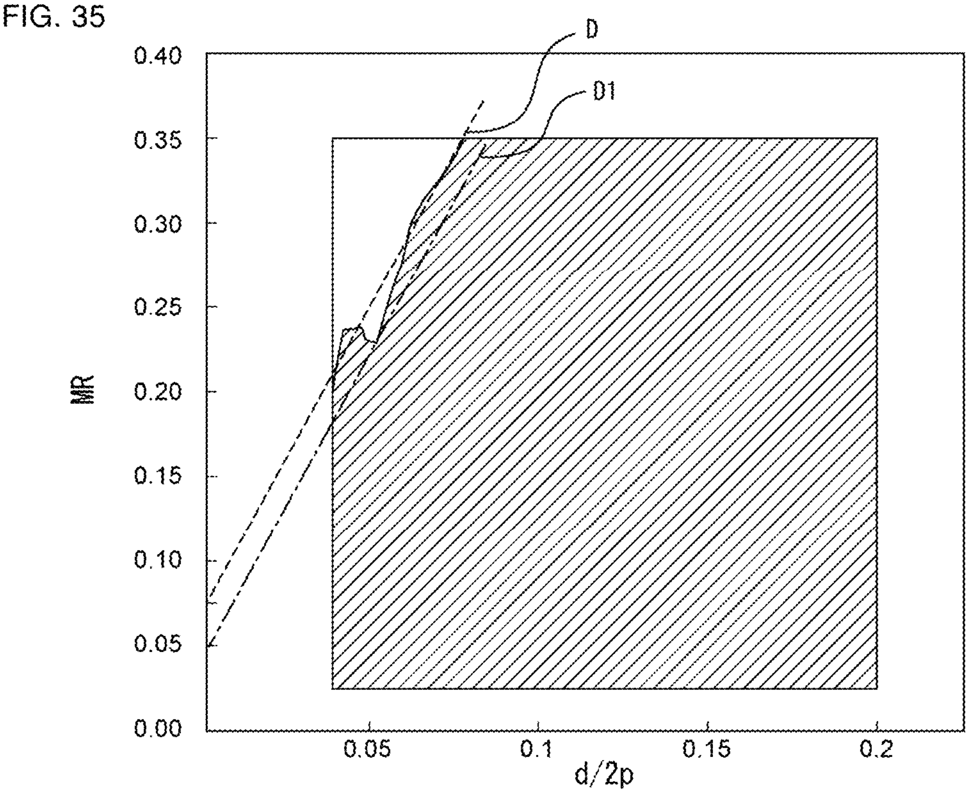
FIG. 35 is a graph illustrating the relationships between d/2p and the metallization ratio MR.

FIG. 35 is a graph illustrating the relationships between d/2p, the metallization ratio MR, and the fractional bandwidth. Based on the above-described acoustic wave device, various acoustic wave devices were made by changing d/2p and MR. Then, the fractional bandwidth was measured. The hatched portion on the right side of the broken line D in FIG. 35 is a region where the fractional bandwidth is about 17% or lower. The boundary between the hatched portion and a portion without can be expressed by MR=about 3.5 (d/2p)+0.075, that is, MR=about 1.75 (d/p)+0.075. Preferably, for example, MR≤about 1.75 (d/p)+0.075, in which case, the fractional bandwidth is likely to be about 17% or lower. More preferably, for example, the region where the fractional bandwidth is about 178 or lower is the region on the right side of the boundary expressed by MR=about 3.5 (d/2p)+0.05, which is indicated by the long dashed dotted line D1 in FIG. 35. That is, if MR≤about 1.75 (d/p)+0.05, the fractional bandwidth can reliably be about 17% or lower.

Figure 36:
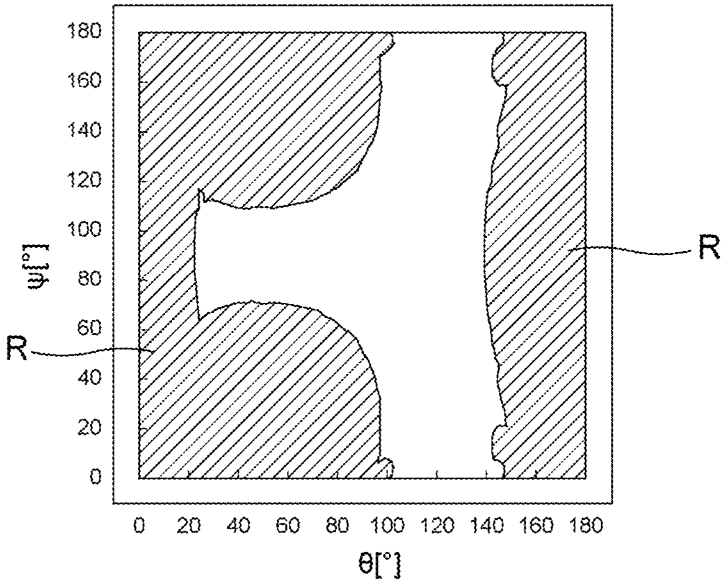
FIG. 36 is a diagram illustrating a map of the fractional bandwidth with respect to the Euler angles (0°, θ, ψ) of $LiNbO_3$ in a case in which d/p is approached as close to 0 as possible.

FIG. 36 is a diagram illustrating a map of the fractional bandwidth with respect to the Euler angles (0°, θ, ψ) of $LiNbO_3$ in a case in which d/p is as close to 0 as possible. The hatched portions R in FIG. 36 are regions where a fractional bandwidth of about 2% or higher is obtained. When φ in the Euler angles (φ, θ, ψ) is within a range of about 0°±5°, the relationship between θ and ψ and the fractional bandwidth becomes similar to that shown in FIG. 36. When the piezoelectric layer is made of lithium tantalate ($LiTaO_3$), as well, the relationship between θ and ψ in the Euler angles (0°±5°, θ, ψ) and BW is similar to that shown in FIG. 36.

Thus, for example, when ψ in the Euler angles (φ, θ, ψ) of lithium niobate or lithium tantalate of the piezoelectric layer is within a range of about 0°±5° and when θ and φ is in the range of one of the regions R shown in FIG. 36, a sufficiently wide fractional bandwidth can be obtained, which is preferable.

Figure 37:
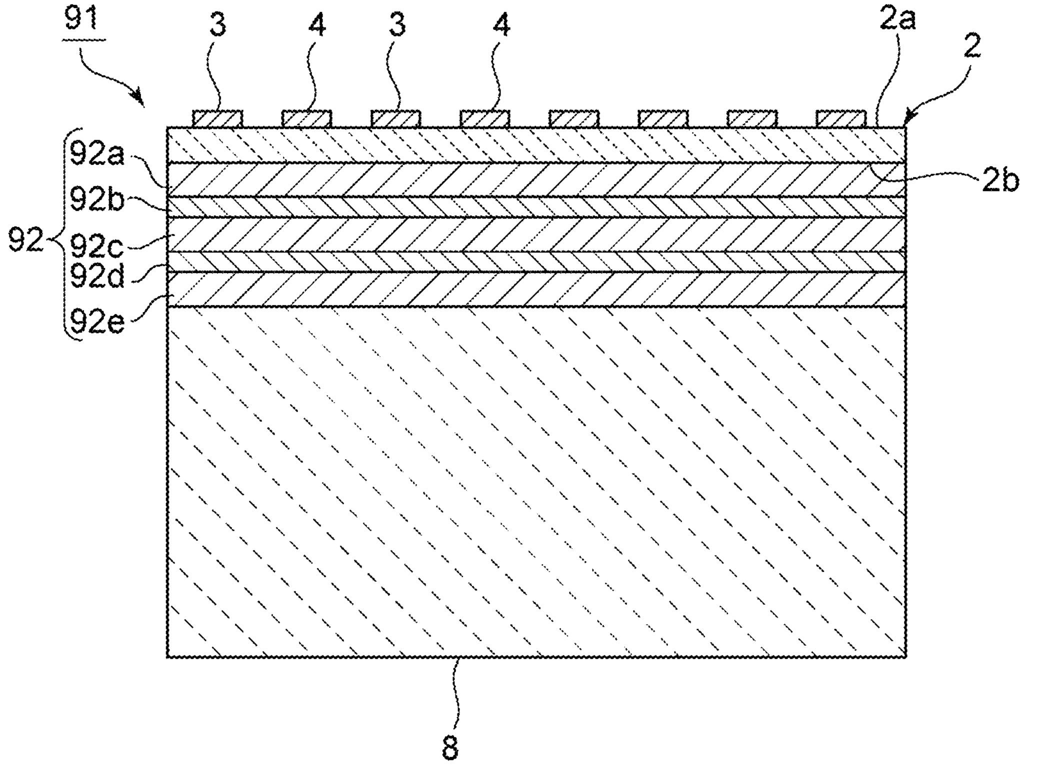
FIG. 37 is an elevational cross-sectional view of an acoustic wave device including a multilayer acoustic film.

FIG. 37 is an elevational cross-sectional view of an acoustic wave device including a multilayer acoustic film.

In an acoustic wave device 91, a multilayer acoustic film 92 is stacked under the second main surface 2*b* of the piezoelectric layer 2. The multilayer acoustic film 92 has a multilayer structure including low acoustic impedance layers 92*a*, 92*c*, and 92*e* having a relatively low acoustic impedance and high acoustic impedance layers 92*b* and 92*d* having a relatively high acoustic impedance. The use of the multilayer acoustic film 92 can trap a bulk wave of the thickness shear mode within the piezoelectric layer 2 without providing the cavity 9 in the acoustic wave device 1. The acoustic wave device 91 can also provide resonance characteristics based on a bulk wave of the thickness shear mode if d/p is set to be about 0.5 or smaller, for example. In the multilayer acoustic film 92, the number of low acoustic impedance layers 92*a*, 92*c*, and 92*e* and the number of high acoustic impedance layers 92*b* and 92*d* are not limited to particular numbers. Any number of low acoustic impedance layers and any number of high acoustic impedance layers may be used if at least one of the high acoustic impedance layers 92*b* and 92*d* is farther separated from the piezoelectric layer 2 than the low acoustic impedance layer 92*a*, 92*c*, or 92*e* is.

The low acoustic impedance layers 92*a*, 92*c*, and 92*e* and the high acoustic impedance layers 92*b* and 92*d* may be made of any suitable material as long as the above-described acoustic impedance relationship is satisfied. For instance, examples of the material for the low acoustic impedance layers 92*a*, 92*c*, and 92*e* are silicon oxide and silicon oxynitride, while examples of the material for the high acoustic impedance layers 92*b* and 92*d* are alumina, silicon nitride, and a metal.

Figure 38:
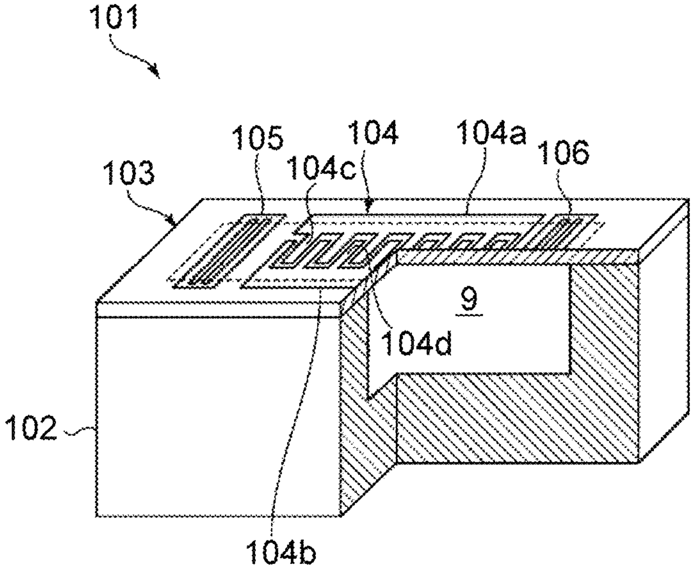
FIG. 38 is a partial cutaway perspective view for explaining an acoustic wave device utilizing a Lamb wave.

FIG. 38 is a partial cutaway perspective view for explaining an acoustic wave device utilizing a Lamb wave.

An acoustic wave device 101 includes a support substrate 102. A recess opened above is provided in the support substrate 102. A piezoelectric layer 103 is stacked on the support substrate 102. With this configuration, a cavity 9 is provided. An IDT electrode 104 is provided on the piezoelectric layer 103 so as to be located above the cavity 9. A reflector 105 is provided on one side of the IDT electrode 104 in the propagation direction of an acoustic wave, while a reflector 106 is provided on the other side of the IDT electrode 104 in the propagation direction. In FIG. 38, the outer peripheral edges of the cavity 9 are indicated by the broken lines. The IDT electrode 104 includes a first busbar 104*a*, a second busbar 104*b*, multiple first electrode fingers 104*c*, and multiple second electrode fingers 104*d*. The first electrode fingers 104*c* are connected to the first busbar 104*a*. The second electrode fingers 104*d* are connected to the second busbar 104*b*. The first electrode fingers 104*c* and the second electrode fingers 104*d* interdigitate each other.

In the acoustic wave device 101, a Lamb wave is excited with the application of an AC electric field to the IDT electrode 104 disposed above the cavity 9. Since the reflectors 105 and 106 are disposed on both sides of the IDT electrode 104, resonance characteristics based on the Lamb wave can be obtained.

As described above, an acoustic wave resonator according to an example embodiment of the present invention may be an acoustic wave resonator utilizing a Lamb wave.

In the acoustic wave devices of the first through thirteenth example embodiments and modified examples thereof, as an acoustic reflection film, the multilayer acoustic film 92 shown in FIG. 37 may be provided between the support and the piezoelectric layer as the piezoelectric film, for example. More specifically, the support and the piezoelectric film may be disposed to partially face each other by sandwiching the multilayer acoustic film 92 therebetween. In this case, in the multilayer acoustic film 92, low acoustic impedance layers and high acoustic impedance layers are alternately stacked on each other. The multilayer acoustic film 92 may be an acoustic reflector in the acoustic wave device. In this case, for example, multiple multilayer acoustic films 92 may be individually provided. In a plan view, the multiple electrode fingers of the first acoustic wave resonator may at least partially match a multilayer acoustic film 92, while the multiple electrode fingers of the second acoustic wave resonators may at least partially match another multilayer acoustic film 92. Alternatively, the electrode fingers of the first acoustic wave resonator and those of the second acoustic wave resonator may at least partially match the same multilayer acoustic film 92 in a plan view. If the multilayer acoustic film 92 is provided in the thirteenth example embodiment, the multiple third electrode fingers of the first acoustic wave resonator and those of the second acoustic wave resonator may be embedded in the multilayer acoustic film 92.

In the first acoustic wave resonators in the first through thirteenth example embodiments and modified examples thereof utilizing a bulk wave of the thickness shear mode, as stated above, d/p is, for example, preferably about 0.5 or smaller, and more preferably, about 0.24 or smaller. This can obtain even higher resonance characteristics. This applies to the second acoustic wave resonators in the first through thirteenth example embodiments and modified examples thereof utilizing a bulk wave of the thickness shear mode.

In the excitation region of the first acoustic wave resonators in the first through thirteenth example embodiments and modified examples thereof utilizing a bulk wave of the thickness shear mode, as described above, it is preferable to satisfy MR≤about 1.75 (d/p)+0.075, for example. More specifically, for example, it is preferable to satisfy MR≤about 1.75 (d/p)+0.075, where M is the metallization ratio of the first and third electrode fingers and that of the second and third electrode fingers to the excitation region. In this case, spurious responses can be decreased more reliably. This applies to the excitation region of the second acoustic wave resonators in the first through thirteenth example embodiments and modified examples thereof utilizing a bulk wave of the thickness shear mode.

While example embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:

a first acoustic wave resonator; and a second acoustic wave resonator; wherein each of the first and second acoustic wave resonators includes:

a piezoelectric film including a piezoelectric layer made of lithium niobate;

a first comb-shaped electrode on the piezoelectric layer, including a first busbar and a plurality of first electrode fingers, and being connected to an input potential, and one end of each of the plurality of first electrode fingers is connected to the first busbar;

a second comb-shaped electrode on the piezoelectric layer, including a second busbar and a plurality of second electrode fingers, and being connected to an output potential, one end of each of the plurality of second electrode fingers is connected to the second busbar, and the plurality of first electrode fingers and the plurality of second electrode fingers are interdigitated with each other; and a third electrode including a plurality of third electrode fingers and a connection electrode connected to a reference potential, in a plan view, the plurality of third electrode fingers being positioned on the piezoelectric layer so as to be arranged side by side with the plurality of first electrode fingers and the plurality of second electrode fingers in a direction in which the plurality of first electrode fingers and the plurality of second electrode fingers are arranged, and the connection electrode connects adjacent third electrode fingers of the plurality of third electrode fingers; wherein in each of the first and second acoustic wave resonators, an arrangement order of the plurality of first electrode fingers, the plurality of second electrode fingers, and the plurality of third electrode fingers in a plan view is, if the arrangement order is started by the first electrode finger, an order in which a set of the first electrode finger, the third electrode finger, the second electrode finger, and the third electrode finger is repeated as one period; and each of the first and second acoustic wave resonators is a divided resonator that is an acoustic wave resonator divided in series.

2. The acoustic wave device according to claim 1, wherein, in each of the first and second acoustic wave resonators, a direction perpendicular or substantially perpendicular to an extending direction of the plurality of first electrode fingers, the plurality of second electrode fingers, and the plurality of third electrode fingers is denoted as an electrode-finger perpendicular direction, and one of the first and second acoustic wave resonators includes a pair of reflectors on the piezoelectric layer, the pair of reflectors being provided to sandwich a region where the plurality of first electrode fingers, the plurality of second electrode fingers, and the plurality of third electrode fingers are provided therebetween in the electrode-finger perpendicular direction, and another one of the first and second acoustic wave resonators does not include the pair of reflectors.

3. The acoustic wave device according to claim 1, wherein a total number of the plurality of first electrode fingers, the plurality of second electrode fingers, and the plurality of third electrode fingers of the first acoustic wave resonator is different from a total number of the plurality of first electrode fingers, the plurality of second electrode fingers, and the plurality of third electrode fingers of the second acoustic wave resonator.

4. The acoustic wave device according to claim 1, wherein p1≠p2, where p1 is a center-to-center distance between the first electrode finger and the third electrode finger adjacent to each other in the first acoustic wave resonator and is a center-to-center distance between the third electrode finger and the second electrode finger adjacent to each other in the first acoustic wave resonator, and p2 is a center-to-center distance between the first electrode finger and the third electrode finger adjacent to each other in the second acoustic wave resonator and is a center-to-center distance between the second electrode finger and the third electrode finger adjacent to each other in the second acoustic wave resonator.

5. The acoustic wave device according to claim 1, wherein w1≠w2, where w1 is a width of each of the plurality of first electrode fingers, the plurality of second electrode fingers, and the plurality of third electrode fingers of the first acoustic wave resonator, and w2 is a width of each of the plurality of first electrode fingers, the plurality of second electrode fingers, and the plurality of third electrode fingers of the second acoustic wave resonator.

6. The acoustic wave device according to claim 1, wherein each of the first and second acoustic wave resonators includes a dielectric film on the piezoelectric layer, the dielectric film covering the plurality of first electrode fingers, the plurality of second electrode fingers, and the plurality of third electrode fingers; and td1≠td2, where td1 is a thickness of the dielectric film of the first acoustic wave resonator, and td2 is a thickness of the dielectric film of the second acoustic wave resonator.

7. The acoustic wave device according to claim 1, wherein te1≠te2, where te1 is a thickness of each of the plurality of first electrode fingers, the plurality of second electrode fingers, and the plurality of third electrode fingers of the first acoustic wave resonator, and te2 is a thickness of each of the plurality of first electrode fingers, the plurality of second electrode fingers, and the plurality of third electrode fingers of the second acoustic wave resonator.

8. The acoustic wave device according to claim 1, wherein in each of the first and second acoustic wave resonators, each of forward ends of the plurality of first electrode fingers and the plurality of second electrode fingers faces, with a gap therebetween, an electrode connected to a potential different from a potential connected to the plurality of first electrode fingers and a potential connected to the plurality of second electrode fingers and which is one of the input potential, the output potential, and the reference potential; and when an extending direction of the plurality of first electrode fingers, the plurality of second electrode fingers, and the plurality of third electrode fingers is denoted as an electrode-finger extending direction and when a dimension of the gap in the electrode-finger extending direction is set to a gap length, G1≠G2, where G1 is the gap length in the first acoustic wave resonator, and G2 is the gap length in the second acoustic wave resonator.

9. The acoustic wave device according to claim 1, wherein in each of the first and second acoustic wave resonators, an extending direction of the plurality of first electrode fingers, the plurality of second electrode fingers and the plurality of third electrode fingers is denoted as an electrode-finger extending direction, and a region where the first electrode finger and the second electrode finger overlap each other as seen from a direction perpendicular or substantially perpendicular to the electrode-finger extending direction is denoted as an overlapping region; and Ap1≠Ap2, where Ap1 is an overlapping width, which is a dimension of the overlapping region in the electrode-finger extending direction in the first acoustic wave resonator, and Ap2 is an overlapping width, which is a dimension of the overlapping region in the electrode-finger extending direction in the second acoustic wave resonator.

10. The acoustic wave device according to claim 1, wherein each of the first and second acoustic wave resonators is structured to generate a Lamb wave.

11. The acoustic wave device according to claim 1, wherein each of the first and second acoustic wave resonators is structured to generate a bulk wave of a thickness shear mode.

12. The acoustic wave device according to claim 1, wherein each of the first and second acoustic wave resonators includes a support under the piezoelectric film;

in each of the first and second acoustic wave resonators, in a plan view in a stacking direction of the support and the piezoelectric film, an acoustic reflector is provided in the support at a position at which the respective first or second acoustic wave reflector at least partially matches the plurality of first electrode fingers, the plurality of second electrode fingers, and the plurality of third electrode fingers; and in each of the first and second acoustic wave resonators, d/p is about 0.5 or smaller, where p is a longest one of center-to-center distances which are each between the first electrode finger and the third electrode finger adjacent to each other and center-to-center distances which are each between the second electrode finger and the third electrode finger adjacent to each other, and d is a thickness of the piezoelectric film.

13. The acoustic wave device according to claim 12, wherein, in each of the first and second acoustic wave resonators, d/p is about 0.24 or smaller.

14. The acoustic wave device according to claim 12, wherein, in each of the first and second acoustic wave resonators, the acoustic reflector is defined by a cavity, and the support and the piezoelectric film at least partially face each other with the cavity sandwiched therebetween.

15. The acoustic wave device according to claim 12, wherein, in each of the first and second acoustic wave resonators, the acoustic reflector is defined by an acoustic reflection film including a high acoustic impedance layer having a relatively high acoustic impedance and a low acoustic impedance layer having a relatively low acoustic impedance, and the support and the piezoelectric film at least partially face each other with the acoustic reflection film sandwiched therebetween.

16. The acoustic wave device according to claim 12, wherein in each of the first and second acoustic wave resonators, a direction perpendicular or substantially perpendicular to an extending direction of the plurality of first electrode fingers, the plurality of second electrode fingers, and the plurality of third electrode fingers is denoted as an electrode-finger perpendicular direction, and regions where adjacent first and third electrode fingers of the plurality of the first and third electrode fingers overlap each other in the electrode-finger perpendicular direction and regions where adjacent second and third electrode fingers of the plurality of the second and third electrode fingers overlap each other in the electrode-finger perpendicular direction are denoted as an excitation region; and in each of the first and second acoustic wave resonators, MR≤about 1.75 (d/p)+0.075, where MR is a metallization ratio, which is a ratio of the adjacent first and third electrode fingers within the excitation region and the adjacent second and third electrode fingers within the excitation region to the excitation region.

17. The acoustic wave device according to claim 1, wherein, in each of the first and second acoustic wave resonators, Euler angles (φ, θ, ψ) of lithium niobate of the piezoelectric layer are in a range represented by Expression (1), (2), or (3), where $$(0°+10°, 0° \text{ to } 25°, \text{a desirable angle of } \psi) \quad \text{Expression (1);}$$

$$(0°\pm10°, 25° \text{ to } 100°, 0° \text{ to } 75°[(1-(\theta-50)^2/2500)]^{1/2} \text{ or } 180° \text{ to } 75°[(1-(\theta-50)^2/2500)]^{1/2} \text{ to } 180°) \quad \text{Expression (2); and}$$

$$(0°\pm10°, 180°-40°[(1-(\psi-90)^2/810°)]^{1/2} \text{ to } 180°, \text{a desirable angle of } \psi) \quad \text{Expression (3).}$$

18. An acoustic wave device comprising:

a first acoustic wave resonator; and a second acoustic wave resonator; wherein each of the first and second acoustic wave resonators includes:

a piezoelectric film including a piezoelectric layer made of lithium niobate;

a first comb-shaped electrode on the piezoelectric layer, including a first busbar and a plurality of first electrode fingers, and being connected to an input potential, and one end of each of the plurality of first electrode fingers is connected to the first busbar;

a second comb-shaped electrode on the piezoelectric layer, including a second busbar and a plurality of second electrode fingers, and being connected to an output potential, one end of each of the plurality of second electrode fingers is connected to the second busbar, and the plurality of first electrode fingers and the plurality of second electrode fingers are interdigitated with each other; and a third electrode including a plurality of third electrode fingers and a connection electrode connected to a reference potential, in a plan view, the plurality of third electrode fingers being positioned on the piezoelectric layer so as to be arranged side by side with the plurality of first electrode fingers and the plurality of second electrode fingers in a direction in which the plurality of first electrode fingers and the plurality of second electrode fingers are arranged, and the connection electrode connects adjacent third electrode fingers of the plurality of third electrode fingers; wherein in each of the first and second acoustic wave resonators, an arrangement order of the plurality of first electrode fingers, the plurality of second electrode fingers, and the plurality of third electrode fingers in a plan view is, if the arrangement order is started by the first electrode finger, an order in which a set of the first electrode finger, the third electrode finger, the second electrode finger, and the third electrode finger is repeated as one period; and each of the first and second acoustic wave resonators is a divided resonator that is an acoustic wave resonator divided in parallel.

19. The acoustic wave device according to claim 18, wherein in each of the first and second acoustic wave resonators, when a direction perpendicular or substantially perpendicular to an extending direction of the plurality of first electrode fingers, the plurality of second electrode fingers, and the plurality of third electrode fingers is denoted as an electrode-finger perpendicular direction, the first acoustic wave resonator and the second acoustic wave resonator are arranged in the electrode-finger perpendicular direction;

the first acoustic wave resonator includes a first reflector on the piezoelectric layer, the second acoustic wave resonator includes a second reflector on the piezoelectric layer, and the first and second acoustic wave resonators share a third reflector;

the third reflector is located between a region where the plurality of first electrode fingers, the plurality of second electrode fingers, and the plurality of third electrode fingers of the first acoustic wave resonator are provided and a region where the plurality of first electrode fingers, the plurality of second electrode fingers, and the plurality of third electrode fingers of the second acoustic wave resonator are provided; and the first reflector and the third reflector face each other by sandwiching the region where the plurality of first electrode fingers, the plurality of second electrode fingers, and the plurality of third electrode fingers of the first acoustic wave resonator are provided therebetween, and the second reflector and the third reflector face each other by sandwiching the region where the plurality of first electrode fingers, the plurality of second electrode fingers, and the plurality of third electrode fingers of the second acoustic wave resonator are provided therebetween.

* * * * *